United States Patent

Hirai et al.

Patent Number: 5,866,463
Date of Patent: Feb. 2, 1999

[54] METHOD OF MANUFACTURING A SEMICONDUCTOR APPARATUS

[75] Inventors: Takehiro Hirai; Mitsuo Tanaka; Atsushi Hori, all of Osaka; Hiroshi Shimomura, Kyoto; Yoshihiko Horikawa, Osaka, all of Japan

[73] Assignee: Matsushita Electric Industrial Co. Ltd., Osaka, Japan

[21] Appl. No.: 861,052

[22] Filed: May 21, 1997

Related U.S. Application Data

[62] Division of Ser. No. 618,115, Mar. 19, 1996, Pat. No. 5,712,174, which is a division of Ser. No. 216,940, Mar. 24, 1994, abandoned.

[30] Foreign Application Priority Data

Mar. 26, 1993 [JP] Japan ................................ 5-067217
Apr. 14, 1993 [JP] Japan ................................ 5-087116

[51] Int. Cl.$^6$ .................................................. H01L 21/20
[52] U.S. Cl. .......................... 438/381; 438/250; 438/393
[58] Field of Search .................................. 438/239, 250, 438/251, 253, 254, 255, 256, 393, 396, 397, 399, 381, 329

[56] References Cited

U.S. PATENT DOCUMENTS 5,336,632   8/1994   Imamura ................................ 438/396
5,395,782   3/1995   Ohkoda et al. ........................ 438/253
5,622,887   4/1997   Miwa et al. ........................... 438/396

Primary Examiner—Tuan H. Nguyen
Attorney, Agent, or Firm—McDermott, Will & Emery

[57] ABSTRACT

In a semiconductor apparatus having a PNP bipolar transistor and high voltage resistance, there is formed an oxide insulating layer in the surface region of a P-type semiconductor substrate. In the above semiconductor substrate is formed a P-type collector layer so that at least a part of the P-type collector layer is in contact with said oxide insulating layer. In the surface region of said P-type collector layer is formed a P-type collector contact layer. An N-type base layer is formed in that region on the surface side of said P-type collector layer in which said P-type collector contact layer does not exist. A P-type emitter layer is formed on the surface side of said N-type base layer. A P-type collector-contact/base leakage prevention layer, which has a higher impurity concentration than said P-type collector layer, is formed at least in that region of said P-type collector layer which is in contact with said oxide insulating layer, so as to prevent the generation of a leakage current between said P-type collector contact layer and said N-type base layer.

8 Claims, 51 Drawing Sheets

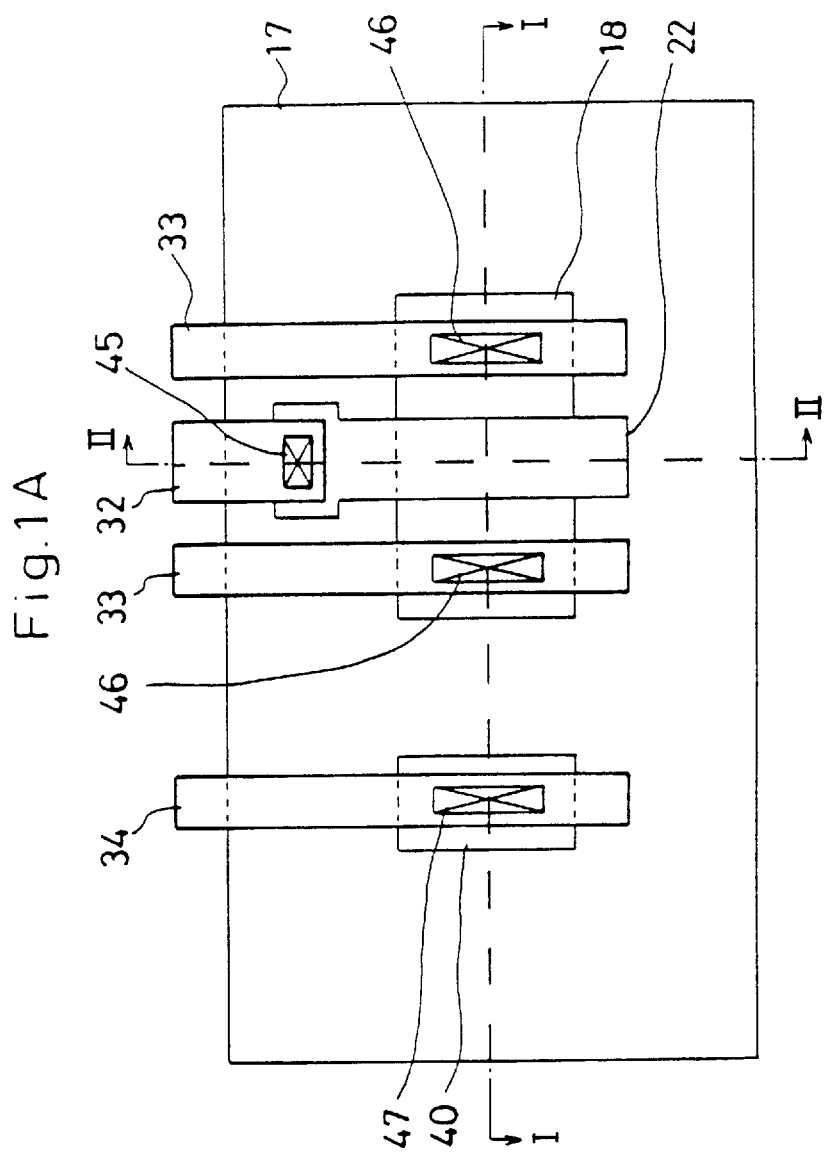

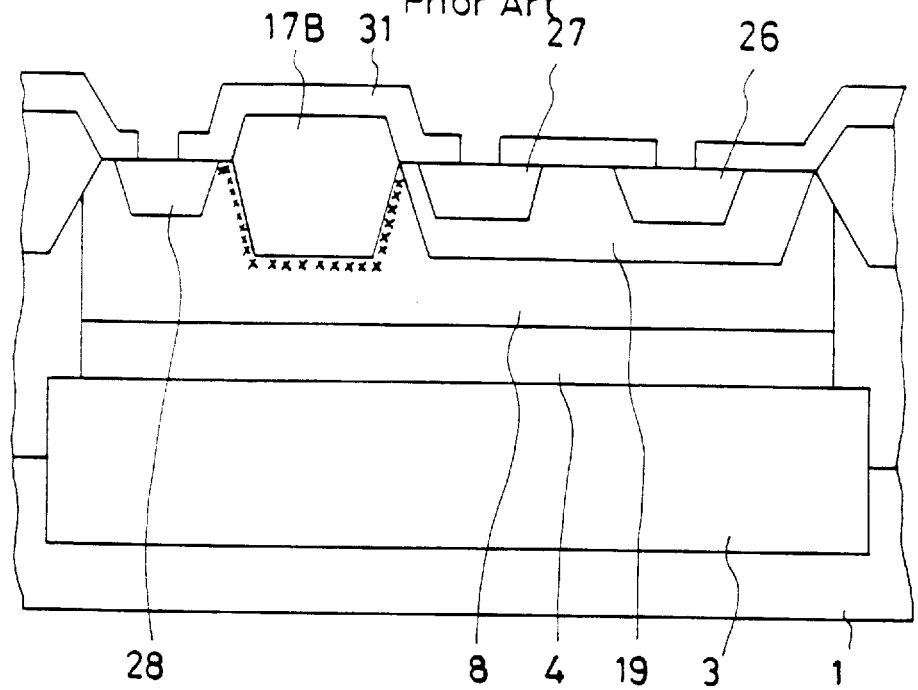
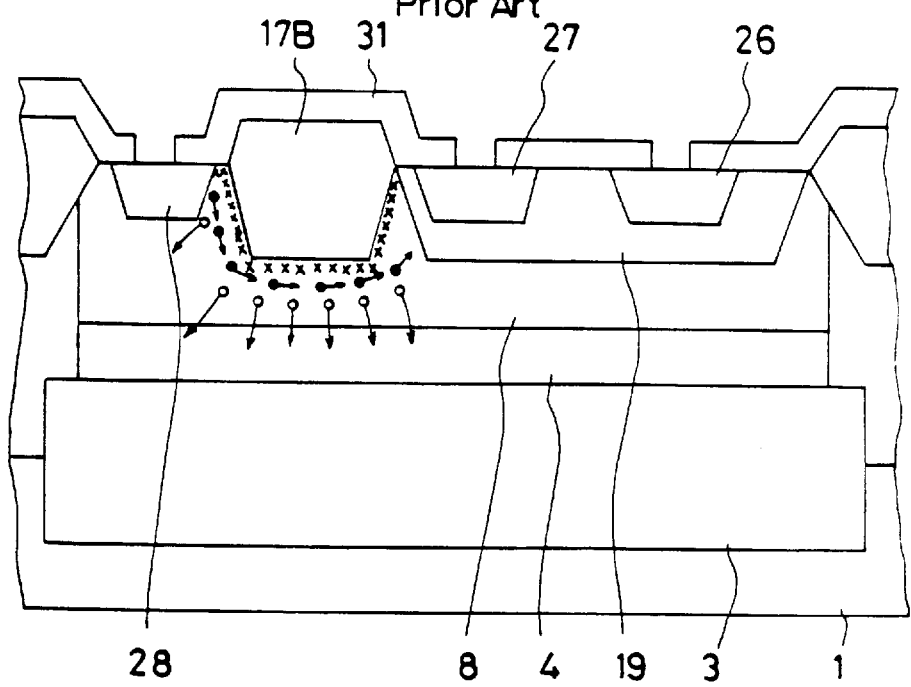

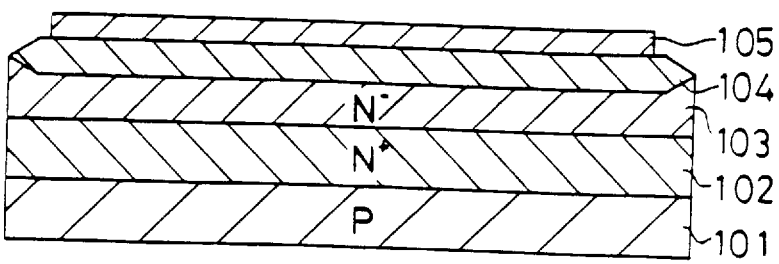
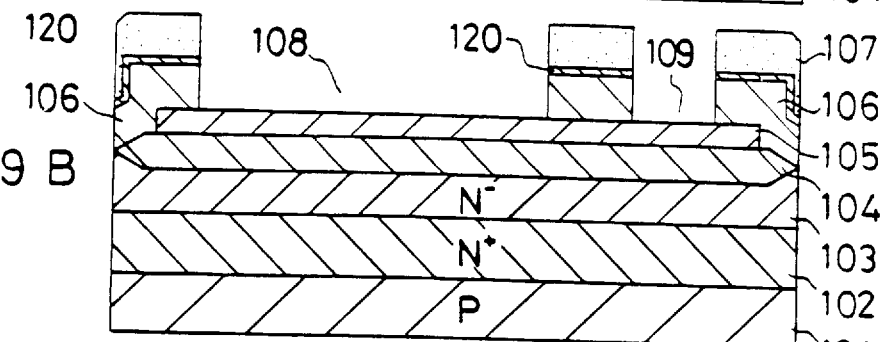
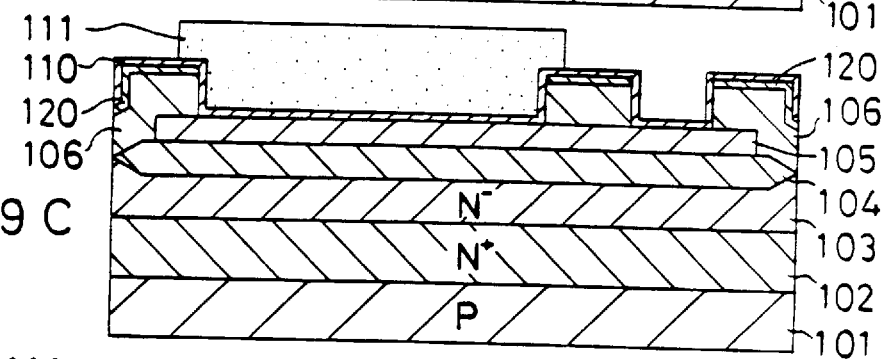
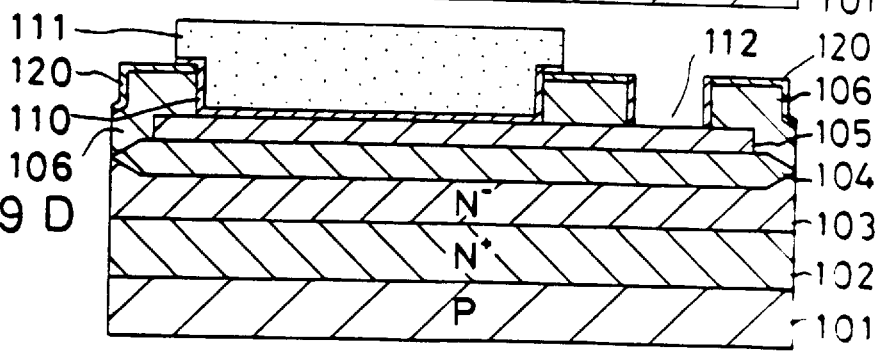
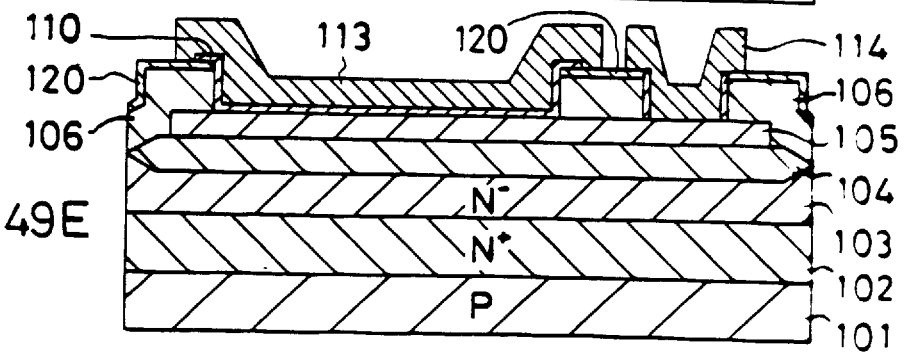

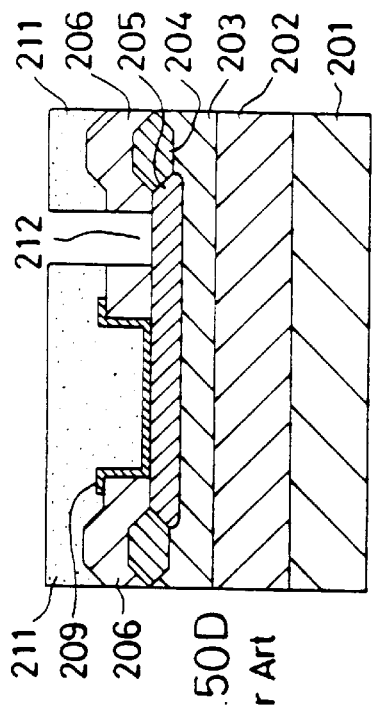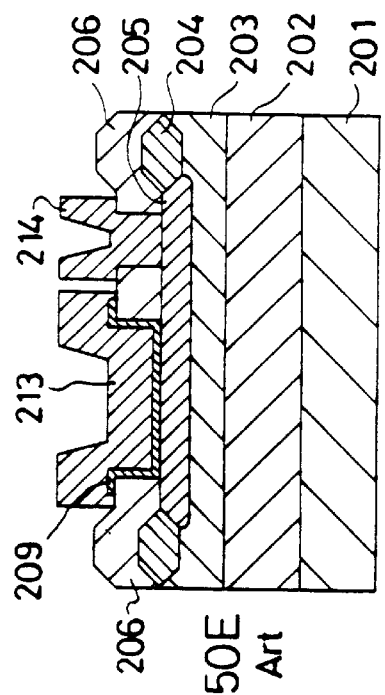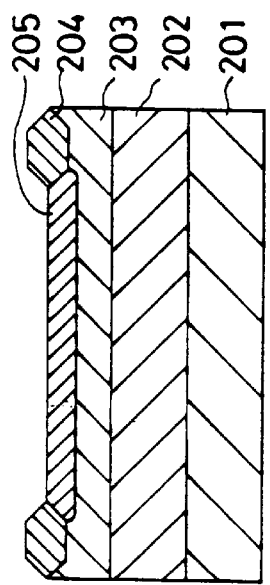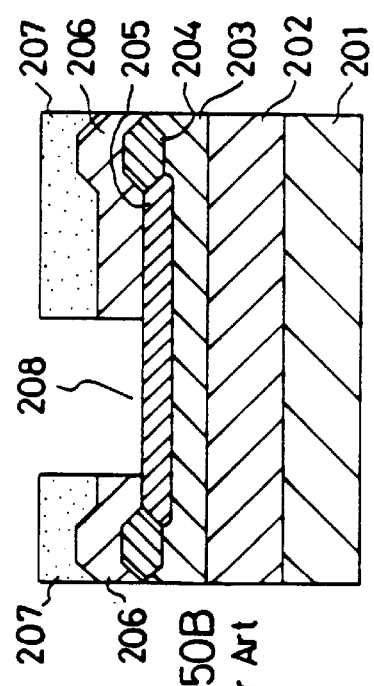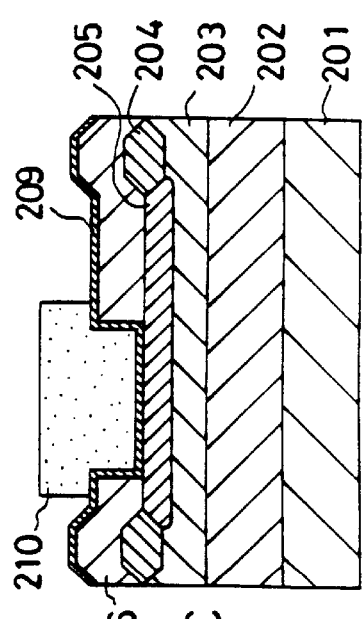

METHOD OF MANUFACTURING A SEMICONDUCTOR APPARATUS

This is a divisional of application Ser. No. 08/618,115, filed Mar. 19, 1996, now U.S. Pat. No. 5,712,544, which is a Divisional of Ser. No. 08/216,940, filed Mar. 24, 1994, now abandoned.

BACKGROUND OF THE INVENTION

The present invention relates to a semiconductor apparatus in which a vertical NPN bipolar transistor, a vertical PNP bipolar transistor, or a CMOS transistor is integrated on a semiconductor substrate and to a method of manufacturing the same. It also relates to a method of manufacturing a semiconductor apparatus having a capacitor provided on a semiconductor substrate and used together with a bipolar transistor.

In recent years, there has been a demand for a high-density, high-speed semiconductor apparatus which consumes less power.

A representative of such conventional semiconductor apparatuses is an NPN bipolar transistor of walled-emitter type. The NPN bipolar transistor has a structure in which its emitter region is surrounded by an insulating film so that at least a part of the emitter region is in contact with its periphery. The structure not only enables the reduction of junction capacitance between its emitter and base and the miniaturization of the transistor due to the self-aligning formation of its emitter and base, but also fulfills the requirements of high speed, high density, and low power consumption imposed on the transistor. An example of the NPN bipolar transistor of walled-emitter type is disclosed in, e.g., Japanese Laid-Open Patent Publication No. 1-281769.

In an NPN bipolar transistor of such structure, however, since the impurity introduced into its base region by ion implantation is absorbed by the insulating film, a depletion layer is formed at the interface of the base region with the insulating film due to the lowering of impurity concentration. As a result, the $N^-$-type emitter region and $N^-$-type collector region are connected to each other via the depletion layer, resulting in the undesirable generation of a leakage current between the emitter region and collector region.

In a semiconductor apparatus having a PNP bipolar transistor on a semiconductor substrate, on the other hand, the impurity implanted in the collector region is absorbed by the insulating film at the interface of the $P^+$-type collector region with the insulating film, so that a depletion layer is formed at the interface of the collector region with the insulating film. In the depletion layer, there exist a large number of interfacial charges. Holes in the foregoing depletion layer diffuse into the collector region, so that the foregoing depletion layer is connected to the depletion layer between the collector region and base region. Consequently, the depletion layer containing a large number of interfacial charges, which will as a current source, is formed between the collector contact region and base region, so that the leakage current is disadvantageously generated between the collector contact region and base region.

In a semiconductor apparatus having an N-channel MOS transistor on a semiconductor substrate, on the other hand, the impurity introduced into the P-type region, positioned between the N-type source region and N-type drain region, is absorbed by the insulating film at the interface of the foregoing P-type region with the insulating film. As a result, a depletion layer is formed at the interface of the foregoing P-type region with the insulating film due to the lowering of impurity concentration. Consequently, the source region and drain region are connected to each other via the depletion layer, resulting in the undesirable generation of a leakage current between the source region and drain region.

Thus, the leakage currents are generated in the respective portions stated above of the conventional semiconductor apparatuses in which the vertical NPN bipolar transistor, vertical PNP bipolar transistor, and CMOS transistor are integrated on the semiconductor substrates, resulting in the lowering of the production yields of the transistors.

Below, there will be described a conventional method of manufacturing a semiconductor apparatus having a capacitor provided on a semiconductor substrate and used together with a bipolar transistor.

As shown in FIG. 50A, an $N^+$-type buried layer 202 and an $N^-$-type epitaxial layer 203 are sequentially formed on a P-type semiconductor substrate 201. A thermal oxide film 204 is then formed on the $N^-$-type epitaxial layer 203 by selective oxidation. Thereafter, an $N^+$-type diffusion layer 205, which will serve as a lower capacitor electrode, is formed using the thermal oxide film 204 as a mask.

Next, as shown in FIG. 50B, a $CVD$-$SiO_2$ film 206 is formed, which is then subjected to etching using a first resist pattern 207 (photomask C1), thereby forming a capacitor insulating film formation region 208.

Next, as shown in FIG. 50C, a silicon nitride film 209, which will serve as a capacitor insulating film, is deposited thereon, followed by the formation of a second resist pattern 210 (photomask C2) on that portion of the silicon nitride film 209 which corresponds to the capacitor insulating film formation region 208 and to its vicinity. Thereafter, the silicon nitride film 209 is subjected to etching using the second resist pattern 210 as a mask.

Next, as shown in FIG. 50D, a third resist pattern 211 (photomask CW) is formed on the $CVD$-$SiO_2$ film 206, so that the $CVD$-$SiO_2$ film 206 is subjected to etching using the third resist pattern 211, thereby forming a contact region for the lower capacitor electrode.

Next, as shown in FIG. 50E, the third resist pattern 211 is removed and then an upper capacitor electrode 213 and the lower capacitor electrode 214 are formed by a normal wiring process using aluminium, thereby completing a capacitor.

However, the conventional method of manufacturing a semiconductor apparatus requires the process of forming a resist pattern to be performed three times (using the photomasks C1, C2, and CW) between the formation of the $N^+$-type diffusion layer 205 serving as the lower capacitor electrode and the formation of the contact region 212 for the lower capacitor electrode. Accordingly, the number of steps required for manufacturing the semiconductor apparatus and manufacturing cost are disadvantageously increased.

To reduce the number of steps in the conventional method of manufacturing a semiconductor apparatus, the step of etching away the silicon nitride film 209 using the second resist pattern 210 may be omitted. Below, such a manufacturing method for a semiconductor apparatus will be described.

As shown in FIG. 51A, after the deposition of the silicon nitride film 109 serving as the capacitor insulating film, the silicon nitride film 209 and $CVD$-$SiO_2$ film 206 are etched away using the third resist pattern 211, thereby forming the contact region 212 for the lower capacitor electrode.

Next, the third resist pattern 211 is removed and then the process of forming aluminium wiring is performed. In general, the $SiO_2$ film 206 is subjected to wet etching prior to the deposition of aluminium for the purpose of removing the natural oxide film of the contact region 212 for the lower capacitance electrode, so that the contact resistance between the aluminium and N⁺-type diffusion layer 205 is reduced. In this case, however, side etching of the CVD-SiO₂ film 206 occurs in the contact region 212 for the lower capacity electrode, as shown in FIG. 51B, resulting in the formation of an overhang portion 215.

Next, when the upper capacitor electrode 213 and lower capacitor electrode 214, each being made of aluminium, are deposited as shown in FIG. 51C, the step coverage with aluminium deteriorates significantly in the overhang portion 115, so that the amount of aluminium deposited in the overhang portion 115 becomes extremely small. Consequently, a broken portion 116 of the aluminium wire is generated in the overhang portion 115, as shown in FIG. 51C.

SUMMARY OF THE INVENTION

A first object of the present invention is to provide a semiconductor apparatus having a vertical NPN bipolar transistor, a vertical PNP bipolar transistor, or a CMOS transistor integrated on a semiconductor substrate, wherein the generation of a leakage current is prevented. A second object of the present invention is to provide a method of manufacturing a semiconductor apparatus wherein the number of masking steps is reduced without causing overhang in the contact region for a lower capacitor electrode.

The following first and second semiconductor apparatuses and first to fourth methods of manufacturing semiconductor apparatuses are intended to achieve the above first object and the following fifth to seventh methods of manufacturing semiconductor apparatuses are intended to achieve the above second object.

The first semiconductor apparatus comprises: an oxide insulating layer of a PNP bipolar transistor formed in the surface region of a P-type semiconductor substrate; a P-type collector layer of the PNP bipolar transistor formed in said semiconductor substrate so that at least a part of the P-type collector layer is in contact with said oxide insulating layer; a P-type collector contact layer formed in the surface region of said P-type collector layer; an N-type base layer of the PNP bipolar transistor formed in that region on the surface side of said P-type collector layer in which said P-type collector contact layer does not exist; a P-type emitter layer of the PNP bipolar transistor formed on the surface side of said N-type base layer; and a P-type collector-contact/base leakage prevention layer formed at least in that region of said P-type collector layer which is in contact with said oxide insulating layer so as to prevent the generation of a leakage current between said P-type collector contact layer and said N-type base layer, said P-type collector-contact/ base leakage prevention layer having a higher impurity concentration than said P-type collector layer.

According to the first semiconductor apparatus, the P-type leakage prevention layer, which is higher in impurity concentration than the P-type collector layer, is formed at least in that region of said P-type collector layer which is in contact with said oxide insulating layer. Consequently, the generation of a leakage current between said P-type collector contact layer and said N-type base layer can be prevented without increasing the overall impurity concentration of said P-type collector layer, i.e., without lowering the voltage resistance of the transistor.

In the first semiconductor apparatus, the depth of said collector-contact/base leakage prevention layer is preferably smaller than the depth of said N-type base layer. Alternatively, said collector-contact/base leakage prevention layer is preferably formed over the entire surface of said P-type collector layer.

Preferably, the first semiconductor apparatus further comprises: an oxide insulating layer for isolation formed on said semiconductor substrate so as to abut an N-channel MOS transistor; and a P-type channel stopper formed in that region of said semiconductor substrate which is in contact with said oxide insulating layer for isolation.

This prevents the reduction in impurity concentration of the region which is in contact with the oxide insulating layer for isolation, so that the generation of a leakage current between the source region and drain region is prevented.

Preferably, the first semiconductor apparatus further comprises: an oxide insulating layer of an NPN bipolar transistor formed in the surface region of said semiconductor substrate; an N-type collector layer of the NPN bipolar transistor formed in said semiconductor substrate; a P-type base layer of the NPN bipolar transistor formed on the surface side of said N-type collector layer so that at least a side portion of the P-type base layer is in contact with said oxide insulating layer of the NPN bipolar transistor; an N-type emitter layer of the NPN bipolar transistor formed on the surface side of said P-type base layer so that at least a side portion of the N-type emitter layer is in contact with said oxide insulating layer of the NPN bipolar transistor; a P-type base contact layer formed in that region of said P-type base layer which is not in contact with said N-type emitter layer; and a P-type emitter/collector leakage prevention layer formed in that portion of said N-type collector layer which is interposed between said P-type base layer and said oxide insulating layer of the NPN bipolar transistor, so as to prevent the generation of a leakage current between said N-type emitter layer and said N-type collector layer.

This enables the integration of the high-density, high-speed vertical NPN transistor, vertical PNP transistor, and N-channel MOS transistor, each having high voltage resistance, on the same semiconductor substrate without increasing the number of manufacturing steps, so that a BiCMOS semiconductor apparatus with various added values can be manufactured at low cost.

The first method of manufacturing a semiconductor apparatus having a P-type emitter layer, an N-type base layer, a P-type collector layer, a P-type collector contact layer, and an oxide insulating layer comprises: a first step of forming said P-type collector layer in a P-type semiconductor substrate; a second step of forming said oxide insulating layer so that it is in contact with at least a part of said P-type collector layer in the surface region of said semiconductor substrate, while forming a P-type collector-contact/base leakage prevention layer in that region of said P-type collector layer at least a part of which is in contact with said oxide insulating layer, so as to prevent the generation of a leakage current between said P-type collector contact layer and said N-type base layer, said P-type collector-contact/ base leakage prevention layer having a higher impurity concentration than said P-type collector layer; a third step of forming said N-type base layer in that region on the surface side of said P-type collector layer in which said P-type collector contact layer does not exist; and a fourth step of forming said P-type collector contact layer in the surface region of said P-type collector layer, while forming said P-type emitter layer on the surface side of said N-type base layer.

In the first method of manufacturing a semiconductor apparatus, said second step can include: a mask forming step of forming a nitride film so that it covers an active region formed in said semiconductor substrate and forming a resist pattern in a specified configuration; a leakage prevention layer forming step of forming said collector-contact/base leakage prevention layer by using said nitride film and said resist pattern as masks; and an insulating layer forming step of forming said oxide insulating layer by selectively oxidizing the region except said active region by using said nitride film as a mask. In this case, said leakage prevention layer forming step can include a step of forming, simultaneously with the formation of said collector-contact/base leakage prevention layer and by using said nitride film and said resist pattern as masks, a P-type channel stopper layer in that region of said semiconductor substrate which is in contact with the region in which an oxide insulating layer for isolation of an N-channel MOS transistor is to be formed, or it can also include a step of forming, simultaneously with the formation of said collector-contact/base leakage prevention layer and by using said nitride film and said resist pattern as masks, a P-type emitter/collector leakage prevention layer in that region of a collector layer of a virtual NPN bipolar transistor formed in said semiconductor substrate which is interposed between the region in which a P-type base layer of said NPN bipolar transistor is to be formed and the region in which an oxide insulating layer of said NPN bipolar transistor is to be formed, so as to prevent the generation of a leakage current between an N-type emitter layer and an N-type collector layer of said NPN bipolar transistor.

In the first method of manufacturing a semiconductor apparatus, said first step can include a step of forming an under-layer film in a specified configuration and an upper-layer resist pattern on the surface of said semiconductor substrate and forming said P-type collector layer by using said under-layer film and upper-layer resist pattern as masks, and said second step can include: a leakage prevention layer forming step of forming said collector-contact/base leakage prevention layer by using said under-layer film as a mask; a nitride film forming step of forming a nitride film on the surface of said semiconductor substrate so that the nitride film covers an active region formed in said semiconductor substrate; and an insulating layer forming step of forming said oxide insulating layer by selectively oxidizing the region except said active region by using said nitride film as a mask. In this case, said leakage prevention layer forming step can include a step of forming, simultaneously with the formation of said collector-contact/base leakage prevention layer and by using said nitride film as a mask, a P-type channel stopper layer in that region of said semiconductor substrate which is in contact with the region in which an oxide insulating layer for isolation of an N-channel MOS transistor is to be formed, or it can also include a step of forming, simultaneously with the formation of said collector-contact/base leakage prevention layer and by using said under-layer film as a mask, a P-type emitter/collector leakage prevention layer in that portion of a collector layer of a vertical NPN bipolar transistor formed on said semiconductor substrate which is interposed between the region in which a P-type base layer of said NPN bipolar transistor is to be formed and the region in which an oxide insulating layer of said NPN bipolar transistor is to be formed, so as to prevent the generation of a leakage current between an N-type emitter layer and N-type collector layer of said NPN bipolar transistor.

The first method of manufacturing a semiconductor apparatus can further comprise: a nitride film forming step of forming, prior to said first step, a nitride film on the surface of said semiconductor substrate so that the nitride film covers an active region formed in said semiconductor substrate, said first step can include a step of forming an under-layer film in a specified configuration and an upper-layer resist pattern on the surface of said semiconductor substrate and forming said P-type collector layer by using said under-layer film and upper-layer resist pattern as masks, and said second step can include: a leakage prevention layer forming step of forming said collector-contact/base leakage prevention layer by using said nitride film and said under-layer film as masks; and an insulating layer forming step of forming said oxide insulating layer by selectively oxidizing the region except said active region by using said nitride film as a mask. In this case, said leakage prevention layer forming step can include a step of forming, simultaneously with the formation of said collector-contact/base leakage prevention layer and by using said nitride film and said under-layer film as masks, a P-type channel stopper layer in that region of said semiconductor substrate which is in contact with the region in which an oxide insulating layer for isolation of an N-channel MOS transistor is to be formed, or it can also include a step of forming, simultaneously with the formation of said collector-contact/base leakage prevention layer and by using said nitride film and said under-layer film as masks, a P-type emitter/collector leakage prevention layer in that region of a collector layer of a virtual NPN bipolar transistor formed on said semiconductor substrate which is interposed between the region in which a P-type base layer of said NPN bipolar transistor is to be formed and the region in which an oxide insulating layer of said NPN bipolar transistor is to be formed, so as to prevent the generation of a leakage current between an N-type emitter layer and an N-type collector layer of said NPN bipolar transistor.

The second method of manufacturing a semiconductor apparatus having a P-type emitter layer, an N-type base layer, a P-type collector layer, a P-type collector contact layer, and an oxide insulating layer comprises: a first step of forming a nitride film on the surface of a P-type substrate so that the nitride film covers an active region formed in said semiconductor substrate; a second step of forming said oxide insulating layer by selectively oxidizing the region except said active region by using said nitride film as a mask; a third step of forming an under-layer film in a specified configuration and an upper-layer resist pattern on the surface of said semiconductor substrate and forming said P-type collector layer by using said under-layer film and upper-layer resist pattern as masks, so that at least a part of said P-type collector layer is in contact with said oxide insulating layer; a fourth step of forming a P-type collector-contact/base leakage prevention layer in that region of said P-type collector layer at least a part of which is in contact with said oxide insulating layer by using said oxide insulating layer and said under-layer film as masks, so as to prevent the generation of a leakage current between said P-type collector contact layer and said N-type base layer, said collector-contact/base leakage prevention layer having higher impurity concentration than said P-type collector layer; a fifth step of forming said N-type base layer in that region on the surface side of said P-type collector layer in which said P-type collector contact layer does not exist; and a sixth step of forming said P-type collector contact layer in the surface region of said P-type collector layer, while forming said P-type emitter layer on the surface side of said N-type base layer.

Said fourth step can include a step of forming, simultaneously with the formation of said collector-contact/base leakage prevention layer and by using said under-layer film as a mask, a P-type channel stopper layer in that region of said semiconductor substrate which is in contact with an oxide insulating layer of an N-channel MOS transistor, or it can also include a step of forming, simultaneously with the formation of said collector-contact base leakage prevention layer and by using said under-layer film as a mask, a P-type emitter/collector leakage prevention layer in that portion of a collector layer of a vertical NPN bipolar transistor formed on said semiconductor substrate which is interposed between the region in which said P-type base layer of the NPN bipolar transistor is to be formed and the region in which said oxide insulating layer of the NPN bipolar transistor is to be formed, so as to prevent the generation of a leakage current between said N-type emitter layer and said N-type collector layer of the NPN bipolar transistor.

The third method of manufacturing a semiconductor apparatus being provided with an NPN bipolar transistor having an N-type emitter layer, a P-type base layer, a P-type base contact layer, an N-type collector layer, and an oxide insulating layer formed on a P-type semiconductor substrate comprises the steps of: forming said N-type collector layer in said semiconductor substrate; forming a P-type emitter/collector leakage prevention layer in that portion of said N-type collector which is interposed between the region in which said P-type base layer is to be formed and the region in which said oxide insulating layer is to be formed, so as to prevent the generation of a leakage current between said N-type emitter layer and said N-type collector layer; forming, in the surface region of said semiconductor substrate, said oxide insulating layer so that it is in contact with said P-type emitter/collector leakage prevention layer; forming, on the surface side of said N-type collector layer, said P-type base layer so that at least a side portion thereof is in contact with said oxide insulating layer and with said emitter/collector leakage prevention layer; forming, on the surface side of said P-type base layer, said N-type emitter layer so that at least a side portion thereof is in contact with said oxide insulating layer; and forming a P-type base contact layer in that region of said P-type base layer which is not in contact with said N-type emitter layer.

Preferably, the third method of manufacturing a semiconductor apparatus further comprises the steps of: forming an oxide insulating layer for isolation in that region of said semiconductor substrate which abuts the region in which an N-channel MOS transistor is to be formed; and forming, simultaneously with the formation of said emitter/collector leakage prevention layer, a P-type channel stopper layer in that region of said semiconductor substrate which is in contact with said oxide insulating layer for isolation.

The fourth method of manufacturing a semiconductor apparatus comprises: a first step of forming a lower capacitor electrode on a semiconductor substrate; a second step of forming a first insulating film on said lower capacitor electrode; a third step of forming a first opening by selectively etching said first insulating film so as to remove that region of said first insulating film in which a capacitor insulating film is to be formed, while forming a second opening by selectively removing that region of said first insulating film in which a contact for said lower capacitor electrode is to be formed; a fourth step of forming a second insulating film, serving as the capacitor insulating film, on said lower capacitor electrode and on said first insulating film; a fifth step of selectively etching said second insulating film so as to remove those two portions of said second insulating film, one of which corresponds to the bottom of said second opening and the other of which corresponds to the periphery of said second opening lying on said first insulating film; and a sixth step of forming an upper capacitor electrode in said first opening, while forming a contact electrode for said lower capacitor electrode in said second opening.

In the fourth method of manufacturing a semiconductor apparatus, the etching operation performed in said fifth step is anisotropic and said fifth step can include a step of leaving that portion of said second insulating film which corresponds to the side-wall portion of said second opening. Alternatively, the etching operation performed in said fifth step is isotropic and said fifth step can include a step of removing that portion of said second insulating film which corresponds to the side-wall portion of said second opening.

The fifth method of manufacturing a semiconductor apparatus comprises: a first step of forming a lower capacitor electrode on a semiconductor substrate; a second step of forming a first insulating film on said lower capacitor electrode; a third step of forming a first opening by selectively etching said first insulating film so as to remove that region of said first insulating film in which a capacitor insulating film is to be formed and then forming a second insulating film, serving as the capacitor insulating film, on the bottom of said first opening, while forming a second opening by selectively etching said first insulating film so as to remove that region of said first insulating film in which a contact for said lower capacitor electrode is to be formed; and a fourth step of forming an upper capacitor electrode in said first opening, while forming a contact electrode for said lower capacitor electrode in said second opening.

In the fifth method of manufacturing a semiconductor apparatus, said third step can include the steps of: forming said first and second openings by selectively etching said first insulating film so as to remove those two regions of said first insulating film in which the capacitor insulating film is to be formed and in which said contact for the lower capacitor electrode is to be formed; and forming a second insulating film, serving as the capacitor insulating film, on the bottoms of said first and second openings and then removing that region of said second insulating film in which said contact for the lower capacitor electrode is to be formed, or it can also include the steps of: forming said first opening by selectively etching said first insulating film so as to remove that region of said insulating film in which the capacitor insulating film is to be formed; forming the second insulating film, serving as the capacitor insulating film, on the bottom of said first opening; and forming said second opening by selectively etching said first insulating film so as to remove that region of said first insulating film in which said contact for the lower capacitor electrode is to be formed.

The sixth method of manufacturing a semiconductor apparatus comprises: a first step of forming a lower capacitor electrode on a semiconductor substrate; a second step of forming, on said lower capacitor electrode, a first insulating film serving as a capacitor insulating film; a third step of forming a second insulating film on said first insulating film; a fourth step of forming, in the region in which the capacitor insulating film is to be formed, a first opening in which said second insulating film is removed and said first insulating film is left, while forming, in the region in which a contact for the lower capacitor electrode is to be formed, a second opening in which said first and second insulating films are removed; and a fifth step of forming an upper capacitor electrode in said first opening, while forming a contact electrode for said lower capacitor electrode in said second opening.

In the sixth method of manufacturing a semiconductor apparatus, said fourth step can include the steps of: forming the first opening by selectively etching said second insulating film so as to remove that region of said second insulating film in which the capacitor insulating film is to be formed, while forming the second opening by removing that region of said second insulating film in which said contact for the lower capacitor electrode is to be formed; and selectively etching said first insulating film so as to remove that portion of said first insulating film which corresponds to the bottom of said second opening, or it can also include the steps of: selectively etching said second insulating film so as to form, in the region in which the capacitor insulating film is to be formed, the first opening in which said second insulating film is removed and said first insulating film is left; and selectively etching said first and second insulating films so as to form, in the region in which the contact for the lower capacitor electrode is to be formed, the second opening in which said first and second insulating films are removed.

The seventh method of manufacturing a semiconductor apparatus comprises: a first step of forming a lower capacitor electrode on a semiconductor substrate; a second step of forming first and second insulating films on said lower capacitor electrode; a third step of forming a first opening by selectively etching said first and second insulating films so as to remove those regions of said first and second insulating films in which a capacitor insulating film is to be formed, while forming a second opening by removing those regions of said first and second insulating films in which a contact for said lower capacitor electrode is to be formed; a fourth step of forming, on said lower capacitor electrode and on said second insulating film, a third insulating film serving as the capacitor insulating film; a fifth step of selectively etching said third insulating film so as to remove at least that portion of said third insulating film which corresponds to the bottom of said second opening; and a sixth step of forming an upper capacitor electrode in said first opening, while forming a contact electrode for said lower capacitor electrode in said second opening.

BRIEF DESCRIPTION OF THE DRAWINGS

FIG. 1A is a plan view of a semiconductor apparatus according to a first embodiment of the present invention.

FIGS. 42A and 42B are cross sections of a conventional PNP bipolar transistor;

FIGS. 49A to 49E are cross sections illustrating the individual steps of the method of manufacturing a semiconductor apparatus according to a twelfth embodiment of the present invention;

FIGS. 50A to 50E are cross sections illustrating the individual steps of a conventional method of manufacturing a semiconductor apparatus.

DETAILED DESCRIPTION OF THE PREFERRED EMBODIMENTS

Figure 1B:
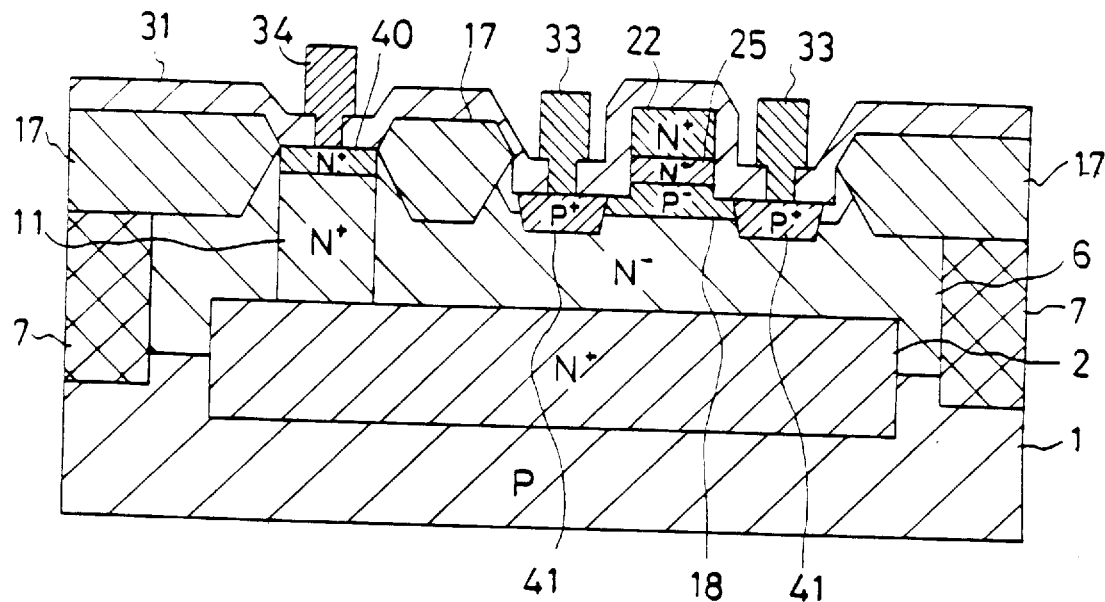
FIG. 1B is a cross section taken along the line I—I of FIG. 1A.

Referring now to the drawings, a semiconductor apparatus and its manufacturing method according to the present invention will be described below.

(First Embodiment)

Figure 1C:
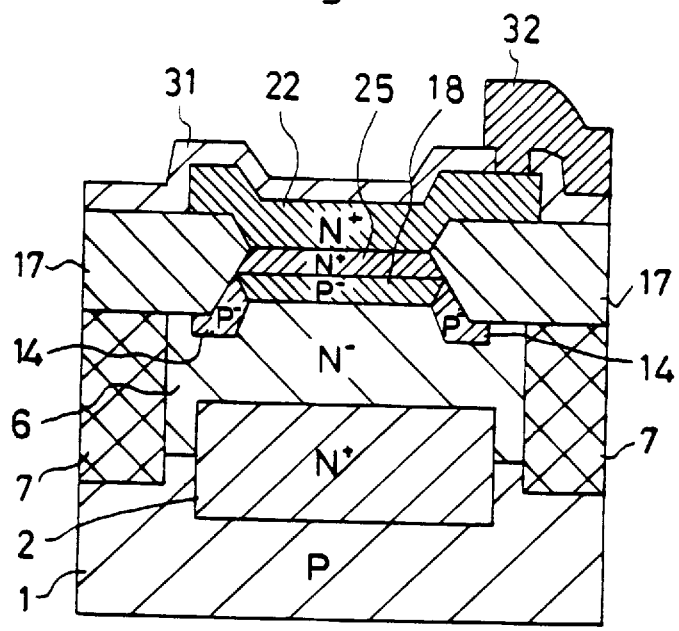
FIG. 1C is a cross section taken along the line II—II of FIG. 1A.

FIGS. 1A to 1C show the semiconductor apparatus having a virtual NPN transistor of walled-emitter type serving as a first embodiment of the present invention: FIG. 1A is its plan view; FIG. 1B is its cross section taken along the line I—I of FIG. 1A; and FIG. 1C is its cross section taken along the line II—II of FIG. 1A.

In FIGS. 1A to 1C, a reference numeral 1 designates a P-type semiconductor substrate, 2 designates an $N^+$-type collector region composed of an $N^+$-type buried layer, 6 designates an epitaxial layer constituting an $N^-$-type collector region, 7 designates a CVD buried oxide film constituting an isolation region, 11 designates a collector extraction region composed of an $N^+$-type diffusion layer, 17 designates a thermal oxide film formed in the surface region of the $N^-$-type epitaxial layer 6 so as to constitute an isolation region, 18 designates a base region composed of a $P^-$-type diffusion layer, 22 designates an $N^+$-type polysilicon film, 25 designates an emitter region composed of an $N^+$-type diffusion layer which was formed by impurity diffusion from the polysilicon film 22, 31 designates a $SiO_2$ film formed in the surface region of the semiconductor substrate 1 by CVD, 32 designates an emitter electrode, 33 designates a base electrode, 34 designates a collector electrode, 40 designates a collector contact region composed of an $N^+$-type diffusion layer which was formed on the surface of the collector extraction portion 11, 41 designates a base contact region composed of a $P^+$-type diffusion layer which was formed in the base region 18, 45 designates an emitter contact, 46 designates a base contact, and 47 designates a collector contact.

The $N^+$-type polysilicon film 22 has a striped structure and extends over the thermal oxide film 17 and base region 18. The emitter contact 45 and emitter electrode 32 are formed above the thermal oxide film 17. The emitter region 25 is formed only on that portion of the base region 18 which is located immediately under the $N^+$-type polysilicon film 22.

The above thermal oxide film 17 is formed so as to surround the base region 18 and to abut on the side face of the emitter region 25, thereby realizing the vertical NPN transistor of walled-emitter structure.

The first embodiment is characterized by a leakage prevention layer 14 which is composed of a $P^-$-type diffusion layer. The leakage prevention layer 14 is formed in that region of the $N^-$-type epitaxial layer which is interposed between the base region 18 and $N^-$-type thermal oxide film 17 immediately under the boundary between the side face of the emitter region 25 and the thermal oxide film 17, so as to prevent the generation of a leakage current between the emitter region 25 and $N^-$-type collector region 6. The leakage current is not formed between the base contact region 41 and emitter region 25.

Figure 41:
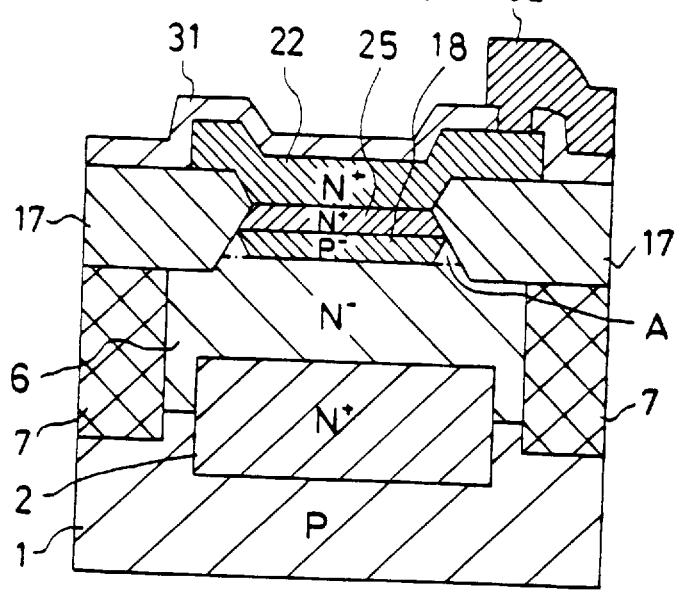
FIG. 41 is a cross section of a conventional NPN bipolar transistor.

Since the impurity, such as boron, introduced into the base region 18 by ion implantation is absorbed by the thermal oxide film 17, a depletion layer is formed in the portion indicated by "A" in FIG. 41, i.e., at the interface of the base region 18 with the thermal oxide film 17 due to the lowering of impurity concentration. As a result, the $N^-$-type emitter region 25 and collector region composed of the $N^-$-type epitaxial layer 6 are connected to each other via the depletion layer, resulting in the generation of a leakage current between the emitter region 25 and collector region. In the first embodiment, however, since the leakage prevention layer 14 composed of the $P^-$-type diffusion layer is formed in that region of the $N^-$-type epitaxial layer 6 which is interposed between the base region 18 and thermal oxide film 17 immediately under the boundary of the emitter region 25 and thermal oxide film 17, the lowering of impurity concentration is prevented in the boundary portion of the base region 18 with the thermal oxide film 17. Consequently, the generation of a leakage current between the emitter region 25 and collector region is also prevented.

Below, a method of manufacturing the foregoing semiconductor apparatus will be described with reference to the drawings.

FIGS. 2A, 3A, 4A, 5A, 6A, and 7A are cross sections taken along the line I—I of FIG. 1A and FIGS. 2B, 3B, 4B, 5B, 6B, and 7B are cross sections taken along the line II—II of FIG. 1A.

Figure 2A:
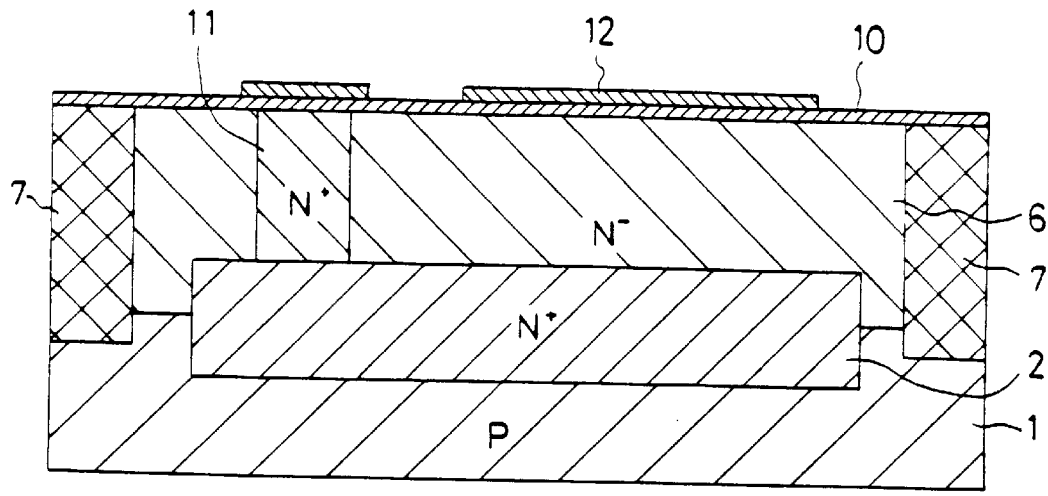
FIGS. 2A, 2B, 3A, 3B, 4A, 4B, 5A, 5B, 6A, 6B, 7A, and 7B are cross sections illustrating the individual steps of a method of manufacturing a semiconductor apparatus according to the first embodiment.
Figure 2B:
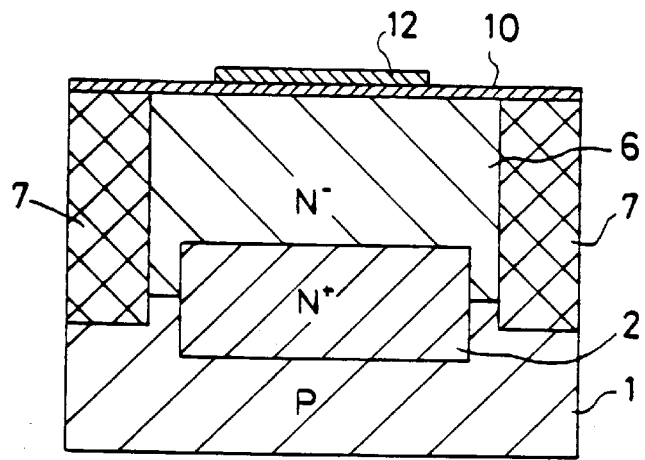

First, as shown in FIGS. 2A and 2B, arsenic is introduced into the semiconductor substrate 1 having a resistivity of 10 to 20 $\Omega$.cm by ion implantation under the conditions of 60 keV, $1\times10^{15}/cm^2$, using a resist pattern as a mask. The semiconductor substrate 1 is then subjected to a heat treatment at a temperature of 900° C. for about 30 minutes, thereby forming a collector region 2, composed of an $N^+$-type buried layer for the vertical NPN transistor. After that, an $N^+$-type epitaxial layer 6 having a resistivity of about 1 $\Omega$.cm and a thickness of about 1.5 $\mu$m is grown on the semiconductor substrate 1. Subsequently, a trench is formed in the isolation region using a resist pattern as a mask, followed by the deposition of a CVD oxide film, so that the CVD buried oxide film 7 for isolation is formed only in the trench by etchback. Thereafter, phosphorus is introduced by ion implantation under the conditions of 80 keV, $3\times10^{15}/cm^2$, using a resist pattern as a mask. By subsequently performing a heat treatment at a temperature of 950° C. for about 30 minutes, the collector extraction region 11 composed of an $N^+$-type diffusion layer is formed for the vertical NPN transistor. Thereafter, a thermal oxide film 10 and a silicon nitride film 12 are sequentially grown on the surface of the $N^-$-type epitaxial layer 6 to thicknesses of 50 nm and 120 nm, respectively. The silicon nitride film 12 is then etched away, using a resist pattern as a mask, except for the region corresponding to a transistor active region.

Figure 3A:
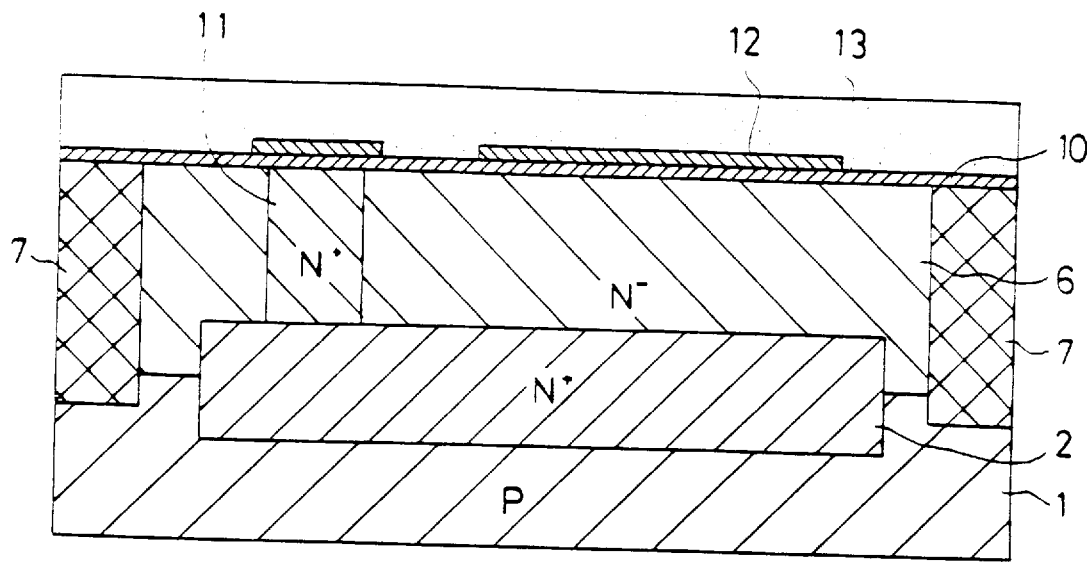
Figure 3B:
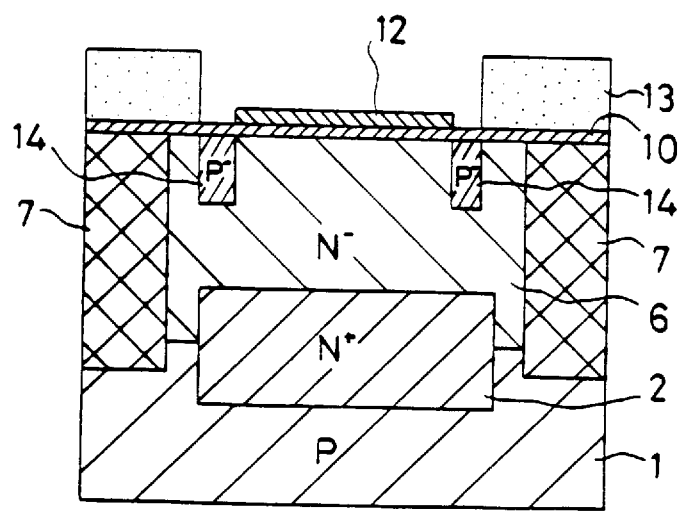

Next, as shown in FIGS. 3A and 3B, boron is introduced by ion implantation under the conditions of 100 keV, $2\times10^{13}/cm^2$, using a resist pattern 13 as a mask, thereby forming the leakage prevention 14 composed of a $P^-$ diffusion layer only in the vicinity of the boundary between the emitter region 25 and thermal oxide film 17 in the active region (see FIG. 1C).

Figure 4A:
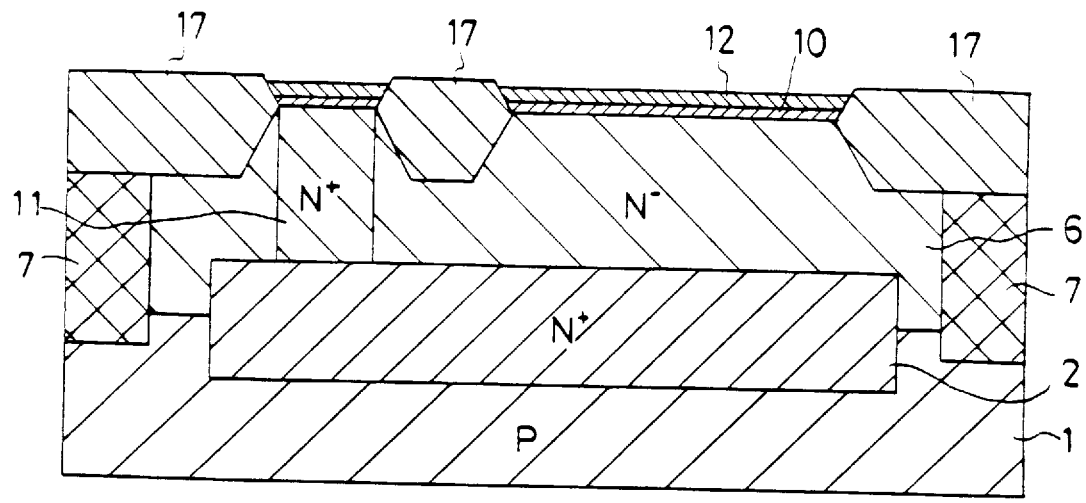
Figure 4B:
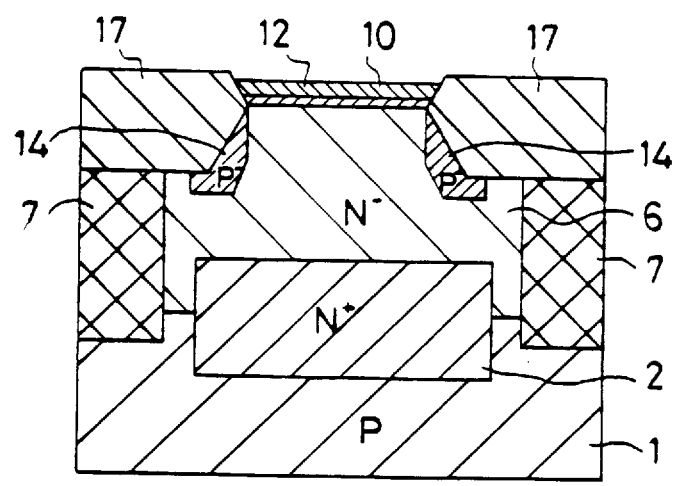

Next, as shown in FIGS. 4A and 4B, a selective oxidation process is performed using the silicon nitride film 12 as a mask at a temperature of 1000° C., thereby growing the thermal oxide film 17 to a thickness of 600 nm.

Figure 5A:
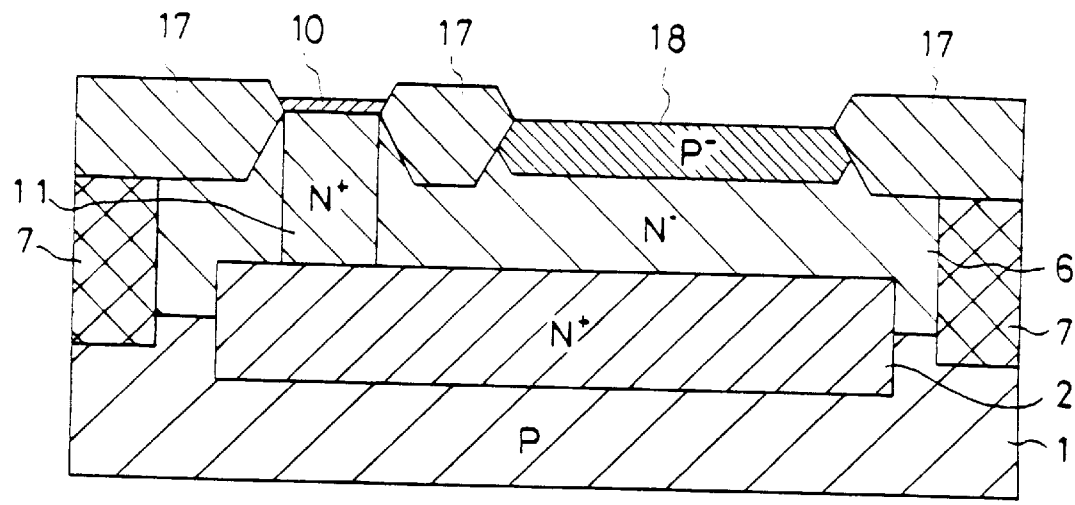
Figure 5B:
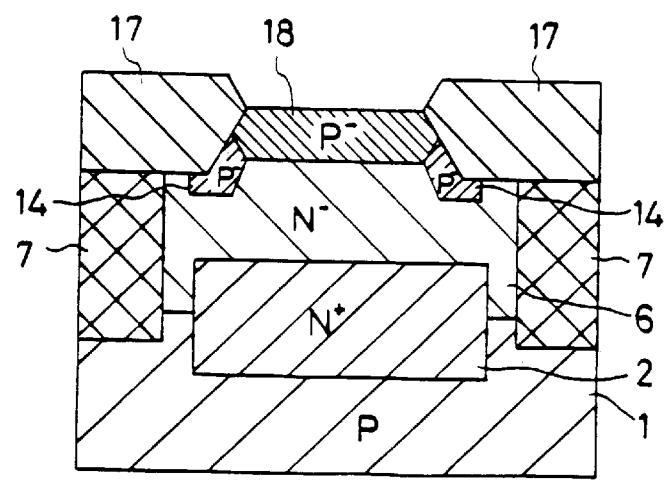

Next, as shown in FIGS. 5A and 5B, the silicon nitride film 12 is removed by wet etching. Thereafter boron is introduced by ion implantation under the conditions of 30 keV, $2\times10^{13}/cm^2$ using a resist pattern as a mask, followed by a heat treatment at a temperature of 900° C. for about 30 minutes, thus forming the base region 18 composed of a $P^-$-type diffusion layer for the vertical NPN transistor. As shown in FIG. 5B, the base region 18 is formed so as to be connected to the leakage prevention layer 14. After that, the thermal oxide film 10 on the surface of the base region 18 is removed by wet etching using a resist pattern as a mask.

Figure 6A:
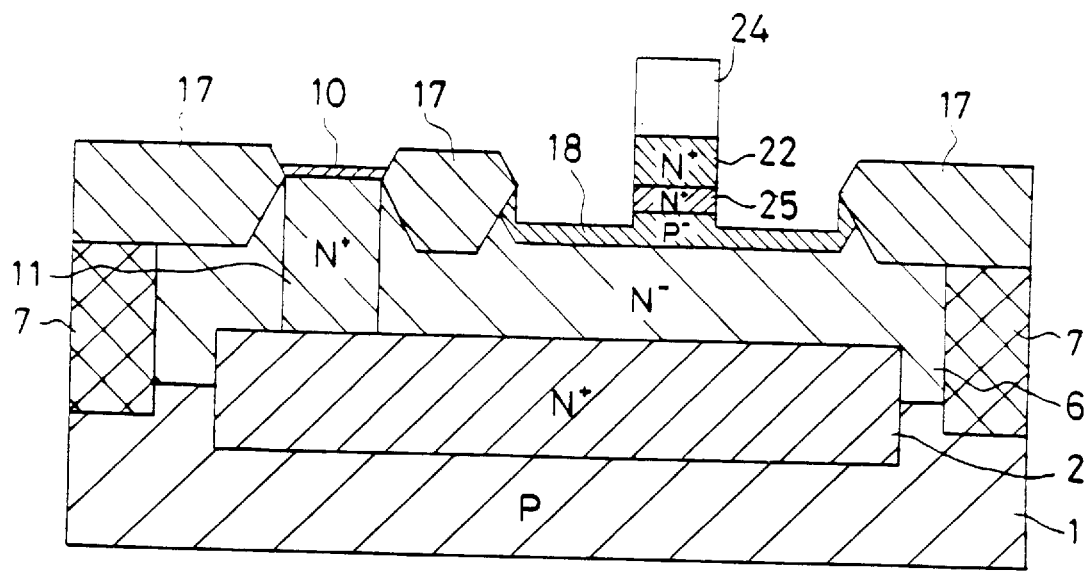
Figure 6B:
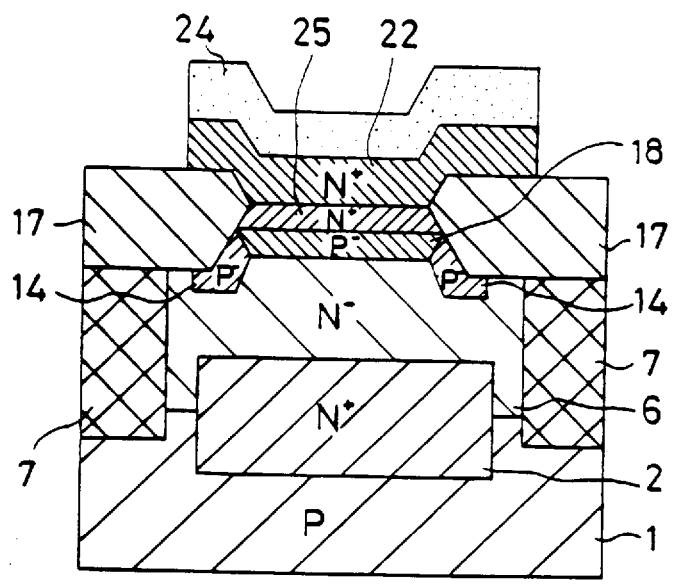

Next, as shown in FIGS. 6A and 6B, the $N^+$-type polysilicon film 22 is deposited to a thickness of 300 nm, and then arsenic is introduced by ion implantation under the conditions of 60 keV, $1\times10^{16}/cm^2$. Subsequently, a heat treatment is performed at a temperature of 900° C. for about 30 minutes so as to diffuse the arsenic from the $N^+$-type polysilicon film 22, thereby forming the emitter region 25 composed of an $N^+$-type polysilicon film. After that, the surfaces of the $N^+$-type polysilicon film 22 and base region 18 are subjected to etching. At this stage, the $N^+$-type polysilicon film 22 is formed to have a striped structure, while the base region 18 is etched to a point deeper than that of the emitter region 25.

Figure 7A:
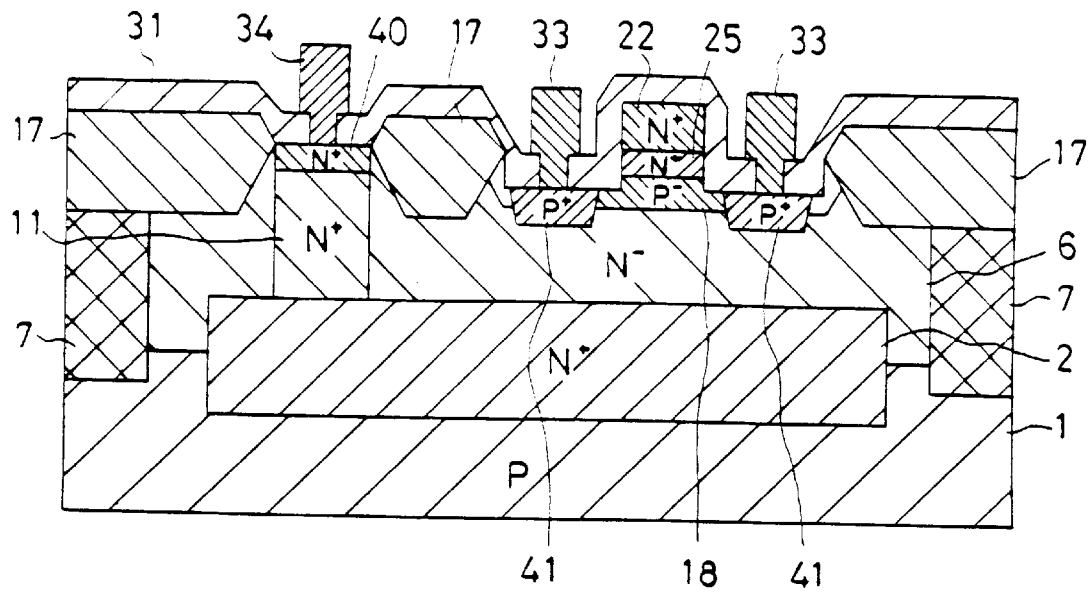
Figure 7B:
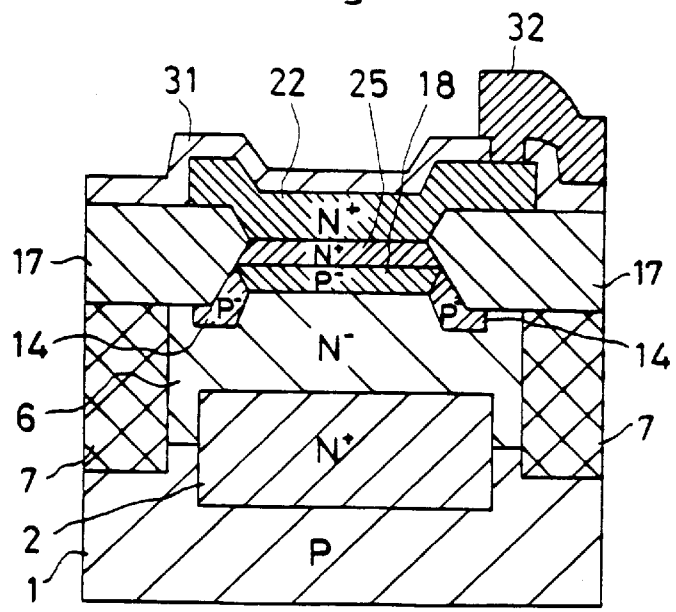

Next, as shown in FIGS. 7A and 7B, boron is introduced by ion implantation under the conditions of 20 keV, $3\times10^{15}/cm^2$ using a resist pattern as a mask, while arsenic is introduced by ion implantation under the conditions of 20 keV, $3\times10^{15}/cm^2$, using a resist pattern as a mask. Subsequently, a heat treatment is performed at a temperature of 900° C. for about 30 minutes, thereby forming the base contact region 41 composed of a $P^+$-type diffusion layer and the collector contact region 40 composed of an $N^+$-type diffusion layer. Thereafter, a $SiO_2$ film 31 is deposited by CVD to a thickness of 500 nm, followed by the formation of the base electrode 33, collector electrode 34, and emitter electrode 32, using aluminium or other material.

Thus, according to the first embodiment, the leakage prevention 14 composed of a P⁻-type diffusion layer is formed between the side face of the base region 18 and the thermal oxide film 17, serving as the isolation region, immediately under the boundary of the side face of the emitter region 25 and the thermal oxide film 17. Consequently, the lowering of impurity concentration at the interface of the base region 18 with the thermal oxide film 17 is prevented, which in turn prevents the generation of a leakage current between the emitter region 25 and collector region due to the lowering of impurity concentration in the boundary portion of the base region 18 with the thermal oxide film 17 and the lowering of voltage resistance, which have conventionally been problems. Moreover, since the leakage prevention layer 14 is formed only between the side face of the base region 18 and the thermal oxide film 17, serving as the isolation region, immediately below the boundary between the side face of the emitter region 25 and the thermal oxide film 17, the increase in parasitic capacitance can effectively be prevented. Hence, the first embodiment can realize a high-density, high-speed vertical bipolar transistor with high voltage resistance.

(Second Embodiment)

Below, a method of manufacturing a semiconductor apparatus according to a second embodiment of the present invention will be described with reference to FIGS. 8 to 15. The semiconductor apparatus according to the second embodiment comprises an N-channel MOS transistor, a vertical PNP transistor, and a vertical NPN transistor of walled-emitter type. As for the vertical NPN transistor, it corresponds to the cross section taken along the line I—I of FIG. 1A.

Figure 8:
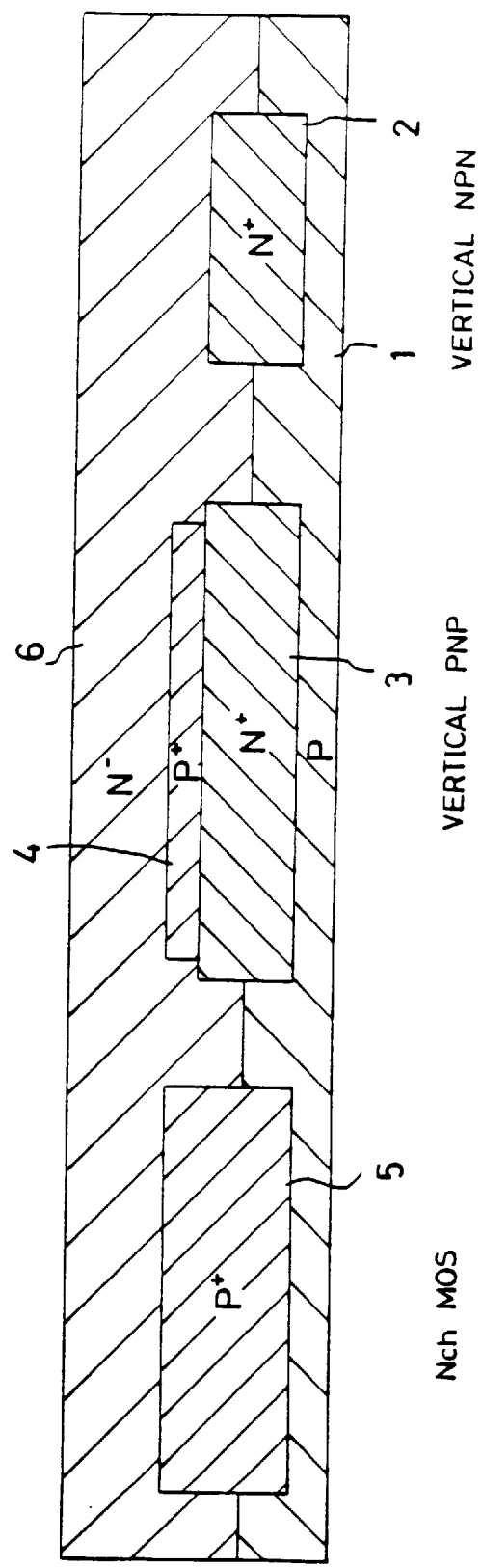
FIGS. 8 to 15 are cross sections illustrating the individual steps of the method of manufacturing a semiconductor apparatus according to a second embodiment of the present invention.

First, as shown in FIG. 8, arsenic is introduced into the semiconductor substrate 1 having a resistivity of 10 to 20 Ω.cm by ion implantation under the conditions of 60 keV, 1×10¹⁵/cm², using a resist pattern as a mask. The semiconductor substrate 1 is then subjected to a heat treatment at a temperature of 900° C. for about 30 minutes, thereby forming an N⁺-type isolation layer 3, composed of an N⁺-type diffusion layer, for isolating the N⁺-type collector region 2 of the vertical NPN transistor and the collector region of the vertical PNP transistor from the semiconductor substrate 1. Thereafter, boron is introduced by ion implantation under the conditions of 40 keV, 1×10¹⁴/cm², using a resist pattern as a mask. Subsequently, a heat treatment is performed at a temperature of 900° C. for about 30 minutes, thereby forming a P⁺-type collector region 4 for the vertical PNP transistor and a P⁺-type buried layer 5, each being composed of a P⁺-type diffusion layer. The P⁺-type buried layer 5 serves as the substrate for the N-channel MOS transistor. Thereafter, an N⁻-type epitaxial layer 6 having a resistivity of 1 Ω.cm and a thickness of 1.5 μm is grown on the semiconductor substrate 1.

Figure 9:
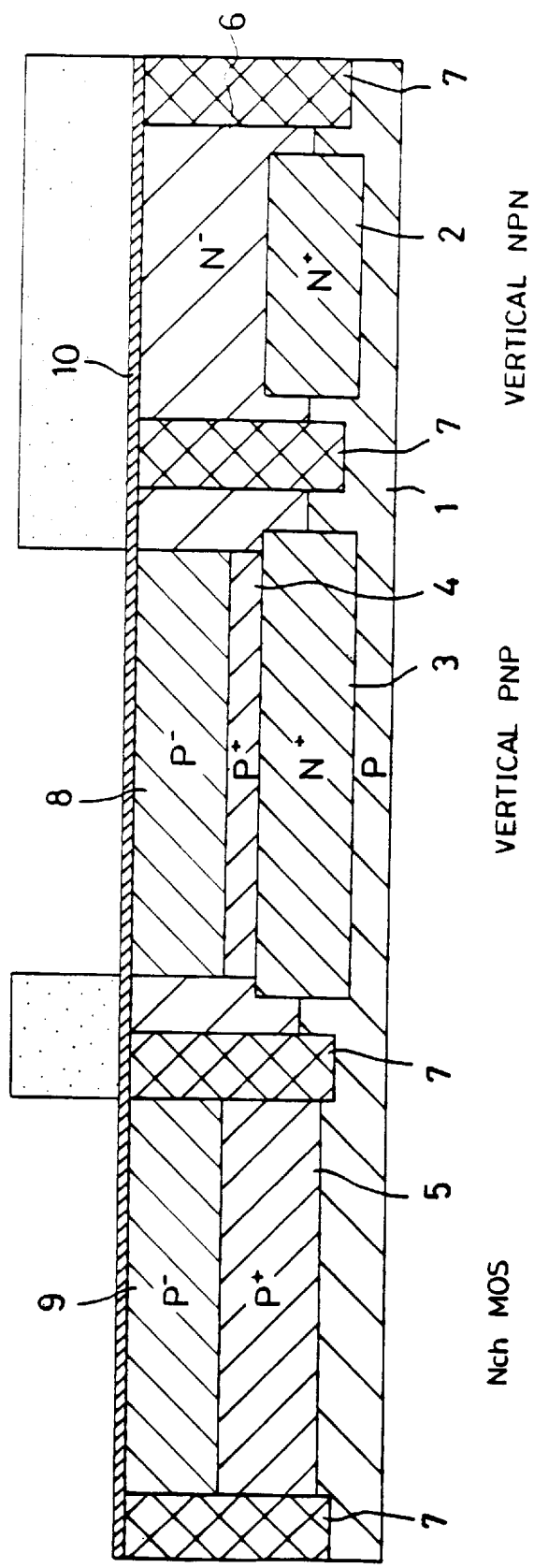

Next, as shown in FIG. 9, a trench is formed in the isolation region using a resist pattern as a mask, followed by the deposition of a thermal oxide film, so that the CVD buried oxide film 7 for isolation is formed only in the trench by etchback. Thereafter, boron is introduced by ion implantation under the conditions of 180 keV, 4×10¹²/cm², using a resist pattern as a mask. Subsequently, a heat treatment is performed at a temperature of 1100° C. for about 150 minutes, thereby forming a P⁻-type collector region 8 for the vertical PNP transistor and a P⁻-type well region 9 for the N-channel MOS transistor, each of which is composed of a P⁻-type well layer. After that, a thermal oxide film 10 is grown to a thickness of 50 nm on the surface of the N⁻-type epitaxial layer 6.

Figure 10:
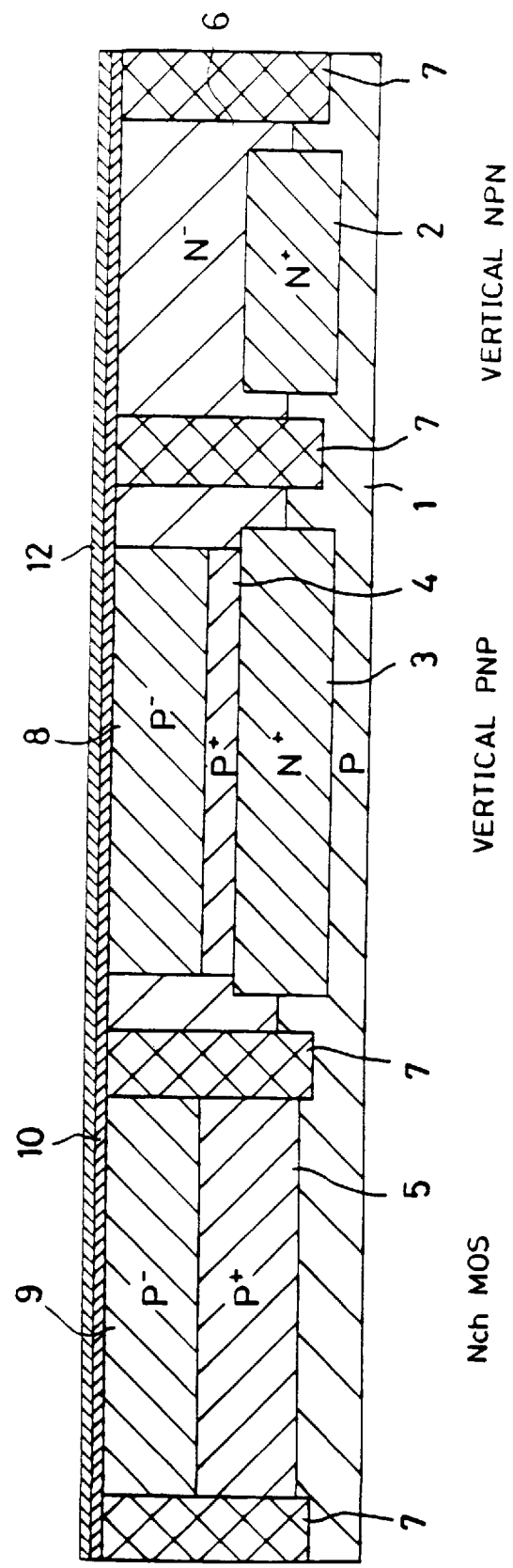

Next, as shown in FIG. 10, the silicon nitride film 12 is grown to a thickness of 120 nm on the thermal oxide film 10.

Figure 11:
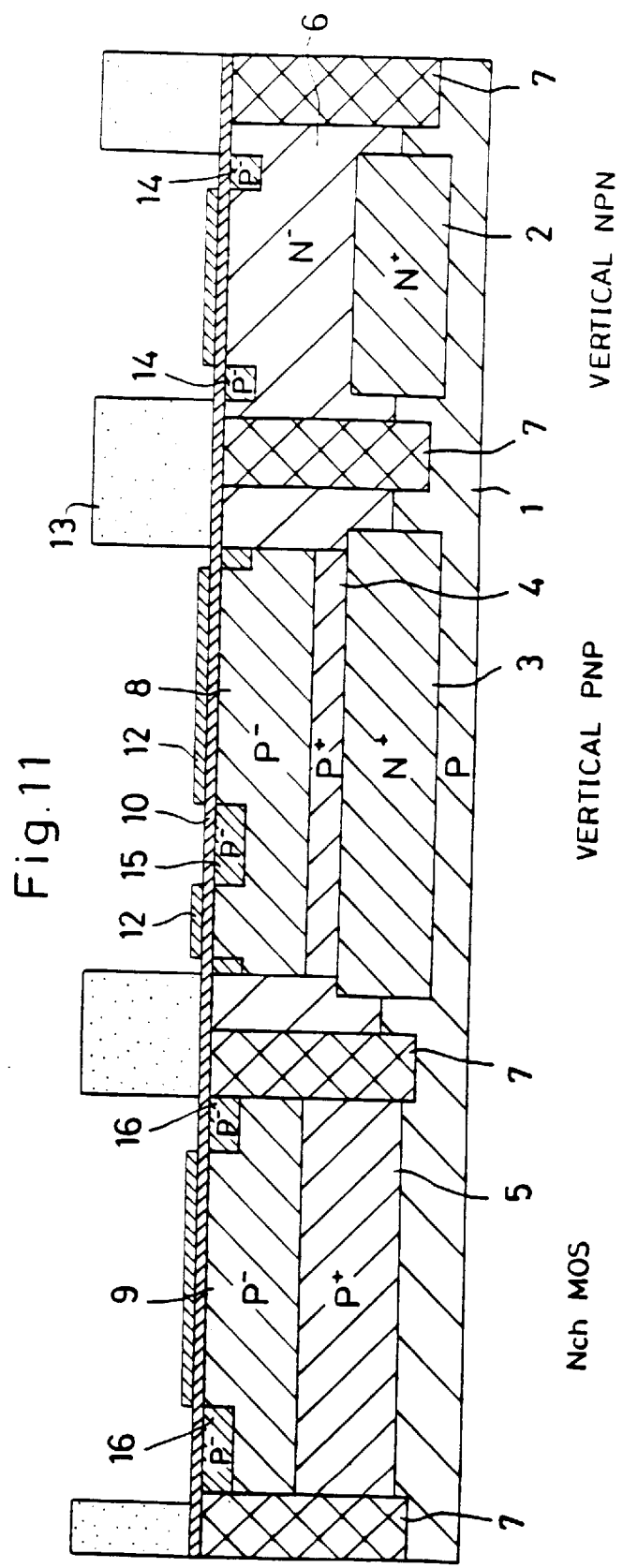

Next, as shown in FIG. 11, the silicon nitride film 12 is etched away, using a resist pattern as a mask, except for the region corresponding to the active region in which the thermal oxide film for isolation is to be formed. Thereafter, boron is introduced by ion implantation under the conditions of 100 keV, 2×10¹³/cm², using the resist pattern 13 as a mask, thereby forming the first leakage prevention layer 14, composed of a P⁻-type diffusion layer, only in the vicinity of the boundary between the future emitter region of the vertical NPN transistor and the future isolation region (corresponding to the thermal oxide film 17A of FIG. 12). Simultaneously with the formation of the first leakage prevention layer 14, a second leakage prevention layer 15 composed of a P⁻-type diffusion layer for preventing an interfacial leakage is formed in that region of the P⁻-type collector region 8 of the vertical PNP transistor which is in contact with the isolation region (corresponding to the thermal oxide film 17B of FIG. 12), and a third leakage prevention 16 composed of a P⁻-type diffusion layer, which will serve as a channel stopper, is formed in the isolation region of the N-channel MOS transistor (corresponding to the thermal oxide film 17C of FIG. 12).

Figure 12:
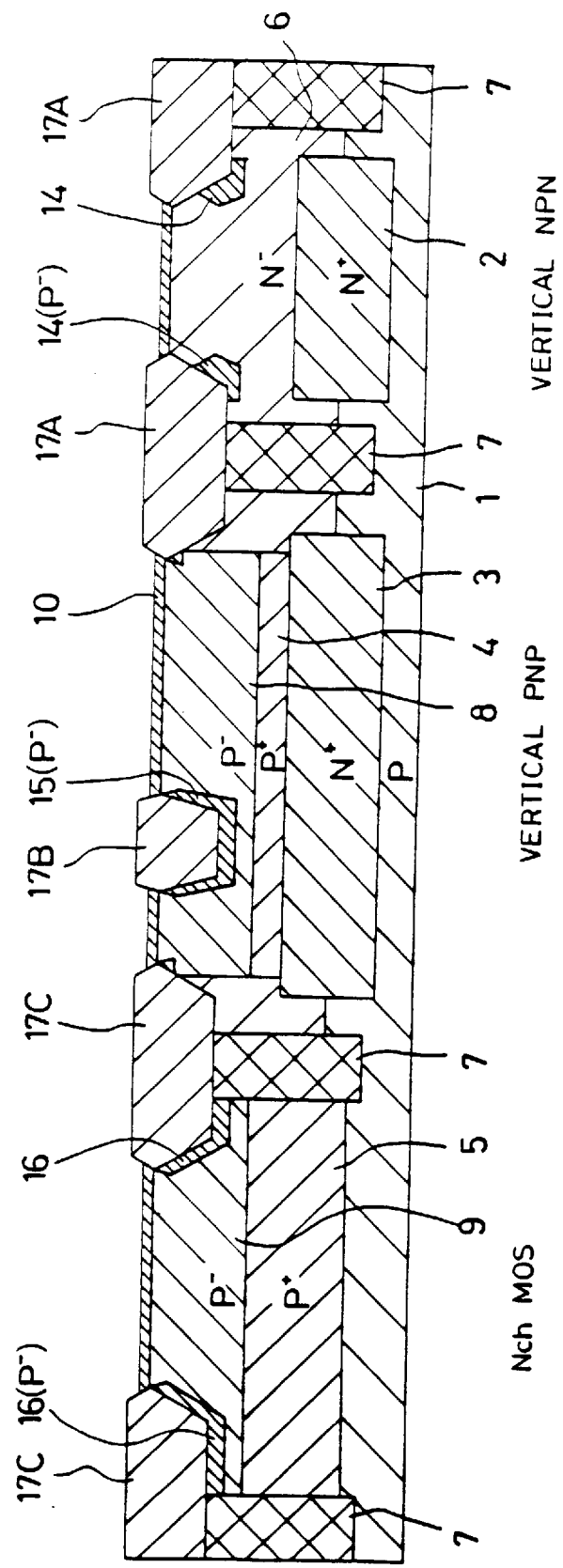

Next, as shown in FIG. 12, a selective oxidation process is performed at a temperature of 1000° C. using the silicon nitride film 12 as a mask, thereby forming the thermal oxide films 17A, 17B, and 17C to a thickness of 600 nm. After that, the silicon nitride film 12 is removed by wet etching.

Figure 13:
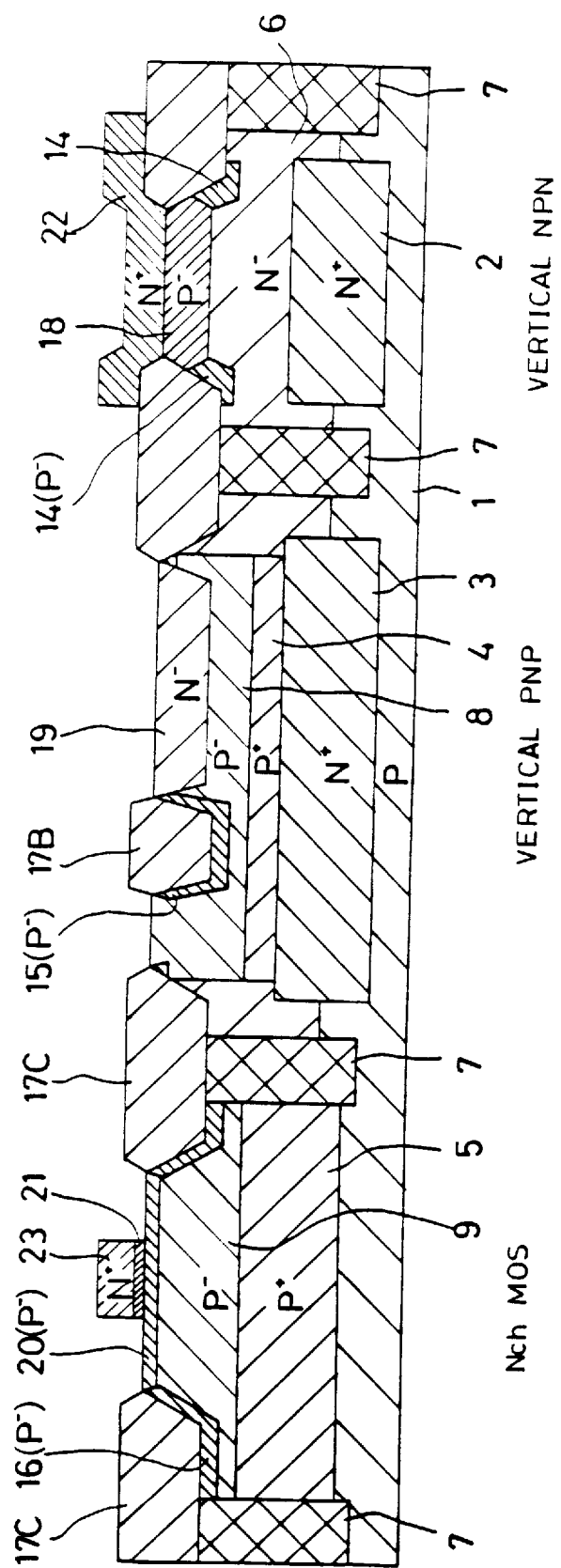

Next, as shown in FIG. 13, boron is introduced by ion implantation under the conditions of 30 keV, 2×10¹³/cm², using a resist pattern as a mask, while boron is introduced by ion implantation under the conditions of 80 keV, 3×10¹³/cm², using a resist pattern as a mask. Subsequently, a heat treatment is performed at a temperature of 900° C. for about 30 minutes, thereby forming the base region 18 composed of a P⁻-type diffusion layer for the vertical NPN transistor and a base region 19 composed of N⁻-type diffusion layer for the vertical PNP transistor. In this case, the base region 18 is formed so as to be connected to the leakage prevention layer 14. Thereafter, boron is introduced by ion implantation under the conditions of 30 keV, 3×10¹²/cm² using a resist pattern as a mask, thereby forming a P⁻-type channel doped layer 20 for the N-channel MOS transistor. After that, the thermal oxide film 10 is removed by wet etching and then a gate oxide film 21 having a thickness of 20 nm is formed over the entire surface. Subsequently, the gate oxide film 21 on the surface of the base region 18 of the vertical NPN transistor is removed by wet etching, using a resist pattern as a mask. Thereafter, a polysilicon film is deposited to a thickness of 300 nm over the entire surface, and then arsenic is introduced into the polysilicon film by ion implantation under the conditions of 60 keV, 1×10¹⁶/cm², thereby turning the polysilicon film into N⁺-type. Subsequently, the resulting N⁺-type polysilicon film is subjected to etching using a resist pattern as a mask, thereby forming an N⁺-type polysilicon film 22, which will serve as a part of the emitter electrode of the vertical NPN transistor, and an N⁺-type gate polysilicon film 23, which will serve as the gate electrode of the N-channel MOS transistor. In this case, the N⁺-type polysilicon film 22 is formed to have a striped structure and the base region 18 is etched to a point deeper than that of the emitter region 25 (see FIG. 14) in the vertical NPN transistor, similarly to the first embodiment (see FIG. 6A).

Figure 14:
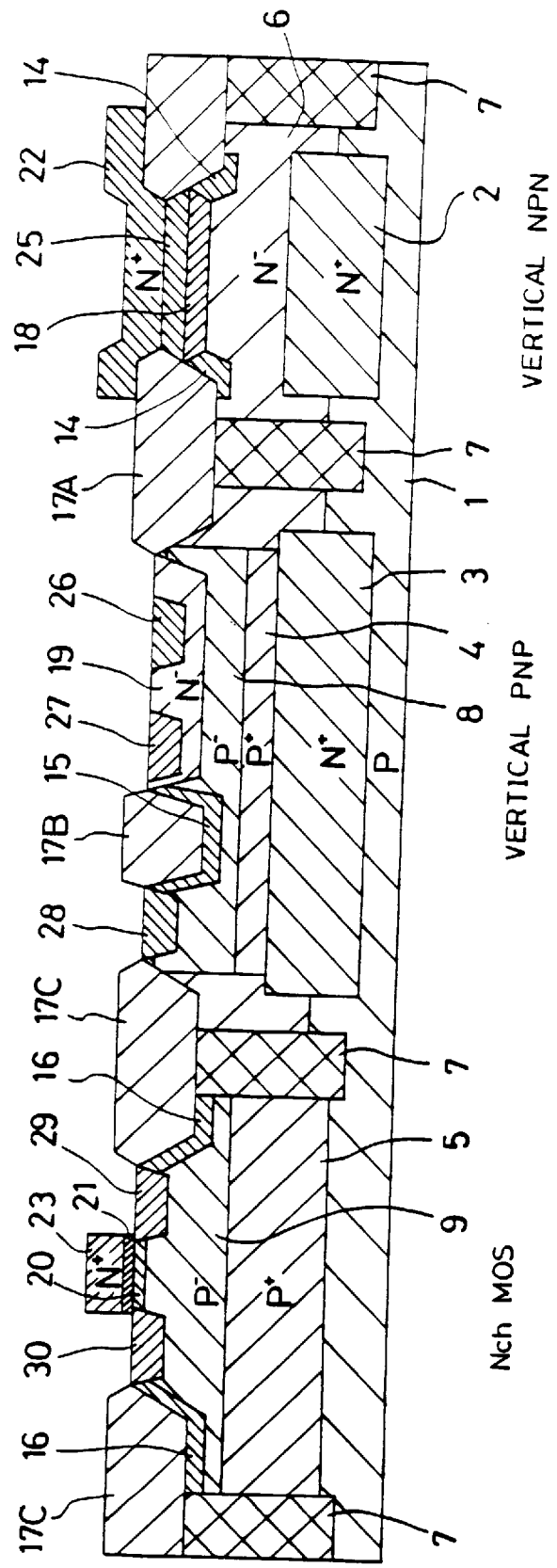

Next, as shown in FIG. 14, arsenic is introduced into the N⁺-type gate polysilicon film 23, future collector contact region of the vertical NPN transistor, future base contact region of the vertical PNP transistor, and future source and drain regions of the N-channel MOS transistor by ion implantation under the conditions of 40 keV, $6 \times 10^{15}/cm^2$, using a resist pattern as a mask. On the other hand, boron is introduced into the future base contact region of the vertical NPN transistor and to the future emitter region and collector contact region of the vertical PNP transistor by ion implantation under the conditions of 20 keV, $3 \times 10^{15}/cm^2$. Subsequently, a heat treatment is performed at a temperature of 900° C. for about 30 minutes so as to diffuse the arsenic from the $N^+$-type gate polysilicon film 23, thereby forming the emitter region 25, collector contact region 40, and base contact region 41 for the vertical NPN transistor, the emitter region 26, base contact region 27, and collector contact region 28 for the vertical PNP transistor, and the source region 30 and drain region 29 for the N-channel MOS transistor.

Figure 15:
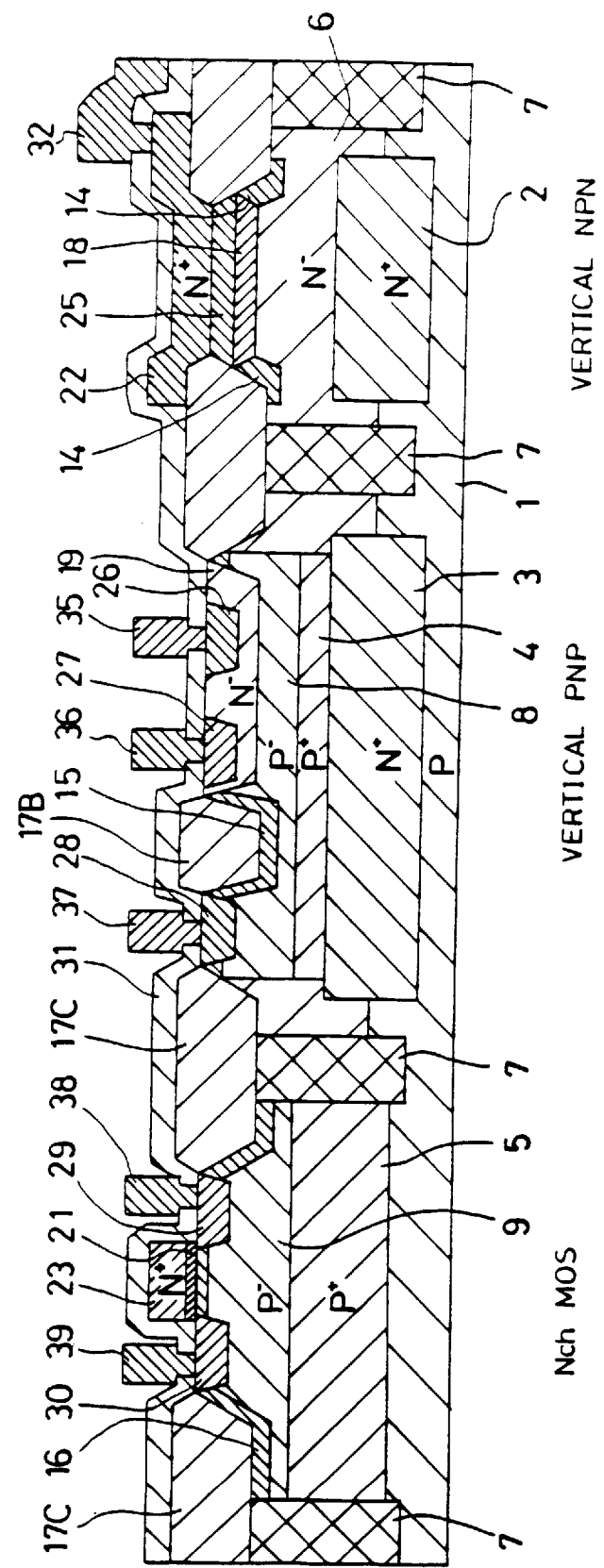

Next, as shown in FIG. 15, a $SiO_2$ film 17 is deposited to a thickness of 500 nm by CVD. Subsequently, there are formed an emitter electrode 32, a base electrode (not shown), and a collector electrode (not shown) for the vertical NPN transistor, an emitter electrode 35, a base electrode 36, and a collector electrode 37 for the vertical PNP transistor, and a source electrode 39 and a drain electrode 38 for the N-channel MOS transistor, using aluminium or other material.

Figure 16:
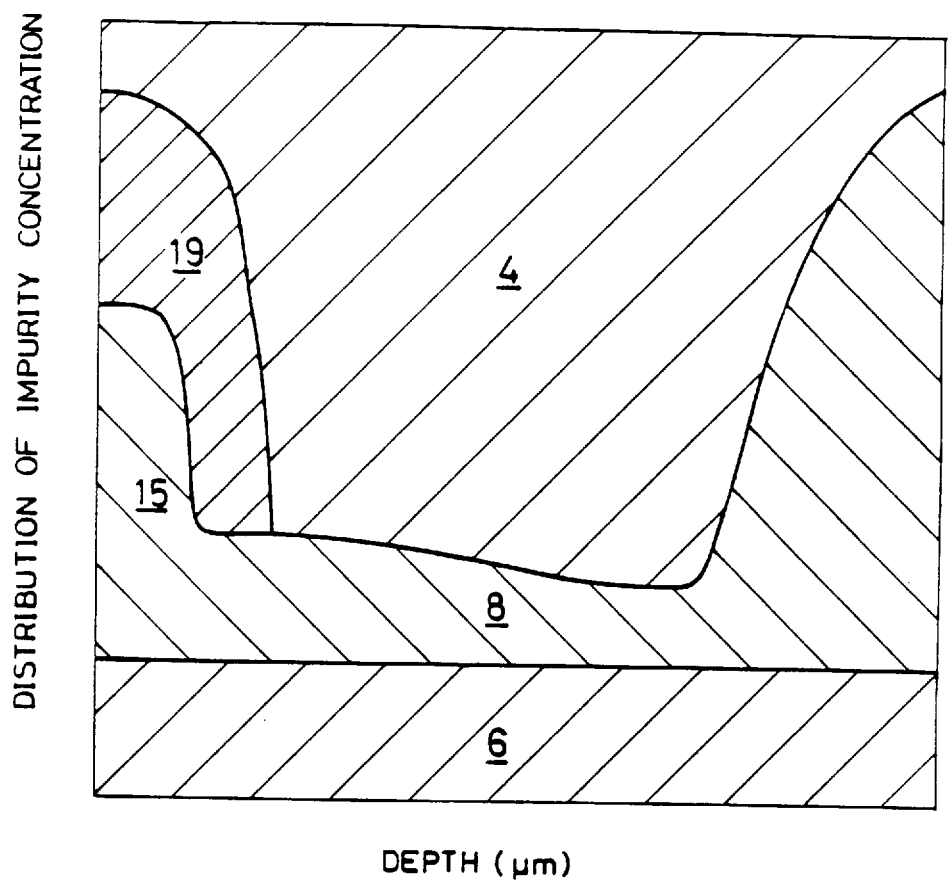
FIG. 16 shows the distribution of impurity concentration in depth of a diffusion layer formed by the method of manufacturing a semiconductor apparatus according to the above second embodiment.

FIG. 16 shows the distributions of impurity concentration in depth of the collector region and base region of the vertical PNP transistor in the semiconductor apparatus according to the second embodiment of the present invention.

As shown in FIG. 16, in the surface region of the vertical PNP transistor, there is formed the second leakage prevention layer 16, which is higher in impurity concentration than the $P^-$-type collector diffusion layer 8 and lower in impurity concentration than the base region 19. The depth of the second leakage prevention layer 16 is smaller than that of the base region 19.

Thus, the second embodiment is characterized by the simultaneous formation of: the first leakage prevention layer 14, which is similar to the leakage prevention layer used in the first embodiment for preventing the generation of a leakage current between the emitter region 25 and collector region, composed of the $P^-$-type epitaxial layer 6, of the vertical NPN transistor of walled-emitter type; the second leakage prevention layer 14 provided in that portion of the $P^-$-type collector region 8 of the vertical PNP transistor which is in contact with the thermal oxide film 17B and with a $SiO_2$ film 31 so as to prevent the generation of an interfacial leakage; and the third leakage prevention diffusion layer 16 which will serve as a channel stopper for the isolation region of the N-channel MOS transistor.

Since it has already been described in the first embodiment that the first leakage prevention layer 14 formed in the virtual NPN transistor region prevents the generation of a leakage current between the emitter region and collector region, the function of the first leakage prevention layer will not be described here.

Instead, the function of the second leakage prevention layer 15 formed in the vertical PNP transistor region will be described below.

At the interface of the $P^-$-type collector region 8 with the thermal oxide film 17B or with the $SiO_2$ film 31, the impurity introduced into the $P^-$-type collector region 8, such as boron, is absorbed by the thermal oxide film 17B or $SiO_2$ film 31, so that a depletion layer is formed at the interface of the $P^-$-type collector region 8 with the oxide film. As shown in FIG. 42A, there exist a large number of interfacial charges (indicated by x's in the drawing). The interfacial charges in the foregoing depletion layer serve as a current source. As shown in FIG. 42B, holes in the foregoing depletion layer (in the drawing, holes and electrons are indicated by ○'s and ●'s, respectively) diffuse into the $P^-$-type collector region 8, so that the foregoing depletion layer is connected to the depletion layer between the $P^-$-type collector region 8 and base region 19. As a result, a depletion layer containing a large number of interfacial charges, serving as a current source, is formed between the collector contact region 28 and base region 19, resulting in the generation of a leakage current between the collector contact region 28 and base region 19.

In the second embodiment, however, since the second leakage prevention layer 15 is formed at the interface of the base region 19 with the oxide film, the depletion layer formed at the interface of the base region 19 with the oxide film contains less interfacial charges. This can prevent the generation of the leakage current between the collector contact region 28 and base region 19.

Below, the function of the third leakage prevention layer 16 formed in the N-channel MOS transistor region will be described.

At the interface of the $P^-$-type well region 9 with the thermal oxide film 17C, the impurity introduced into the $P^-$-type well region 9, such as boron, is absorbed by the thermal oxidation film 17C. Accordingly, impurity concentration at the interface of the $P^-$-type well region 9 with the thermal oxide film 17C is lowered, resulting in the formation of a depletion layer. As a result, the source region 30 and drain region 29 are connected to each other via the depletion layer, so that a leakage current is disadvantageously generated between the source region 30 and drain region 29. In the second embodiment, however, since the third leakage prevention layer 16 is formed at the interface of the $P^-$-type well region 9 with the thermal oxide film 17C, the lowering of impurity concentration at the foregoing interface is prevented, so that the generation of a leakage current between the source region 30 and drain region 29 is also prevented.

Consequently, it becomes possible to integrate the high-speed, high-density vertical NPN transistor, vertical PNP transistor, and N-channel MOS transistor, each having high voltage resistance, on the same semiconductor substrate without increasing the number of manufacturing steps. Hence, a BiCMOS semiconductor apparatus provided with various added values can be manufactured at low cost.

Although the semiconductor apparatus according to the second embodiment has the vertical NPN transistor, vertical PNP transistor, and N-channel MOS transistor, the same effects can be obtained provided that the semiconductor apparatus has at least two of the above three transistors.

(Third Embodiment)

Below, a method of manufacturing a semiconductor apparatus according to a third embodiment of the present invention will be described with reference to FIGS. 17 to 24. The semiconductor apparatus according to the third embodiment comprises the N-channel MOS transistor, vertical PNP transistor, and vertical NPN transistor of walled-emitter type. As for the vertical NPN transistor, it corresponds to the cross section taken along the line I—I of FIG. 1A.

Figure 17:
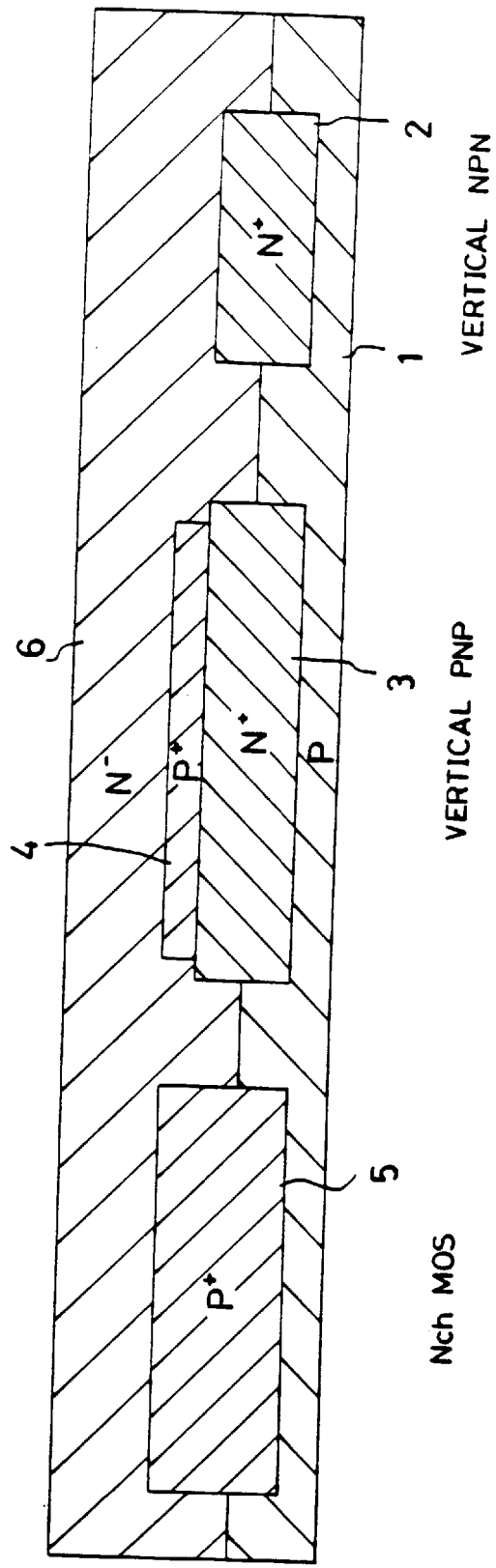
FIGS. 17 to 24 are cross sections illustrating the individual steps of the method of manufacturing a semiconductor apparatus according to a third embodiment of the present invention.

First, as shown in FIG. 17, arsenic is introduced into the P-type semiconductor substrate 1 having a resistivity of 10 to 20 Ω.cm by ion implantation under the conditions of 60 keV, $1\times10^{15}/cm^2$, using a resist pattern as a mask. The semiconductor substrate 1 is then subjected to a heat treatment at a temperature of 900° C. for about 30 minutes, thereby forming the N$^+$-type isolation layer 3, composed of an N$^+$-type diffusion layer, for isolating the N$^+$-type collector region 2 of the vertical NPN transistor and the collector region of the vertical PNP transistor from the semiconductor substrate. Thereafter, boron is introduced by ion implantation under the conditions of 40 keV, $1\times10^{14}/cm^2$, using a resist pattern as a mask. Subsequently, a heat treatment is performed at a temperature of 900° C. for about 30 minutes, thereby forming the P$^+$-type collector region 4 of the vertical PNP transistor and the P$^+$-type buried layer 5 serving as the substrate for the N-channel MOS transistor, each of which is composed of a P$^+$-type diffusion layer. After that, the N$^-$-type epitaxial layer 6 having a resistivity of about 1 Ω.cm and a thickness of about 1.5 μm is formed on the semiconductor substrate 1.

Figure 18:
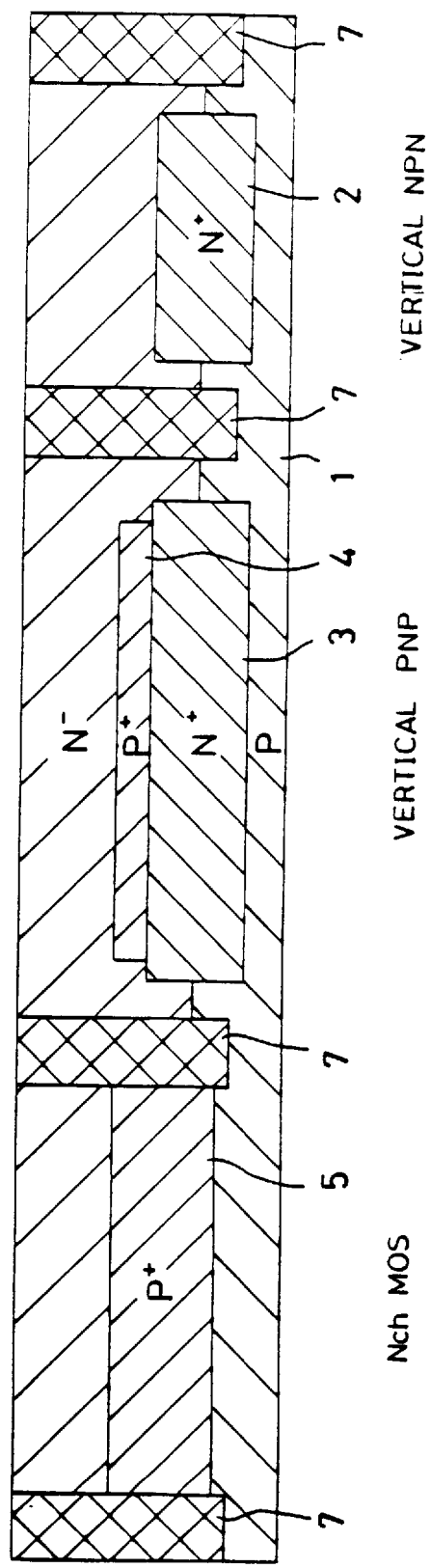

Next, as shown in FIG. 18, a trench is formed in the isolation region using a resist pattern as a mask, followed by the deposition of an oxide film, so that the CVD buried oxide film 7 for isolation is formed only in the trench by etchback.

Figure 19:
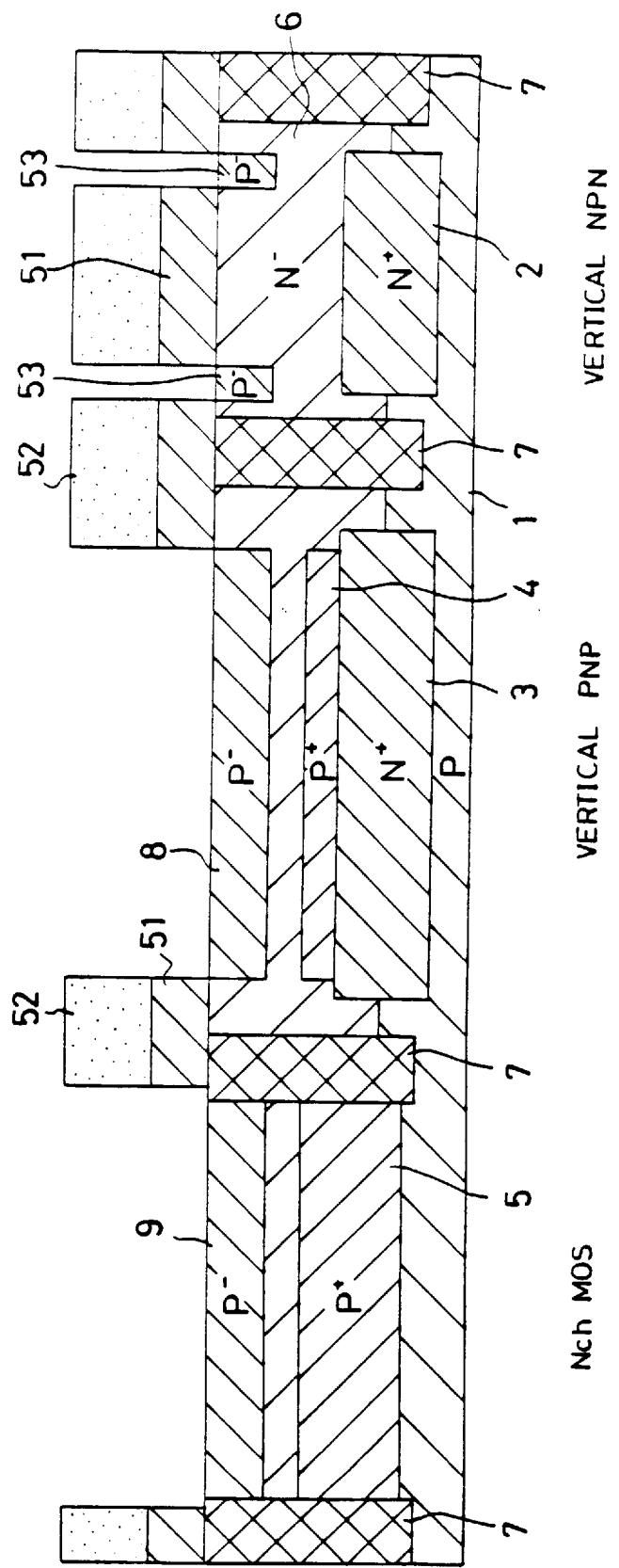

Next, as shown in FIG. 19, a SiO$_2$ film 51 is deposited to a thickness of 500 nm over the entire surface by CVD. After that, the SiO$_2$ film 51 lying on the portion equivalent to the first leakage prevention layer 14 (see FIG. 11), collector region of the vertical PNP transistor, and P$^-$-type well region of the N-channel MOS transistor is selectively etched away. Thereafter, boron is introduced by ion implantation under the conditions of 180 keV, $4\times10^{12}/cm^2$, and then a heat treatment is performed at a temperature of 1100° C. for about 150 minutes, thereby forming a P$^-$-type well layer 53 serving as a part of the leakage prevention layer for the vertical NPN transistor, the collector region 8 composed of the P$^-$-type well layer for the vertical PNP transistor, and the P$^-$-type well region 9 for the N-channel MOS transistor.

Figure 20:
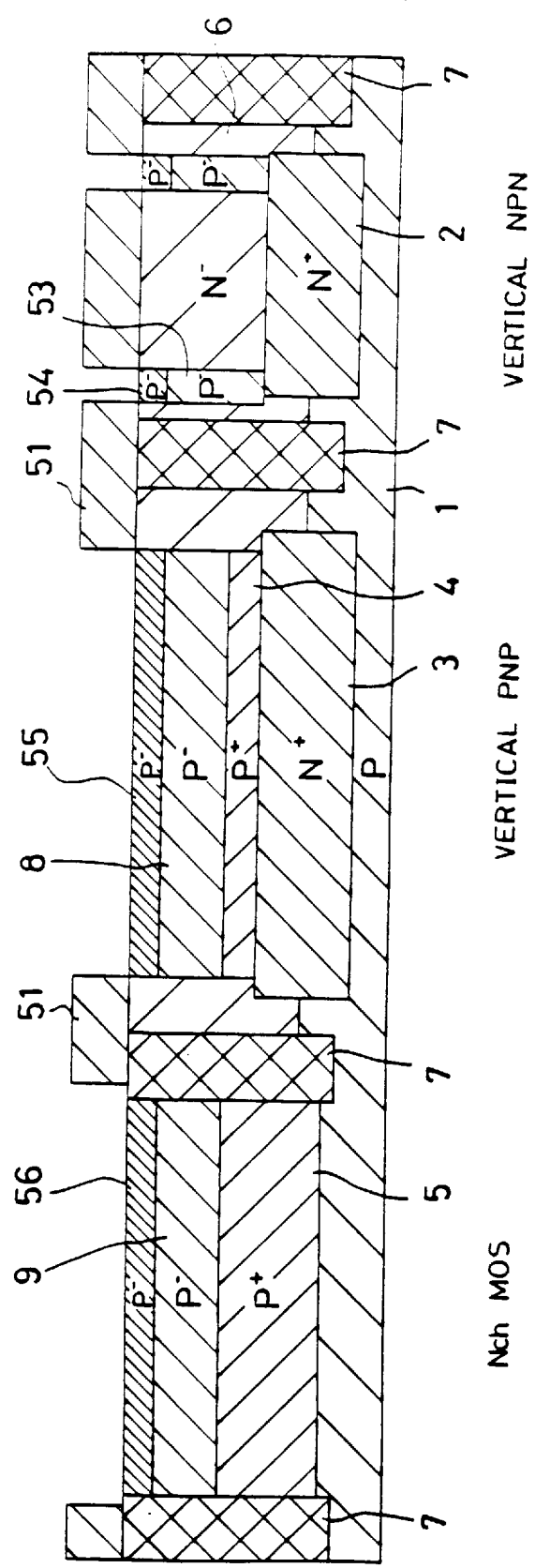

Next, as shown in FIG. 20, boron is introduced by ion implantation under the conditions of 30 keV, $1\times10^{13}/cm^2$ by ion implantation, using a SiO$_2$ film 51 as a mask, thereby forming: a first leakage prevention layer 54 on the P$^-$-type well layer 53, which is composed of a P$^-$-type diffusion layer, so as to prevent the generation of a leakage current between the emitter region and collector region of the vertical NPN transistor; a second leakage prevention layer 55, composed of a P$^-$-type ion diffusion layer, in the surface region of the P$^-$-type collector region 8 of the vertical PNP transistor; and a third leakage prevention layer in the active region and isolation region of the N-channel MOS transistor, which is composed of a P$^-$-type diffusion layer so as to serve as a P$^-$-type channel doped layer as well as channel stopper. After that, the SiO$_2$ film 51 is removed.

Figure 21:
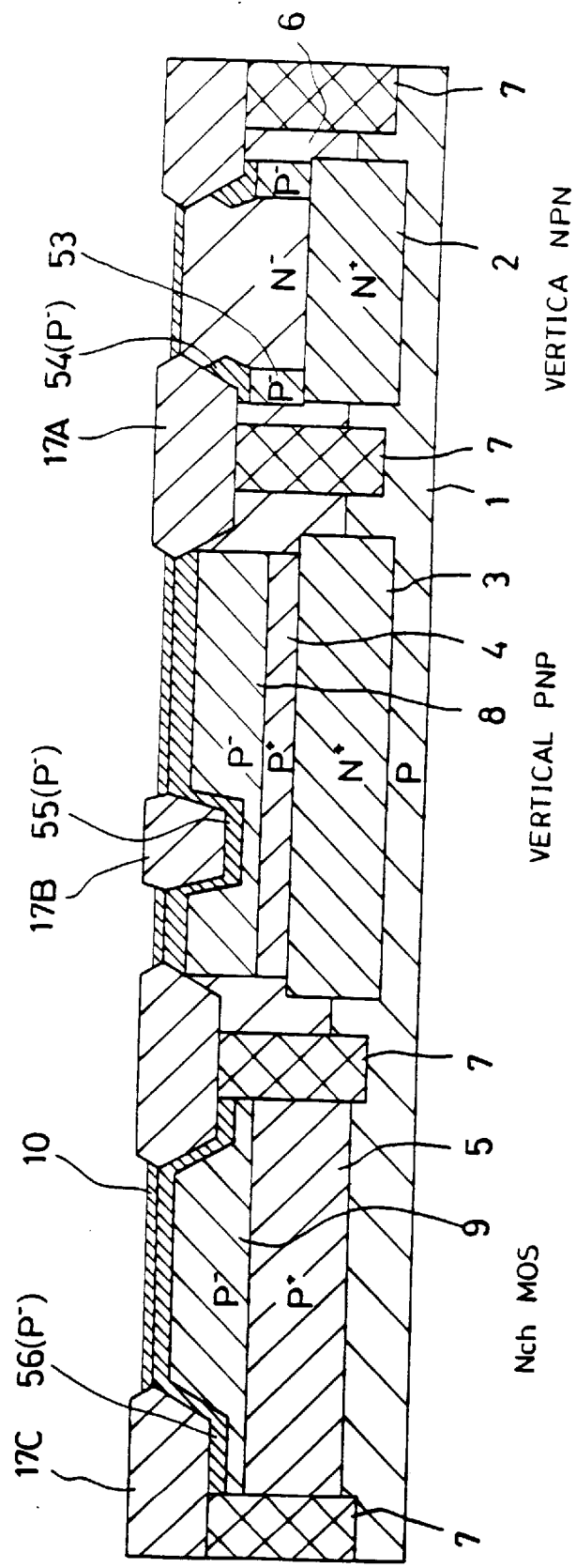

Next, as shown in FIG. 21, the thermal oxide film 10 is formed to a thickness of 50 nm on the surface of the N$^-$-type epitaxial layer 6, followed by the formation of the silicon nitride film 12 having a thickness of 120 nm on the thermal oxide film 10. The silicon nitride film 12 is then selectively etched away by using a resist pattern as a mask, except for the regions in which the thermal oxide films 17A, 17B, and 17C are to be formed. Subsequently, a selective oxidation process is performed at a temperature of 1000° C. using the silicon nitride film 12 as a mask, thereby forming the thermal oxide films 17A, 17B, and 17C to a thickness of 600 nm. After that, the silicon nitride film 12 is removed by wet etching.

Figure 22:
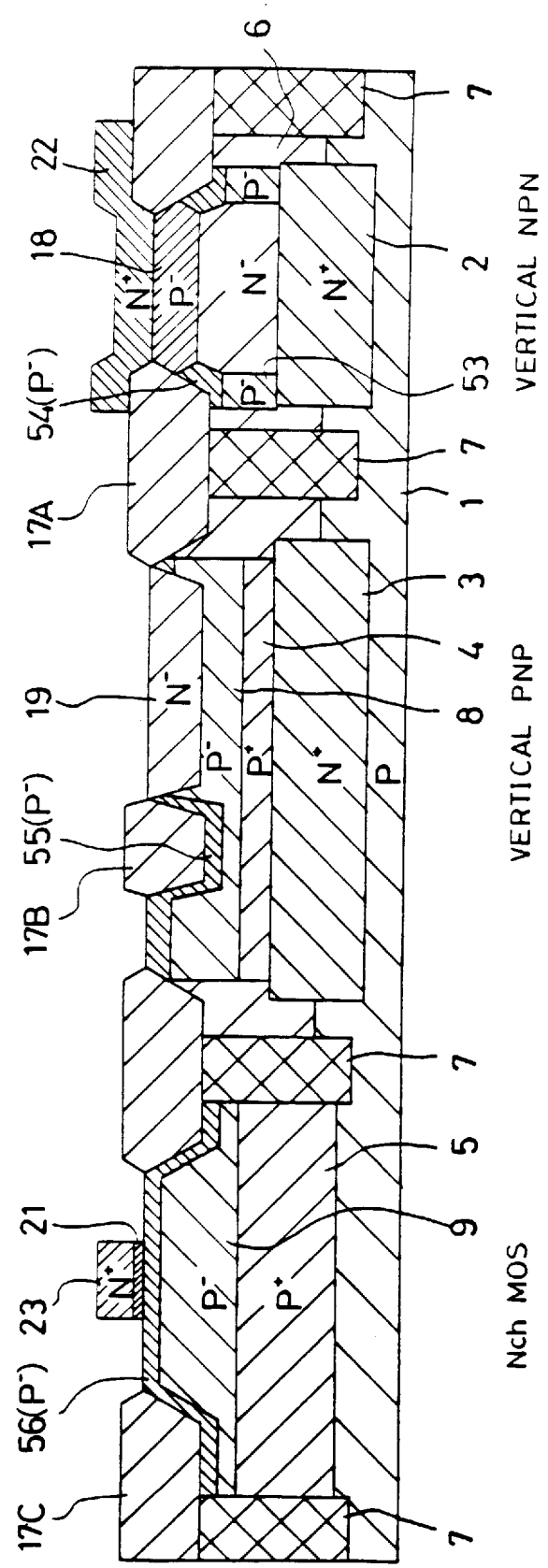

Next, as shown in FIG. 22, boron is introduced by ion implantation under the conditions of 30 keV, $2\times10^{13}/cm^2$, using a resist pattern as a mask, while boron is introduced by ion implantation under the conditions of 80 keV, $3\times10^{13}/cm^2$ using a resist pattern as a mask. Subsequently, a heat treatment is performed at a temperature of 900° C. for about 30 minutes, thereby forming the base region 18 composed of a P$^-$-type diffusion layer for the vertical NPN transistor and the base region 19 composed of an N$^-$-type diffusion layer for the vertical PNP transistor. In this case, the second leakage prevention diffusion layer 55 which was formed in the P$^-$-type collector region 8 of the vertical PNP transistor is merged by the base region 19 in the region in which the base region 19 is formed, while it is left in the region in which the base region 19 is not formed. In the vertical NPN transistor, the base region 18 is formed so as to be connected to the first leakage prevention layer 49. Then, the thermal oxide film 10 is removed by wet etching, followed by the formation of the gate oxide film 21 having a thickness of 20 nm over the entire surface. After that, the gate oxide film 21 lying on the surface of the base region 18 of the vertical NPN transistor is etched away, using a resist pattern as a mask. Thereafter, a polysilicon film is deposited to a thickness of 300 nm over the entire surface, and then arsenic is introduced into the polysilicon film by ion implantation under the conditions of 60 keV, $1\times10^{16}/cm^2$, thereby turning the polysilicon film into N$^+$-type. Subsequently, the foregoing polysilicon film is subjected to etching using a resist pattern as a mask, thereby forming the N$^+$-type polysilicon film 22 serving as a part of the emitter electrode for the vertical NPN transistor and the N$^+$-type gate polysilicon film 23 serving as the gate electrode for the N-channel MOS transistor. In this case, in the vertical NPN transistor region, the N$^+$-type polysilicon film 22 is formed to have a striped structure and the base region 18 is etched to a point deeper than that of the emitter region 25 (see FIG. 23), similarly to the first embodiment.

Figure 23:
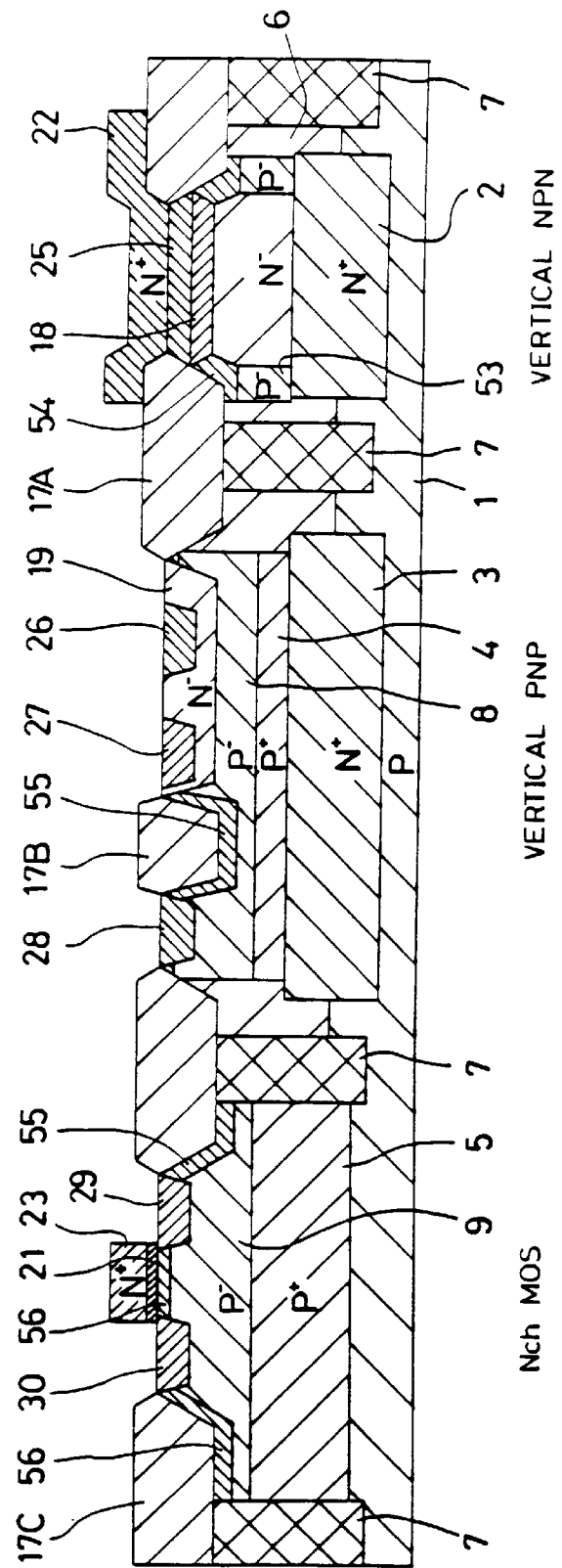

Next, as shown in FIG. 23, arsenic is introduced into the N$^+$-type gate polysilicon film 23, future collector contract region of the vertical NPN transistor, base contact region of the vertical PNP transistor, and future source and drain regions of the N-channel MOS transistor by ion implantation under the conditions of 40 keV, $6\times10^{15}/cm^2$, using a resist pattern as a mask. On the other hand, boron is introduced into the future base contact region of the vertical NPN transistor and into the future emitter region and collector contact region of the vertical PNP transistor, by using a resist pattern as a mask. Subsequently, a heat treatment is performed at a temperature of 900° C. for about 30 minutes so as to diffuse the arsenic from the N$^+$-type gate polysilicon film 23, thereby forming: the emitter region 25, collector contact region 40, and base contact region 41 for the vertical NPN transistor; the emitter region 26, base contact region 27, and collector contact region 28 for the vertical PNP transistor; and the drain region 29 and source region 30 of the N-channel MOS transistor.

Figure 24:
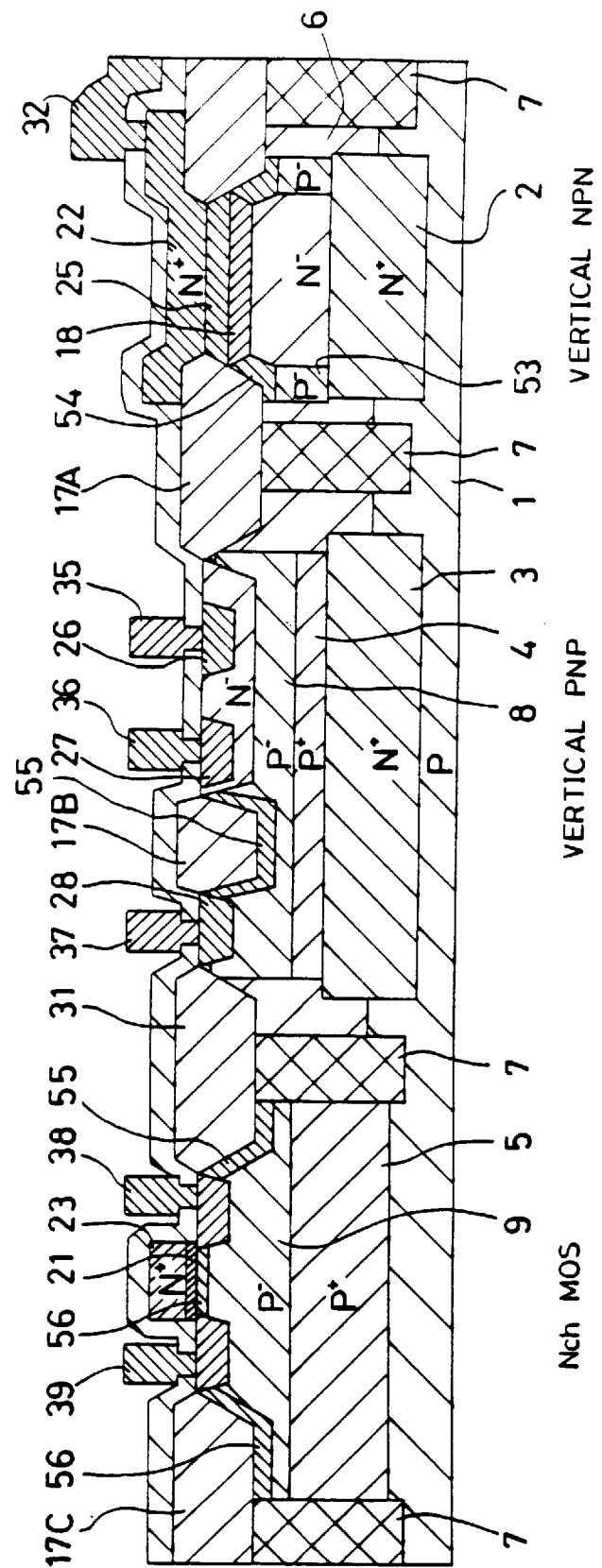

Next, as shown in FIG. 24, the SiO$_2$ film 31 is deposited to a thickness of 500 nm by CVD. Subsequently, there are formed: the emitter electrode 32, base electrode (not shown), and collector electrode (not shown) of the vertical NPN transistor; the emitter electrode 35, base electrode 36, and collector electrode 37 of the vertical PNP transistor; and the drain electrode 38 and source electrode 39 of the N-channel MOS transistor, using aluminium or other material.

As described above, according to the third embodiment, the impurity concentration of the intrinsic collector region (P$^-$-type collector region 8) of the collector region of the vertical PNP transistor can be decreased, while the impurity concentration of the region closest to the surface of the collector region (second leakage prevention layer 55) of the vertical PNP transistor can solely be increased, using only one mask for defining the collector region. Accordingly, the third embodiment exerts the following effects that: (1) high-speed performance is realized due to the small capacitance between the collector region and base region; (2) the generation of a leakage current in the surface region of the P⁻-type collector region 8 can be reduced because the lowering of impurity concentration at the interfaces of the P⁻-type collector region 8 with the thermal oxide film 17B and with the SiO₂ film 31 can be prevented; and (3) lower cost is realized because the P⁻-type collector region 8 and second leakage prevention layer 55 can be formed using only one mask for defining the collector region.

Furthermore, according to the third embodiment, it is also possible to simultaneously form: the first leakage prevention layer 54 for preventing the generation of a leakage current between the emitter region 25 and collector region 2 of the vertical NPN transistor of walled-emitter type, which is similar to the leakage prevention layer used in the first embodiment; the second leakage prevention layer 55 formed at the interfaces of the P⁻-type collector region 8 of the vertical PNP transistor with the thermal oxide film 17B and wit the SiO₂ film 31 so as to prevent an interfacial leakage; and the third leakage prevention diffusion layer serving as a channel stopper for the N-channel MOS transistor. Thus, according to the third embodiment, a BiCMOS semiconductor apparatus with various added values can be formed at lower cost without increasing the manufacturing steps.

Although the semiconductor apparatus according to the third embodiment has the vertical NPN transistor, vertical PNP transistor, and N-channel MOS transistor, the same effects can be obtained provided that it has at least two of the above three transistors.

(Fourth Embodiment)

Below, a process of manufacturing a semiconductor apparatus according to a fourth embodiment of the present invention will be described with reference to FIGS. 25 to 32. The semiconductor apparatus according to the fourth embodiment comprises the N-channel MOS transistor, vertical PNP transistor, and vertical NPN transistor of walled-emitter type. As for the vertical NPN transistor, it corresponds to the cross section taken along the line I—I of FIG. 1A.

Figure 25:
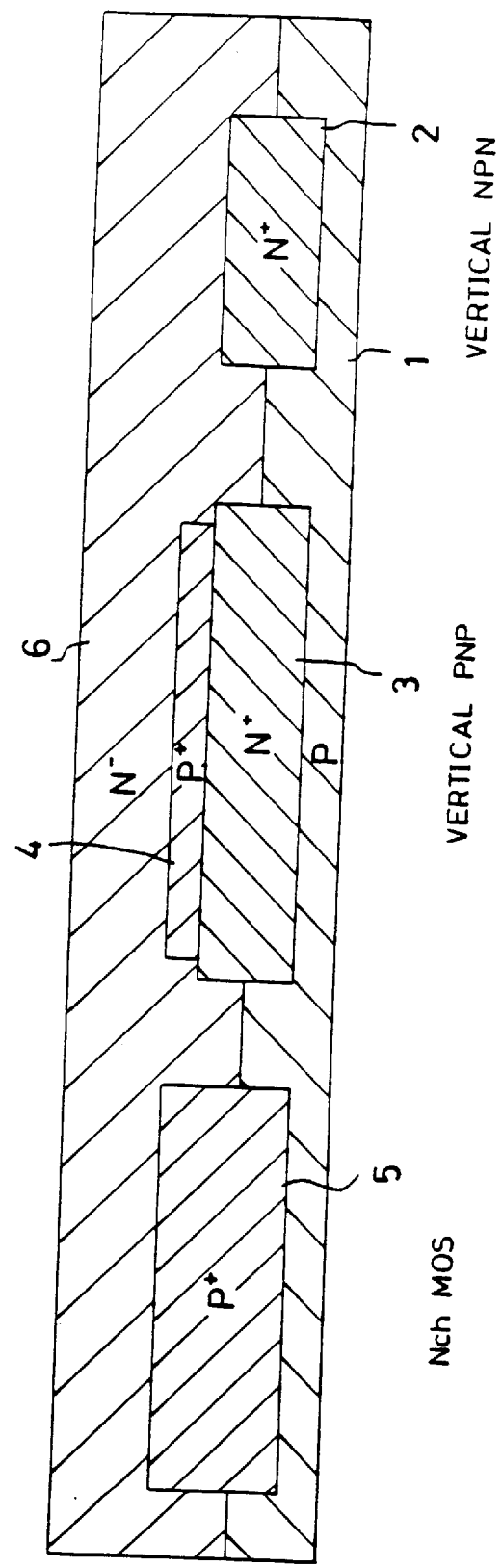
FIGS. 25 to 32 are cross sections illustrating the individual steps of the method of manufacturing a semiconductor apparatus according to a fourth embodiment of the present invention.

First, as shown in FIG. 25, arsenic is introduced into the semiconductor substrate 1 having a resistivity of 10 to 20 Ω.cm by ion implantation under the conditions of 60 keV, 1×10¹⁵/cm², using a resist pattern as a mask. The semiconductor substrate 1 is then subjected to a heat treatment at a temperature of 900° C. for about 30 minutes, thereby forming the N⁺-type isolation layer 3 composed of an N⁺-type diffusion layer for isolating the N⁺-type collector region 2 of the vertical NPN transistor and the collector region of the vertical PNP transistor from the semiconductor substrate 1. Thereafter, boron is introduced by ion implantation under the conditions of 40 keV, 1×10¹⁴/cm², using a resist pattern as a mask. Subsequently, a heat treatment is performed at a temperature of 900° C. for about 30 minutes, thereby forming the P⁺-type collector region 4 for the vertical PNP transistor and the P⁺-type buried layer 5 serving as the substrate for the N-channel MOS transistor, each of which is composed of a P⁺-type diffusion layer. After that, the N⁻-type epitaxial layer 6 having a resistivity of 1 Ω.cm and a thickness of 1.5 μm is formed on the semiconductor substrate 1.

Figure 26:
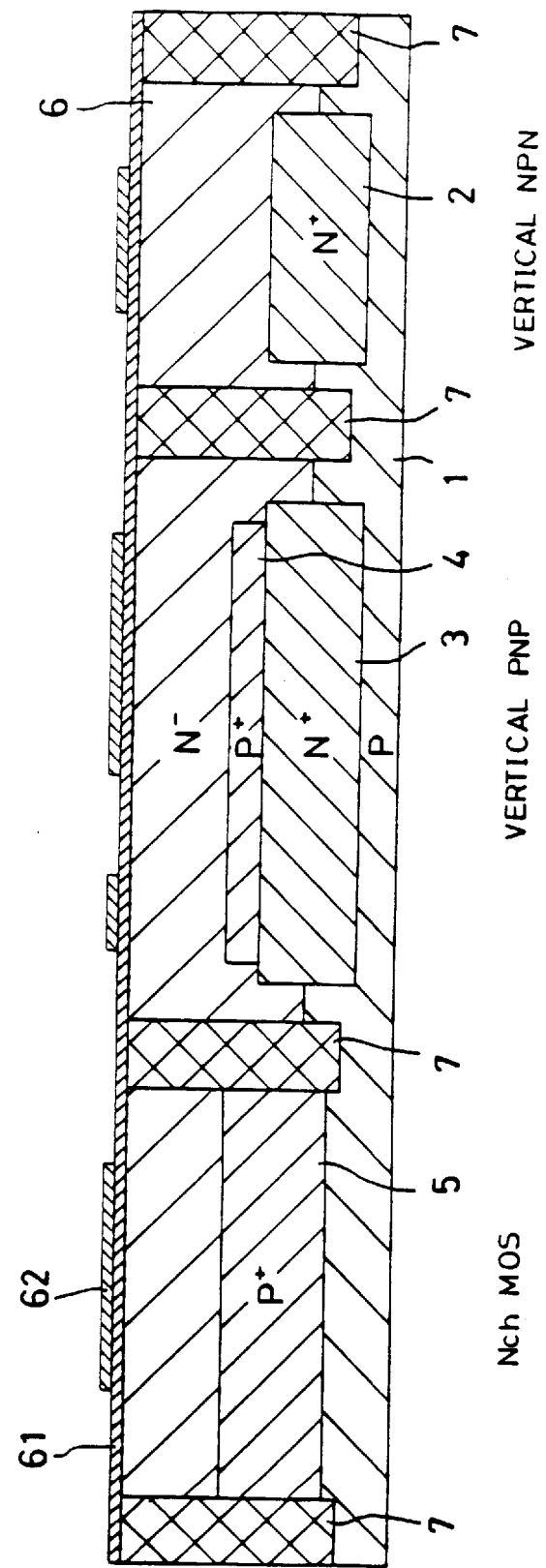

Next, as shown in FIG. 26, a trench is formed in the isolation region using a resist pattern as a mask, followed by the deposition of an oxide film, so that the CVD buried oxide film 7 for isolation is formed only in the trench by etchback. Thereafter, a thermal oxide film 61 is grown to a thickness of 50 nm on the surface of the N⁻-type epitaxial layer 6, and then a silicon nitride film 62 is grown to a thickness of 120 nm on the thermal oxide film 61. Subsequently, using a resist pattern as a mask, the silicon nitride film 62 is etched away except for the region corresponding to the active region in which the oxide film for isolation is to be formed.

Figure 27:
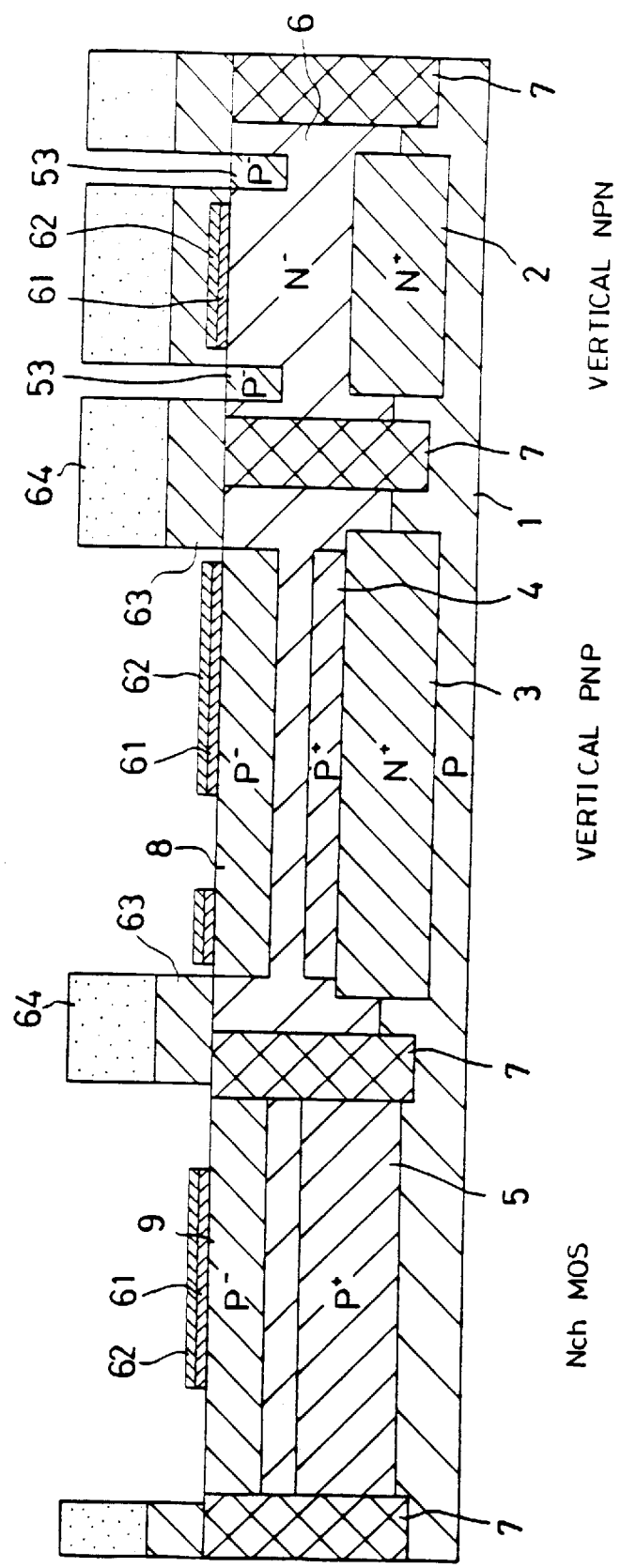

Next, as shown in FIG. 27, a SiO₂ film 63 is deposited to a thickness of 500 nm over the entire surface by CVD. Then, the SiO₂ film 63 on the region equivalent to the first leakage prevention layer 14 of the second embodiment (see FIG. 11), on the collector region of the vertical PNP transistor, and on the P⁻-type well region of the N-channel MOS transistor is etched away, using the resist pattern 64 as a mask. Thereafter, boron is introduced by ion implantation under the conditions of 180 keV, 4×10¹²/cm². Subsequently, a heat treatment is performed at a temperature of 1100° C. for about 150 minutes, thereby forming the P⁻-type well layer 53 serving as a part of the leakage prevention layer for the vertical NPN transistor, the P⁻-type collector region 8 composed of a P⁻-type well layer for the vertical PNP transistor, and the P⁻-type well region 9 for the N-channel MOS transistor.

Figure 28:
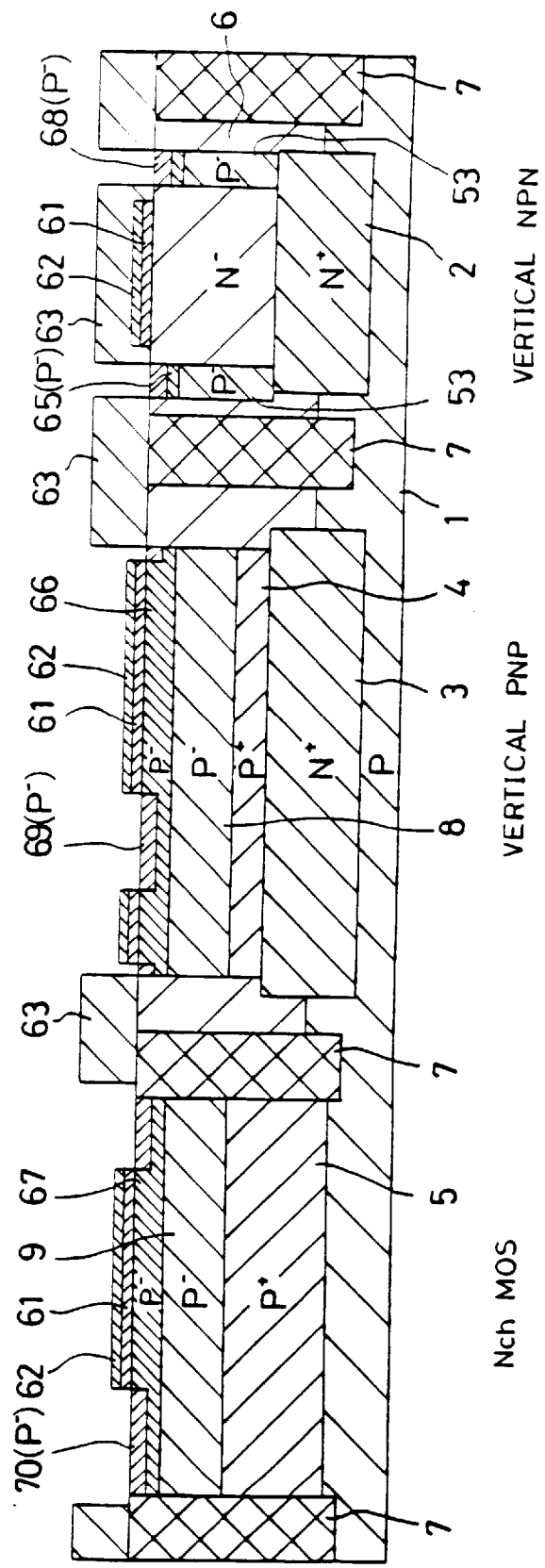

Next, as shown in FIG. 28, boron is introduced by ion implantation under the conditions of 64 keV, 5×10¹³/cm² using the SiO₂ film 63 as a mask, thereby forming: on the P⁻-type well layer 53, a first leakage prevention layer 65 composed of a P⁻-type diffusion layer so as to prevent the generation of a leakage current between the emitter region and collector region of the vertical NPN transistor; on the surface of the P⁻-type collector region 8 of the vertical PNP transistor, a second leakage prevention layer 66 composed of a P⁻-type diffusion layer; and in the active region and isolation region of the N-channel MOS transistor, a third leakage prevention diffusion layer 67 composed of a P⁻-type diffusion layer so as to serve as a P⁻-type channel doped layer as well as channel stopper. Subsequently, BF₂ is introduced by ion implantation under the conditions of 60 keV, 5×10¹³/cm² using the SiO₂ film 63 and silicon nitride film 62 as masks, thereby forming: a fourth leakage prevention layer 68, composed of a P⁻-type diffusion layer, on the first leakage prevention layer 65; a fifth leakage prevention layer 69, composed of a P⁻-type diffusion layer, on the surface of that region of the P⁺-type collector region 4 of the vertical PNP transistor in which the thermal oxide film 17B for isolation (see FIG. 29) is to be formed; and a sixth leakage prevention layer 70, composed of a P⁻-type diffusion layer, in the isolation region of the N-channel MOS transistor. The sequence of the ion implantation of boron and the ion implantation of BF₂ mentioned above may be reversed.

Figure 29:
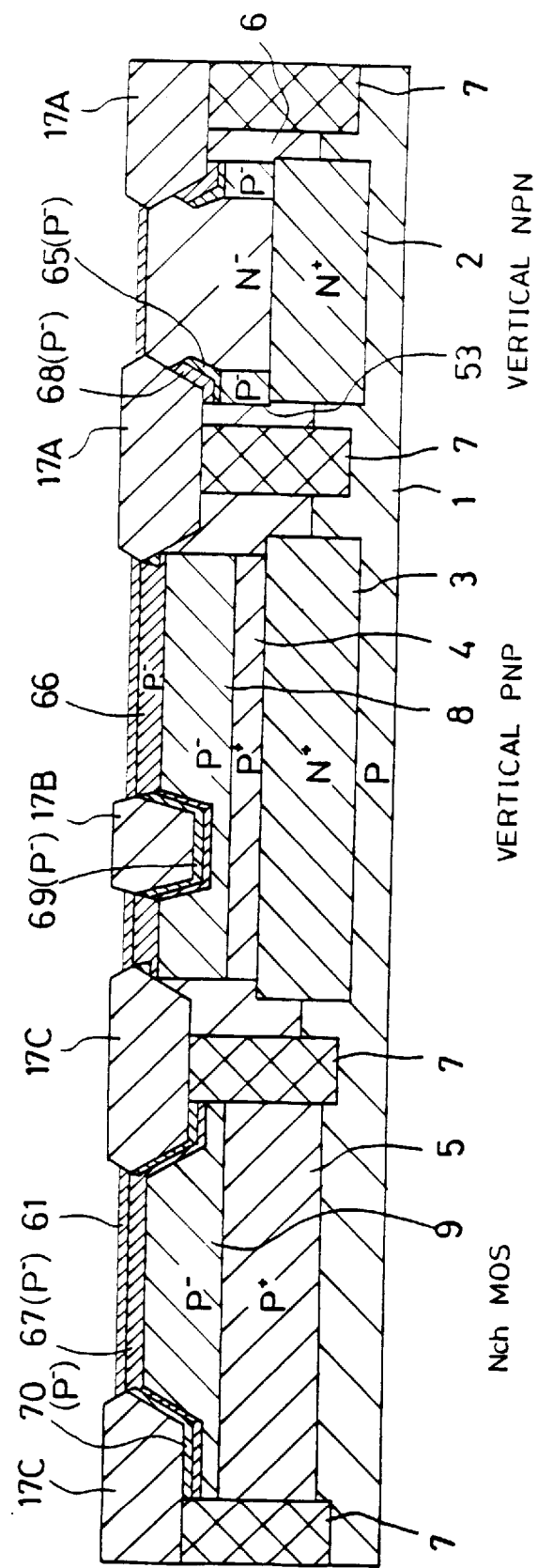

Next, as shown in FIG. 29, the SiO₂ film 63 is removed, and then a selective oxidation process is performed at a temperature of 1000° C. using the silicon nitride film 62 as a mask, thereby forming the thermal oxide films 17A, 17B, and 17C to a thickness of 600 nm. After that, the silicon nitride film 62 is removed by wet etching.

Figure 30:
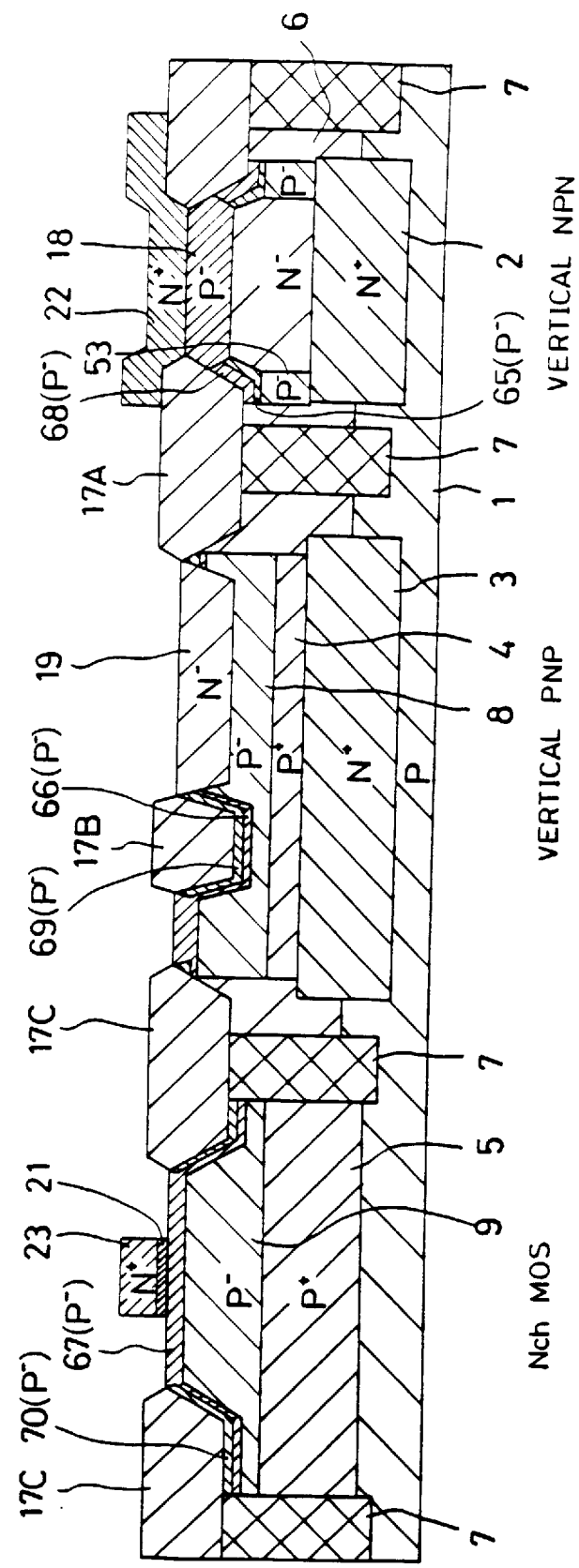

Next, as shown in FIG. 30, boron is introduced by ion implantation under the conditions of 30 keV, 2×10¹³/cm² using a resist pattern as a mask, while phosphorus is introduced by ion implantation under the conditions of 80 keV, 3×10¹³/cm² using a resist pattern as a mask. Subsequently, a heat treatment is performed at a temperature of 900° C. for about 30 minutes, thereby forming the base region 18 composed of a P⁻-type diffusion layer for the vertical NPN transistor and the base region 19 composed of an N⁻-type diffusion layer for the vertical PNP transistor. In this case, that region of the second leakage prevention layer 66 formed in the surface area of the P⁻-type collector region 8 of the vertical PNP transistor in which the base region 19 is formed is merged by the base region 19, while the second and fifth leakage prevention regions 66 and 69 are left in the region in which the base region 19 is not formed. In the vertical NPN transistor, the base region 18 is formed so as to be connected to the first and fourth leakage prevention layers 65 and 68. After that, the thermal oxide film 61 is removed by wet etching and then the gate oxide film 21 having a thickness of 20 nm is formed over the entire surface. Then, the gate oxide film 21 lying on the surface of the base region 18 of the vertical NPN transistor is removed by wet etching using a resist pattern as a mask, followed by the deposition of a polysilicon film to a thickness of 300 nm. Thereafter, arsenic is introduced into the polysilicon film by ion implantation under the conditions of 60 keV, $1\times10^{16}/\text{cm}^2$, thereby turning the polysilicon film into N⁺-type. The resulting N⁺-type polysilicon film is then subjected to etching using a resist pattern as a mask, thereby forming the N⁺-type polysilicon film 22 serving as a part of the emitter electrode for the vertical NPN transistor and the N⁺-type gate polysilicon film 23 serving as the gate electrode for the N-channel MOS transistor. In this case, the N⁺-type polysilicon film 22 is formed to have a striped structure in the vertical NPN transistor region and the base region 18 (see FIG. 6A) is etched to a point deeper than that of the emitter region 25 (see FIG. 31).

Figure 31:
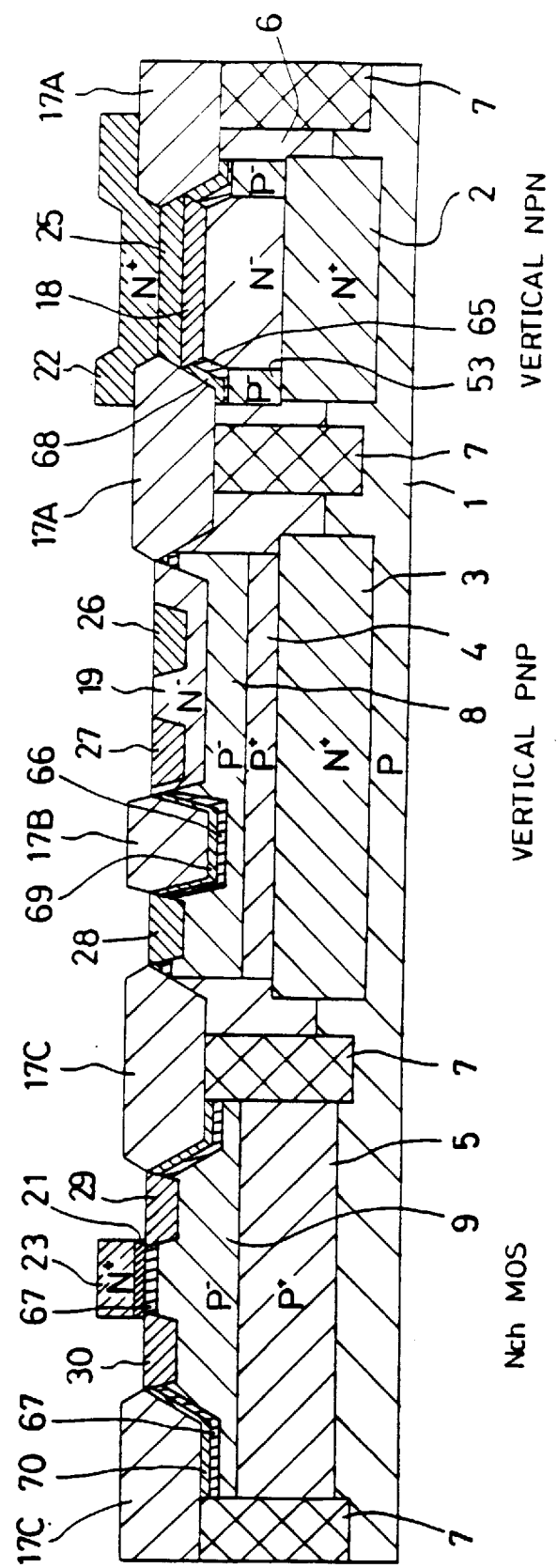

Next, as shown in FIG. 31, arsenic is introduced into the N⁺-type gate polysilicon film 23, future collector contact region of the vertical NPN transistor, base contact region of the vertical PNP transistor, and future source and drain regions of the N-channel MOS transistor by ion implantation under the conditions of 40 keV, $6\times10^{15}/\text{cm}^2$, using a resist pattern as a mask. On the other hand, boron is introduced into the future base contact region of the vertical NPN transistor and into the future emitter region and collector contact region of the vertical PNP transistor by ion implantation under the conditions of 20 keV, $3\times10^{15}/\text{cm}^2$. Subsequently, a heat treatment is performed at a temperature of 900° C. for about 30 minutes so as to diffuse the arsenic from the N⁺-type gate polysilicon film 23, thereby forming: the emitter region 25, collector contact region 40, and base contact region 41 for the vertical NPN transistor; the emitter region 26, base contact region 27, and collector contact region 28 for the vertical PNP transistor; and the drain region 29 and source region 30 for the N-channel MOS transistor.

Figure 32:
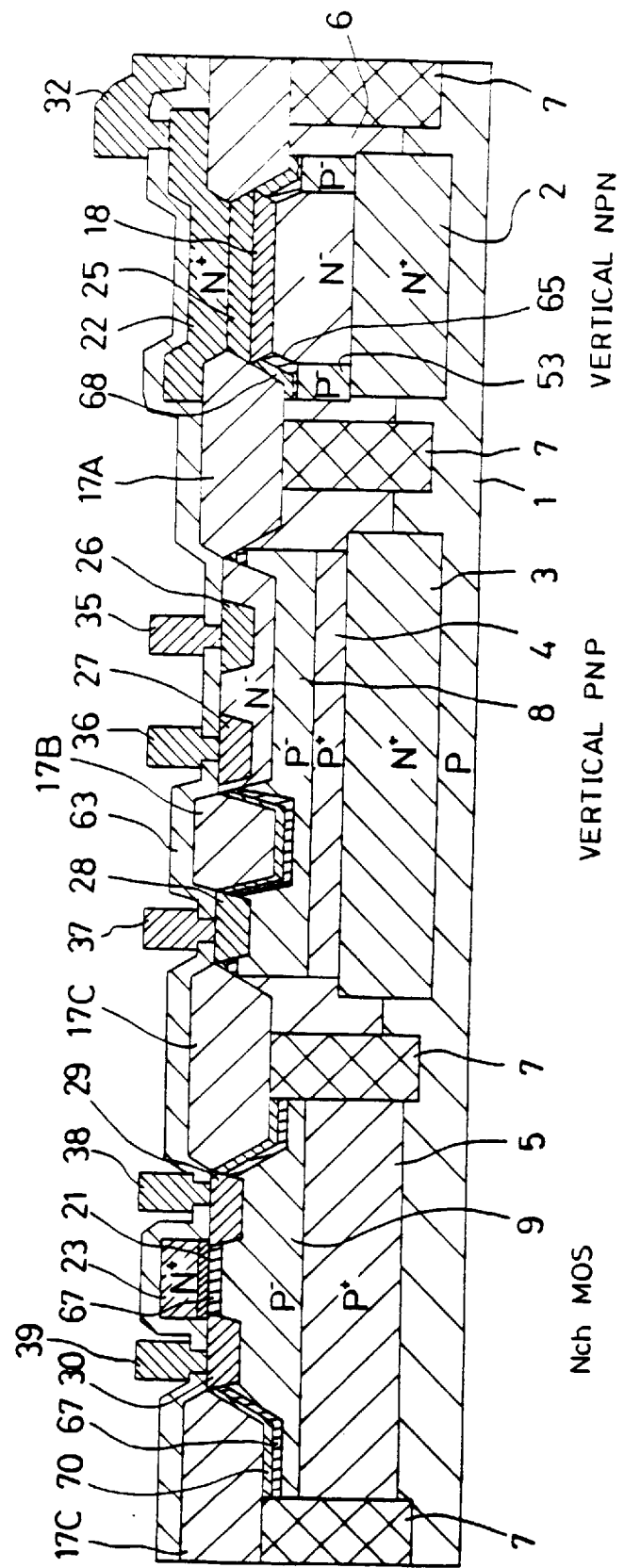

Next, as shown in FIG. 32, the SiO₂ film 63 is deposited to a thickness of 500 nm by CVD, followed by the formation of: the emitter electrode 32, base electrode (not shown), and collector electrode (not shown) of the vertical NPN transistor; the emitter electrode 35, base electrode 36, and collector electrode 37 of the vertical PNP transistor; and the drain electrode 38 and source electrode 39 of the N-channel MOS transistor, using aluminium or other material.

As described above, according to the fourth embodiment, the impurity concentration of the intrinsic collector region (P⁻-type collector region 8) of the collector region of the vertical PNP transistor can be decreased, while the impurity concentration of the region closest to the surface of the collector region (second leakage prevention layer 66) of the vertical PNP transistor can solely be increased, using only one mask for defining the collector region, similarly to the third embodiment. Moreover, it is also possible according to the fourth embodiment, to selectively form high-impurity concentration layers (second and fifth leakage prevention layers 66 and 69) only in that region of the P⁻-type collector region 8 which is positioned immediately below the thermal oxide film 17B, which is easily lowered in concentration. Accordingly, the fourth embodiment exerts the following effects that: (1) high-speed performance is realized due to the small capacitance between the collector region and base region; (2) the generation of a leakage current in the surface region of the P⁻-type collector region 8 can be reduced because the lowering of impurity concentration at the interfaces of the P⁻-type collector region 8 with the thermal oxide film 17B and with the SiO₂ film 63 can be prevented; (3) the concentrations of the second and fifth leakage prevention layers 66 and 69 can be controlled based on the thickness of the thermal oxide film 17B; and (4) lower cost is realized because the P⁻-type collector region 8, second leakage prevention layer 66, and fifth leakage prevention layer 69 can be formed using only one mask for defining the collector region.

Furthermore, according to the fourth embodiment, it is possible to simultaneously form: the first and fourth leakage prevention layers 65 and 68 for preventing the generation of a leakage current between the emitter region 25 and collector region 2 of the vertical NPN transistor of walled-emitter type, which are similar to the leakage prevention layer used in the first embodiment; the second and fifth leakage prevention layers 66 and 69 formed at the interfaces of the P⁻-type collector region 8 of the vertical PNP transistor with the thermal oxide film 17B and with the SiO₂ film 63 so as to prevent an interfacial leakage; and the third and sixth leakage prevention layers 67 and 70 serving as channel stoppers for the isolation regions of the N-channel MOS transistor. Thus, according to the fourth embodiment, a BiCMOS semiconductor apparatus with various added values can be formed at lower cost without increasing the manufacturing steps.

Although the semiconductor apparatus according to the fourth embodiment has the vertical NPN transistor, vertical PNP transistor, and N-channel MOS transistor, the same effects can be obtained provided that it has at least two of the above three transistors.

(Fifth Embodiment)

Below, a method of manufacturing a semiconductor apparatus according to a fifth embodiment of the present invention will be described with reference to FIGS. 33 to 40. The semiconductor apparatus according to the fifth embodiment comprises the N-channel MOS transistor, vertical PNP transistor and vertical NPN transistor of walled-emitter type. As for the vertical NPN transistor, it corresponds to the cross section taken along the line I—I of FIG. 1A.

Figure 33:
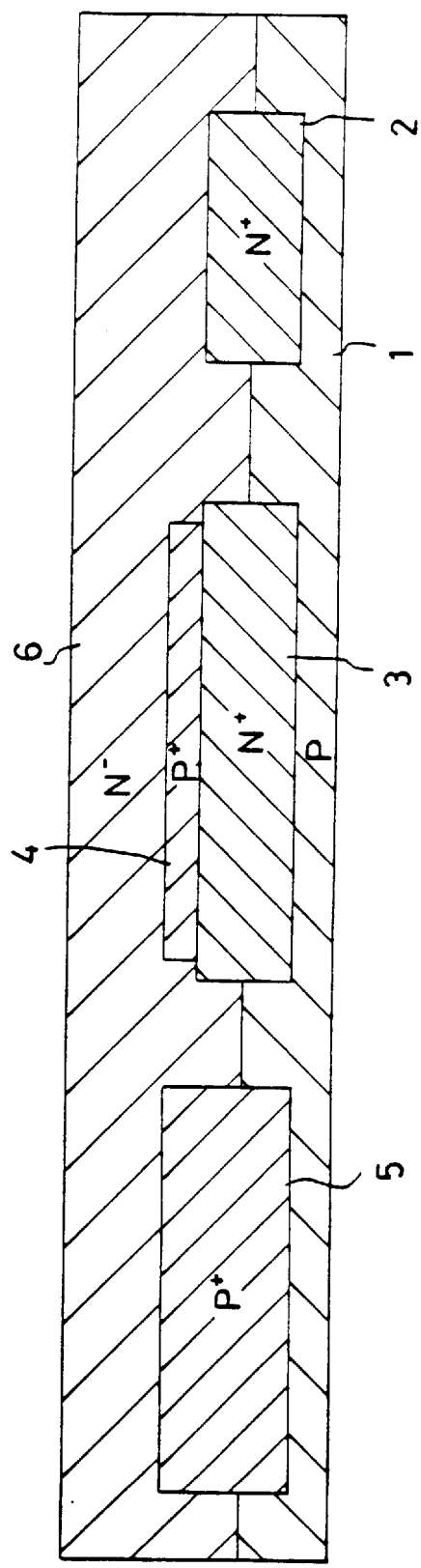
FIGS. 33 to 40 are cross sections illustrating the individual steps of the method of manufacturing a semiconductor apparatus according to a fifth embodiment of the present invention.

First, as shown in FIG. 33, arsenic is introduced into the P-type semiconductor substrate 1 having a resistivity of 10 to 20 Ω.cm by ion implantation under the conditions of 60 keV, $1\times10^{15}/\text{cm}^2$, using a resist as a mask. The semiconductor substrate 1 is then subjected to a heat treatment at a temperature of 900° C. for about 30 minutes, thereby forming the N⁺-type isolation layer 3, composed of an N⁺-type diffusion layer, for isolating the N⁺-type collector region 2 of the vertical NPN transistor and the collector region of the vertical PNP transistor from the semiconductor substrate 1. Thereafter, boron is introduced by ion implantation under the conditions of 40 keV, $1\times10^{14}/\text{cm}^2$ using a resist pattern as a mask. Subsequently, a heat treatment is performed at a temperature of 900° C. for about 30 minutes, thereby forming the P⁺-type collector region 4 for the vertical PNP transistor and the P$^+$-type buried layer 5 serving as the substrate for the N-channel MOS transistor, each of which is composed of a P$^+$-type diffusion layer. After that, the N$^-$-type epitaxial layer 6 having a resistivity of 1 Ω.cm and a thickness of 1.5 μm is formed on the semiconductor substrate 1.

Figure 34:
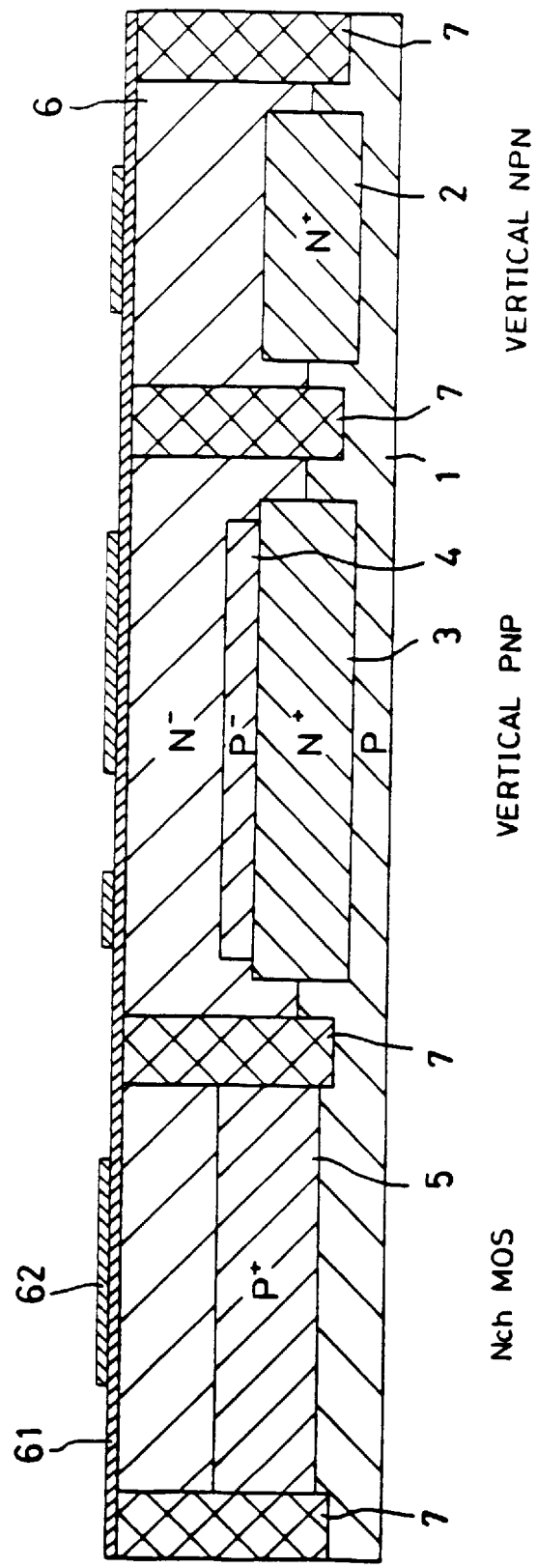

Next, as shown in FIG. 34, a trench is formed in the isolation region using a resist pattern as a mask, followed by the deposition of an oxide film, so that the CVD buried oxide film 7 for isolation is formed only in the trench by etchback. Thereafter, the thermal oxide film 61 is grown to a thickness of 50 nm on the surface of the N$^-$-type epitaxial layer 6, and then a first silicon nitride film 62 is grown to a thickness of 120 nm on the thermal oxide film 61. Subsequently, using a resist pattern as a mask, the first silicon nitride film 62 is etched away except for the region corresponding to the active region in which the oxide film for isolation is to be formed.

Figure 35:
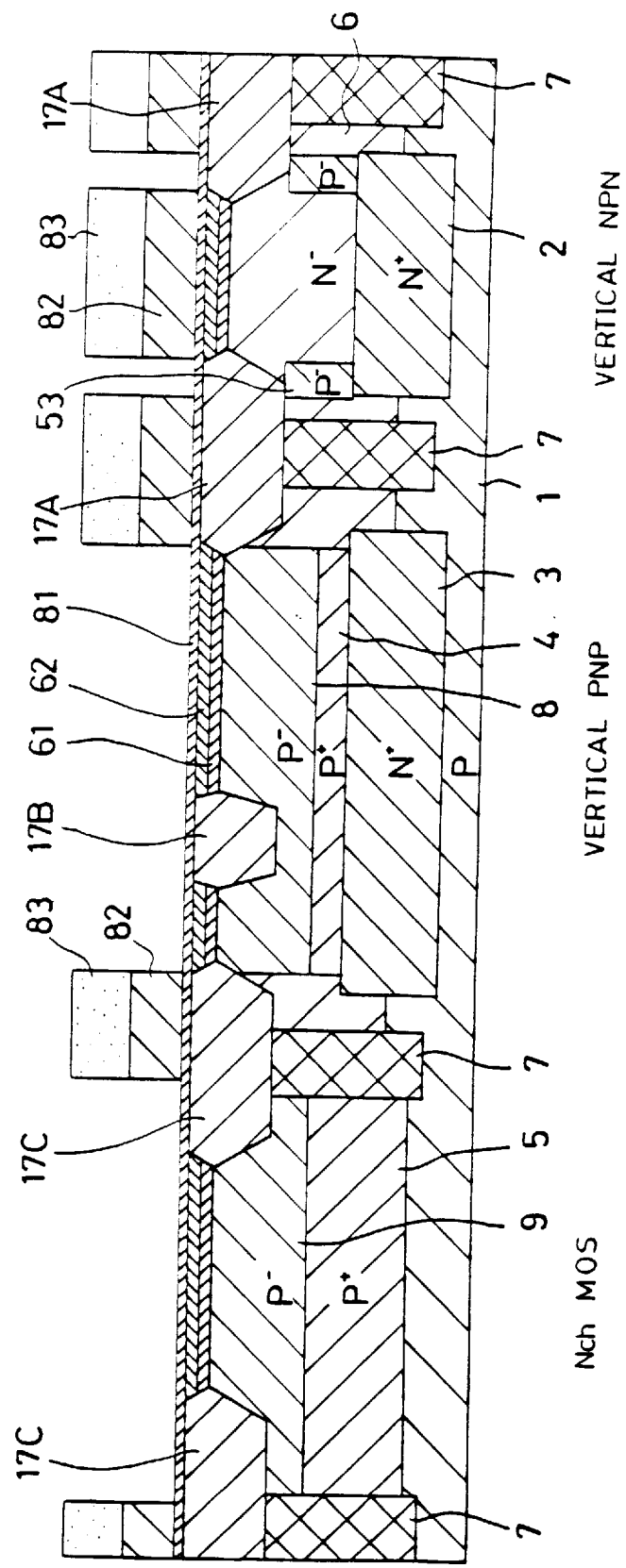

Next, as shown in FIG. 35, a selective oxidation process is performed at a temperature of 1000° C., using the first silicon nitride film 62 as a mask, thereby forming the thermal oxide films 17A, 17B, and 17C to a thickness of 300 nm. Thereafter, a second silicon nitride film 81 is deposited to a thickness of 30 nm over the entire surface, and then the SiO$_2$ film 82 is deposited to a thickness of 500 nm by CVD. Then, the SiO$_2$ film 82 on the region equivalent to the first leakage prevention layer 14 of the second embodiment (see FIG. 11), on the P$^-$-type collector region 8 of the vertical PNP transistor, and on the P$^-$-type well region 9 of the N-channel MOS transistor is etched away, using the resist pattern 83 as a mask. Thereafter, boron is introduced by ion implantation under the conditions of 180 keV, 4×10$^{12}$/cm$^2$. Subsequently, a heat treatment is performed at a temperature of 1100° C. for about 150 minutes, thereby forming the P$^-$-type well layer 53 serving as a part of the leakage prevention layer for the vertical NPN transistor, the P$^-$-type collector region 8 composed of a P$^-$-type well layer for the vertical PNP transistor, and the P$^-$-type well region 9 for the N-channel MOS transistor.

Figure 36:
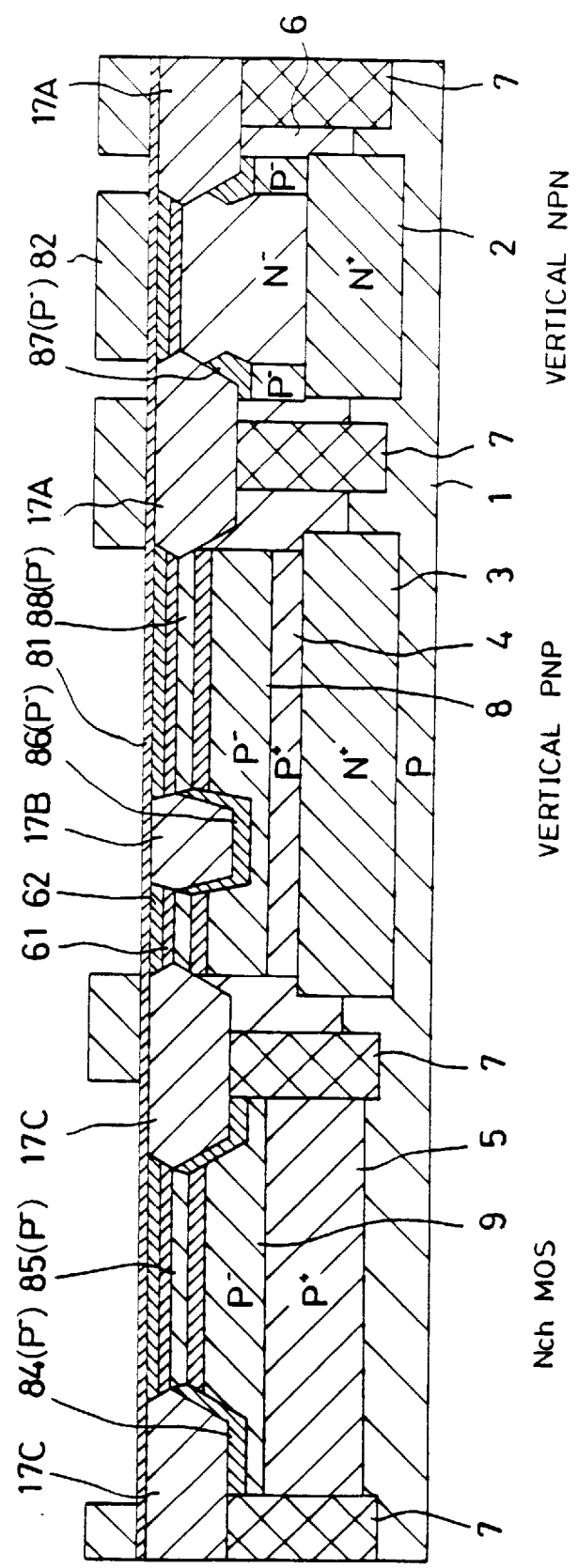

Next, as shown in FIG. 36, boron is introduced by ion implantation under the conditions of 180 keV, 4×10$^{12}$/cm$^2$ using the SiO$_2$ film 82 as a mask, thereby forming: on the P$^-$-type well layer 53, a first leakage prevention layer 87 composed of a P$^-$-type diffusion layer so as to prevent the generation of a leakage current between the emitter region and collector region of the vertical NPN transistor; on the surface of the P$^-$-type collector region 8 of the vertical PNP transistor, a second leakage prevention diffusion layer 86 composed of a P$^-$-type diffusion layer; and in the active region and isolation region of the N-channel MOS transistor, a third leakage prevention diffusion layer 84 composed of a P$^-$-type diffusion layer so as to serve as a P$^-$-type channel doped layer as well as channel stopper. Subsequently, boron is introduced by ion implantation under the conditions of 130 keV, 2×10$^{12}$/cm$^2$, using the SiO$_2$ film 82 and thermal oxide films 17A, 17B, and 17C as masks, thereby forming a fourth leakage prevention layer 88 composed of a P$^-$-type diffusion layer in the surface region of the P$^-$-type collector region 8 of the vertical PNP transistor and the P$^-$-type channel doped layer 85 in the active region of the N-channel MOS transistor. The sequence of the ion implantation of boron with 180 keV and the ion implantation of boron with 130 keV may be reversed.

Figure 37:
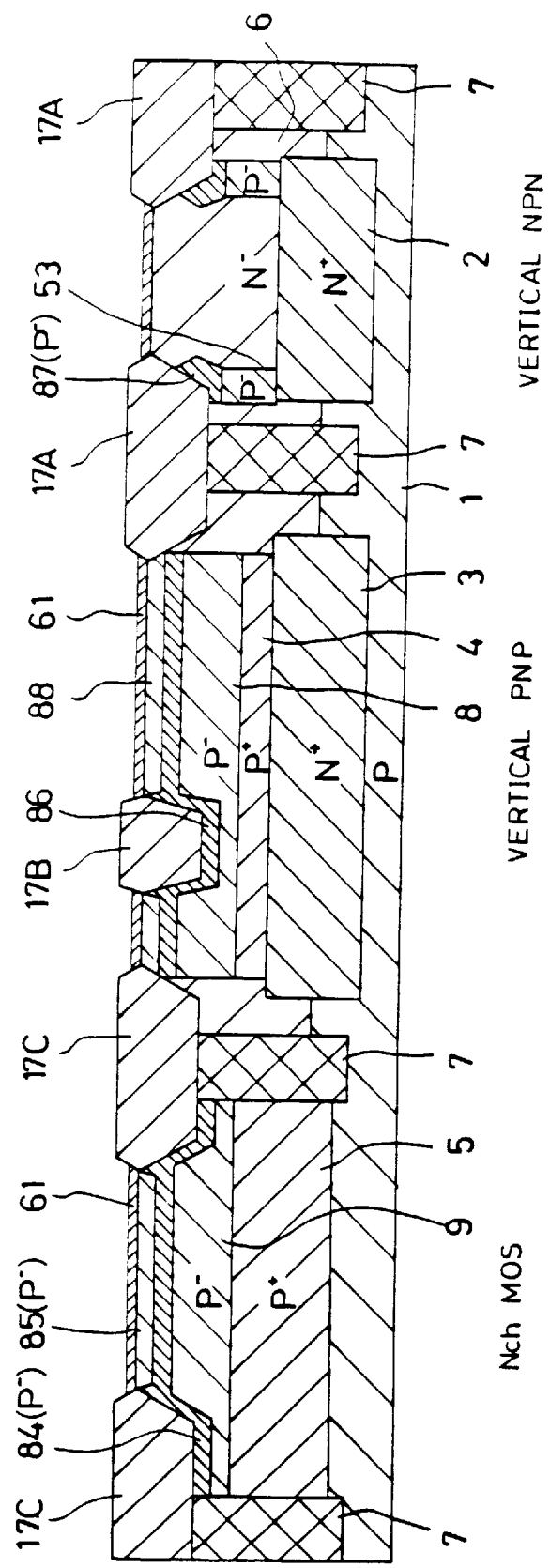

Next, as shown in FIG. 37, the SiO$_2$ film 82 is removed, and then the first and second silicon nitride films 62 and 81 are removed by wet etching.

Figure 38:
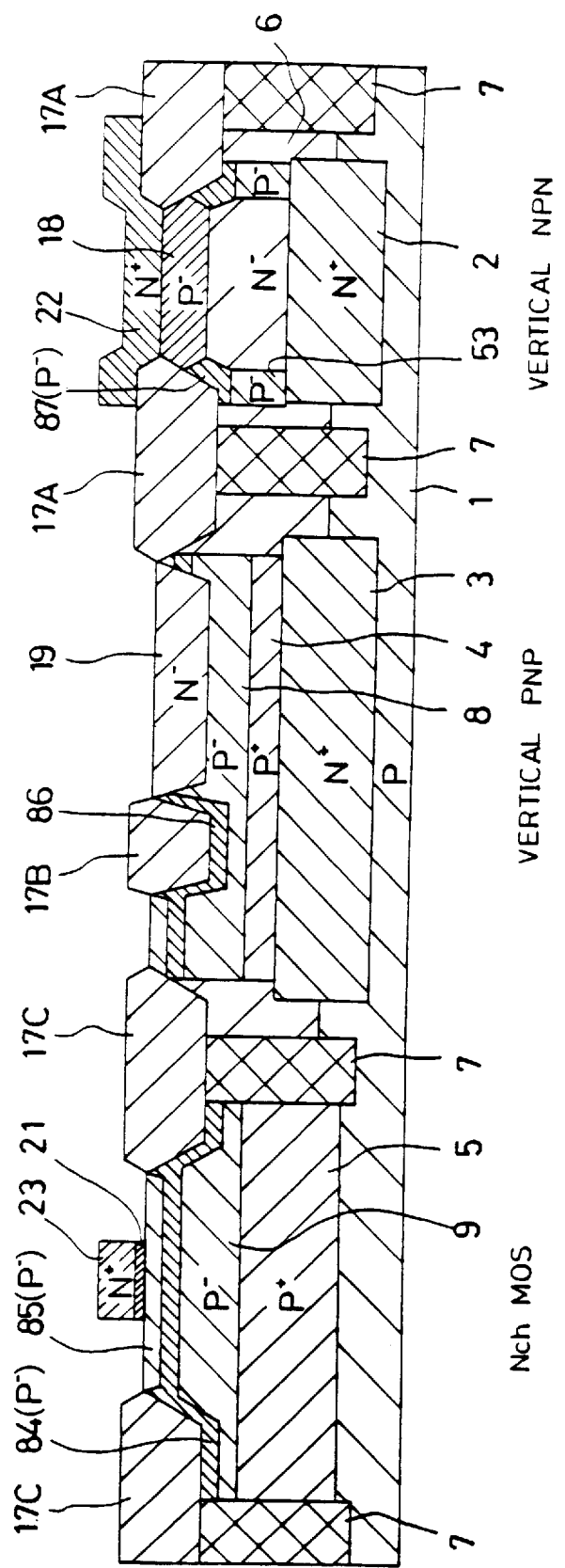

Next, as shown in FIG. 38, boron is introduced by ion implantation under the conditions of 30 keV, 2×10$^{13}$/cm$^2$ using a resist pattern as a mask, while phosphorus is introduced by ion implantation under the conditions of 80 keV, 3×10$^{13}$/cm$^2$ using a resist pattern as a mask. Subsequently, a heat treatment is performed at a temperature of 900° C. for about 30 minutes, thereby forming the base region 18 composed of a P$^-$-type diffusion layer for the vertical NPN transistor and the base region 19 composed of an N$^-$-type diffusion layer for the vertical PNP transistor. In this case, those regions of the second and fourth leakage prevention layers 86 and 88 formed in the surface region of the P$^-$-type collector region 8 of the vertical PNP transistor in which the base region 19 is formed is merged by the base region 19, while the second leakage prevention region 86 is left in the region in which the base region 19 is not formed. The base region 18 is formed so as to be connected to the first leakage prevention layer 87 of the vertical NPN transistor. After that, the thermal oxide film 61 is removed by wet etching and then the gate oxide film 21 having a thickness of 20 nm is formed over the entire surface. Then the gate oxide film 21 on the surface of the base region 18 of the vertical NPN transistor is removed by wet etching, using a resist pattern as a mask, followed by the deposition of a polysilicon film to a thickness of 300 nm. Thereafter, arsenic is introduced into the polysilicon film by ion implantation under the conditions of 60 keV, 1×10$^{16}$/cm$^2$, thereby turning the polysilicon film into N$^+$-type. The resulting N$^+$-type polysilicon film is then subjected to etching using a resist pattern as a mask, thereby forming the N$^+$-type polysilicon film 22 serving as a part of the emitter electrode for the vertical NPN transistor and the N$^+$-type gate polysilicon film 23 serving as the gate electrode for the N-channel MOS transistor. In this case, the N$^+$-type polysilicon film 22 is formed to have a striped structure in the vertical NPN transistor region and the base region 18 (see FIG. 6A) is etched to a point deeper than that of the emitter region 25 (see FIG. 39).

Figure 39:
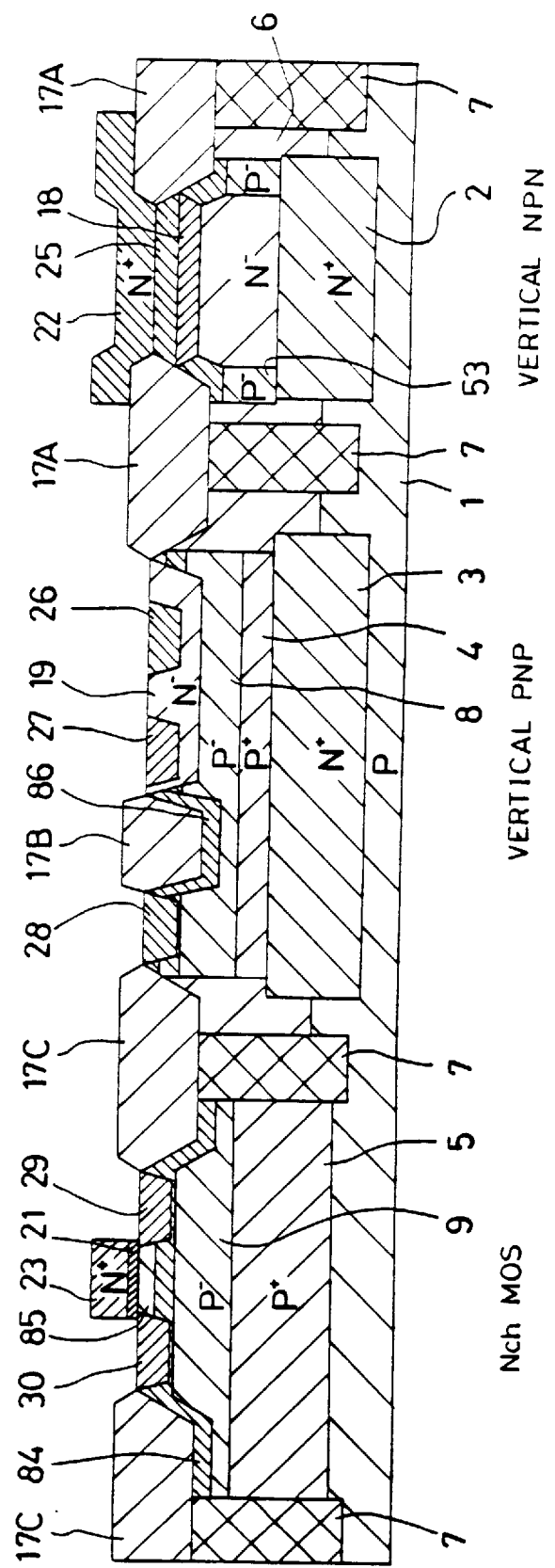

Next, as shown in FIG. 39, arsenic is introduced into the N$^+$-type gate polysilicon film 23, future collector contact region of the vertical NPN transistor, base contact region of the vertical PNP transistor, and future source and drain regions of the N-channel MOS transistor by ion implantation under the conditions of 40 keV, 6×10$^{15}$/cm$^2$, using a resist pattern as a mask. On the other hand, boron is introduced into the future base contact region of the vertical NPN transistor and into the future emitter region and collector contact region of the vertical PNP transistor by ion implantation under the conditions of 20 keV, 3×10$^{15}$/cm$^2$, using a resist pattern as a mask. Subsequently, a heat treatment is performed at a temperature of 900° C. for about 30 minutes so as to diffuse the arsenic from the N$^+$-type gate polysilicon film 23, thereby forming: the emitter region 25, collector contact region 40, and base contact region 41 for the vertical NPN transistor; the emitter region 26, base contact region 27, and collector contact region 28 for the vertical PNP transistor; and the drain region 29 and source region 30 for the N-channel MOS transistor.

Figure 40:
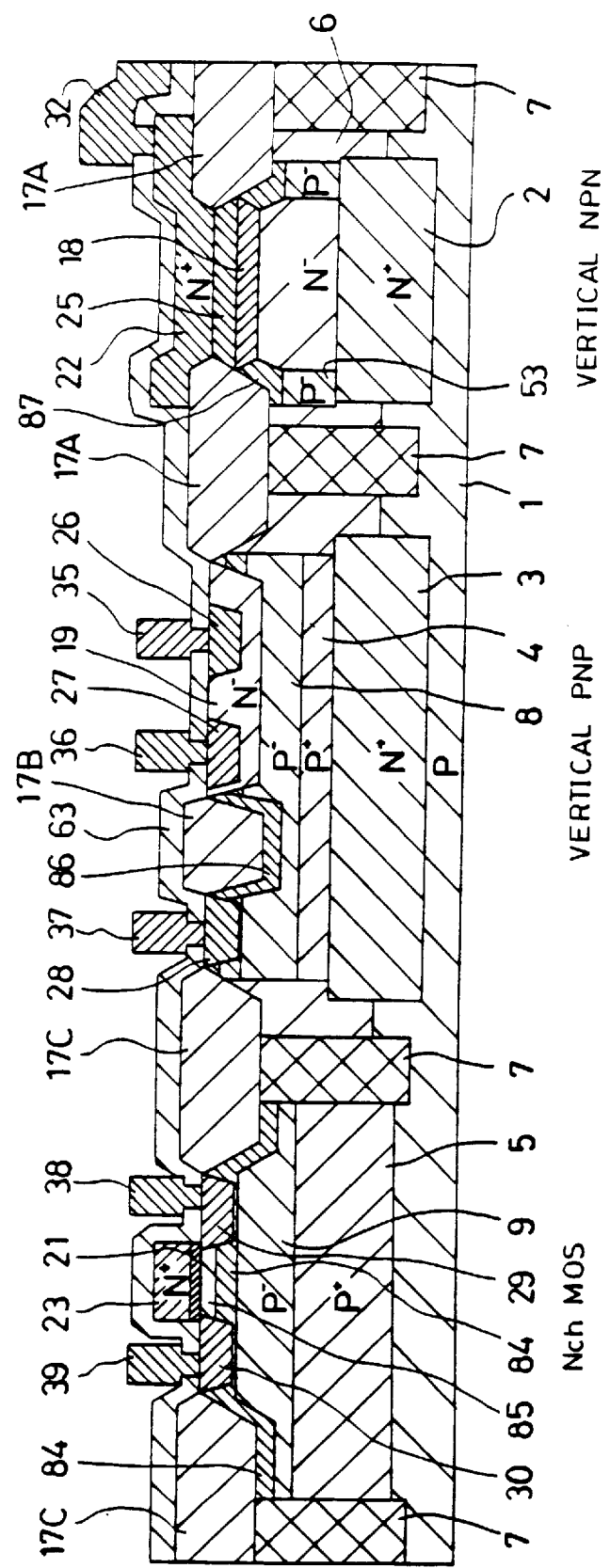

Next, as shown in FIG. 40, the SiO$_2$ film 63 is deposited to a thickness of 500 nm by CVD, followed by the formation of: the emitter electrode 32, base electrode (not shown), and collector electrode (not shown) of the vertical NPN transistor; the emitter electrode 35, base electrode 36, and collector electrode 37 of the vertical PNP transistor; and the drain electrode 38 and source electrode 39 of the N-channel MOS transistor, using aluminium or other material.

As described above, according to the fifth embodiment, the impurity concentration of the intrinsic collector region (P$^-$-type collector region 8) of the collector region of the vertical PNP transistor can be decreased, while the impurity concentration of the region closest to the surface of the collector region of the vertical PNP transistor (second leakage prevention layer 86) can solely be increased, using only one mask for defining the collector region, similarly to the fourth embodiment. Moreover, it is also possible, according to the fifth embodiment, to selectively form a high-impurity concentration layer (second leakage prevention layer 86) only in that region of the P$^-$-type collector region 8 which is positioned immediately below the thermal oxide film 17B and SiO$_2$ film 63, which is easily lowered in impurity concentration. Furthermore, since the above process is performed after the formation of the thick thermal oxide film 17B for isolation, the second leakage prevention layer 86 is not exposed to high heat, so that the extent of diffusion can be minimized. Accordingly, compared with the fourth embodiment, the fifth embodiment exerts the following effects that: (1) high-speed performance is realized due to the small capacitance between the collector region and base region; (2) the generation of a leakage current in the surface region of the P$^-$-type collector region 8 can be prevented completely because the lowering of impurity concentration at the interfaces of the P$^-$-type collector region 8 with the thermal oxide film 17B and with the SiO$_2$ film 63 can be prevented: (3) the impurity concentration of the second leakage prevention layer 86 can be controlled based on the thickness of the thermal oxide film 17B and the generation of a leakage current can be prevented by introducing a small amount of impurity by ion implantation: and (4) lower cost is realized because the P$^-$-type collector region 8 can be formed using only one mask for defining the collector region.

Furthermore, according to the fifth embodiment, it is possible to simultaneously form: the first leakage prevention layer 87 for preventing the generation of a leakage current between the emitter region 25 and collector region 2 of the vertical NPN transistor of walled-emitter type, which is similar to the leakage prevention layer used in the first embodiment; the second leakage prevention layer 86 formed at the interfaces of the P$^-$-type collector region 8 of the vertical PNP transistor with the thermal oxide film 17B and with the SiO$_2$ film 63 so as to prevent an interfacial leakage; and the third leakage prevention layer 84 serving as a channel stopper for the isolation region of the N-channel MOS transistor. Thus, according to the fifth embodiment, a BiCMOS semiconductor apparatus with various added values can be formed at lower cost without increasing the manufacturing steps.

Moreover, in the N-channel MOS transistor, since the heat used in the heat treatment after doping the channel can be significantly reduced, the formation of a punch-through stopper is also possible, which enables higher performance and further miniaturization.

Although the P$^-$-type leakage prevention diffusion layer 84, which also serves as the P$^-$-type punch-through stopper layer, and the P$^-$-type channel doped layer 85 of the N-channel MOS transistor are individually formed in the different implantation processes in the fifth embodiment, they may be formed in a single implantation process by optimizing the implantation energy and dose.

Although the semiconductor apparatus according to the fifth embodiment has the vertical NPN transistor, vertical PNP transistor, and N-channel MOS transistor, the same effects can be obtained provided that it has at least two of the above three transistors.

(Sixth Embodiment)

Below, a method for manufacturing a semiconductor apparatus according to a sixth embodiment of the present invention will be described with reference to FIGS. 43A to 43E.

Figure 43A:
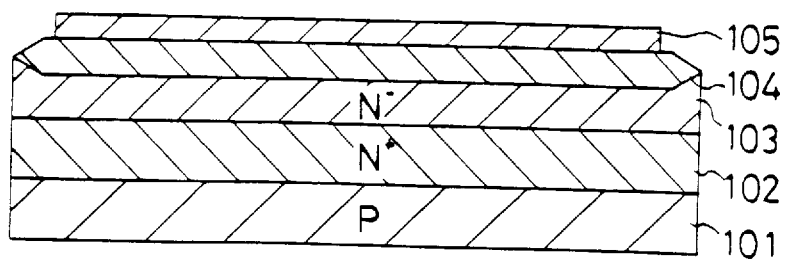
FIGS. 43A to 43E are cross sections illustrating the individual steps of the method of manufacturing a semiconductor apparatus according to a sixth embodiment of the present invention.

As shown in FIG. 43A, arsenic is introduced into a P-type semiconductor substrate 101 having a resistivity of, e.g., 10 to 20 Ω.cm by ion implantation under the conditions of 60 keV, $1 \times 10^{15}/\text{cm}^2$. The semiconductor substrate 101 is then subjected to a heat treatment at a temperature of 900° C. for about 30 minutes, thereby forming an N$^+$-type buried layer 102 and an N$^-$-type epitaxial layer 103 having a resistivity of 1 Ω.cm and a thickness of 2.5 $\mu$m. Thereafter, a selective oxidation process is performed by using, e.g., a silicon nitride film (not shown), thereby forming a thermal oxide film 104 having a thickness of 600 nm. After that, a CVD-polysilicon film is deposited to a thickness of 400 nm on the thermal oxide film 104, so that the CVD-polysilicon film is patterned. Subsequently, arsenic is introduced into the CVD-polysilicon film under the conditions of 40 keV, $8 \times 10^{15}/\text{cm}^2$, followed by a heat treatment at 900° C. for about 30 minutes, thereby forming an N$^+$-type polysilicon film 105 serving as the lower electrode region of a capacitor.

Figure 43B:
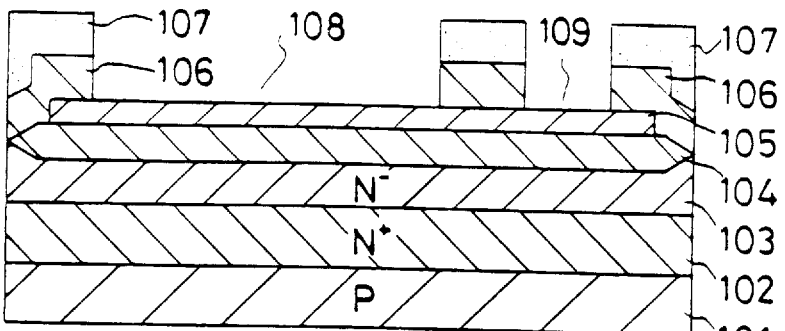

Next, as shown in FIG. 43B, a CVD-SiO$_2$ film 106 serving as a first insulating film is deposited to a thickness of 500 nm on the N$^+$-type polysilicon film 105, and then a first resist pattern 107 (photomask C) is formed on the CVD-SiO$_2$ film 106. Subsequently, anisotropic dry etching is performed using the first resist pattern 107, thereby selectively removing the CVD-SiO$_2$ 106, so as to form a capacitor insulating film formation region 108 as a first opening and a contact region 109 for the lower capacitor electrode as a second opening.

Figure 43C:
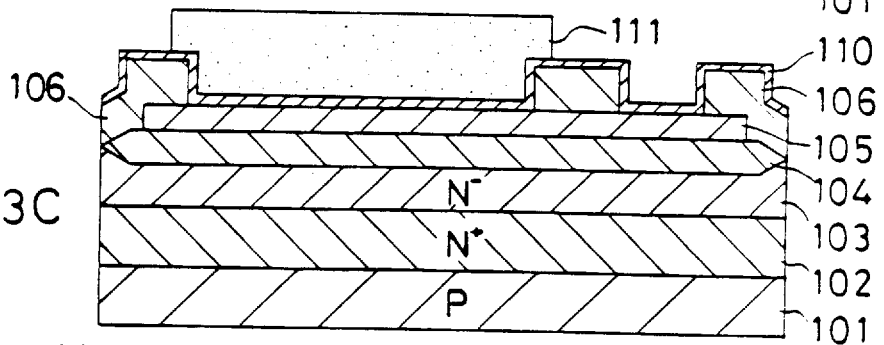

Next, as shown in FIG. 43C, a silicon nitride film 110 serving as a second insulating film, i.e., a capacitor insulating film, is deposited to a thickness of 50 nm on the N$^+$-type polysilicon film 105. After that, a second resist pattern 111 (photomask C2) is formed in the region in which the silicon nitride film 110 is left.

Figure 43D:
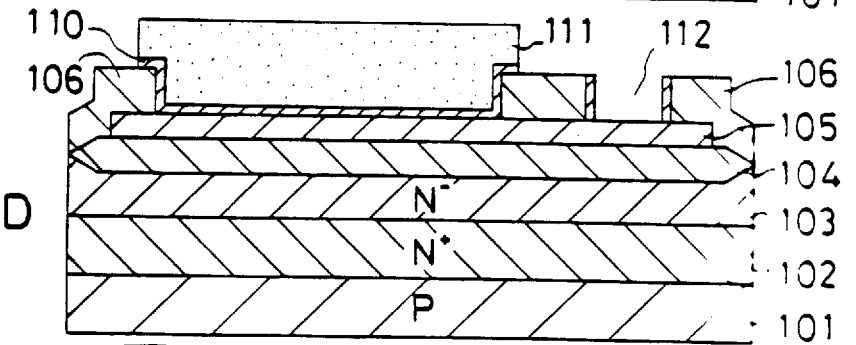

Next, as shown in FIG. 43D, the silicon nitride film 110 is subjected to etching using the second resist pattern 111 as a mask, so as to remove the silicon nitride film 110 except for the portion underlying the second resist pattern 111 and for the side walls of the contact region 109 for the lower capacitor electrode, thereby forming a contact hole 112 for the lower capacitor electrode having side walls composed of the silicon nitride film 110.

Figure 43E:
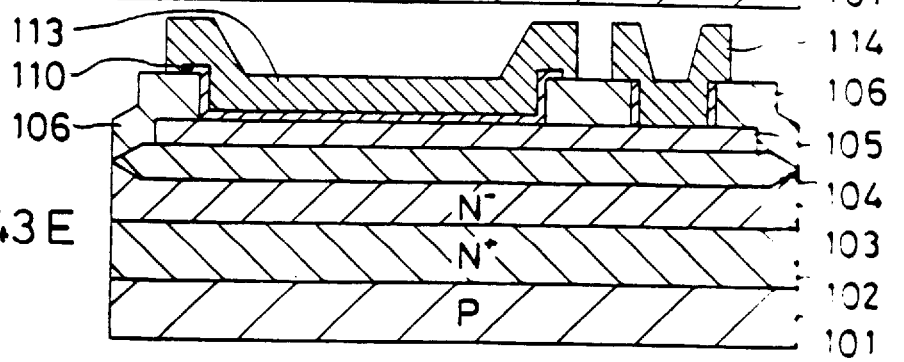

Next, as shown in FIG. 43E, an upper capacitor electrode 113 and the lower capacitor electrode 114 are formed by a normal wiring process using aluminium, thereby completing the capacitor. Alternatively, the bipolar transistor can be formed in a conventional manner, simultaneously with the formation of the capacitor.

As described above, the sixth embodiment is characterized in that the capacitor insulating film formation region 108 and contact region 109 for the lower capacitor electrode are simultaneously formed by the etching operation using the first resist pattern 107 and that the silicon nitride film 110 is left on the side walls of the contact region 109 for the lower capacitor electrode by the etching operation using the second resist pattern 111.

Thus, in the process of forming the capacitor, the sixth embodiment requires only two steps of forming resist patterns (using photomasks CW and C2), whereas the conventional manufacturing method has required three steps of forming resist patterns (using photomasks C1, C2, and CW)

between the formation of the N⁺-type polysilicon film 105 serving as the lower capacitor electrode and the formation of the contact region 109 for the lower capacitor electrode. Consequently, compared to the prior art, the number of steps required for manufacturing a semiconductor apparatus can be reduced and manufacturing cost can also be reduced.

Moreover, since the silicon nitride film 110 partly remains only on the side walls of the contact region 109 for the lower capacitor electrode, overhang is not generated due to the wet etching performed with respect to the $SiO_2$ film prior to the deposition of aluminium, so that the breakage of aluminium wires never occurs in the sixth embodiment.

(Seventh Embodiment)

Figure 44:
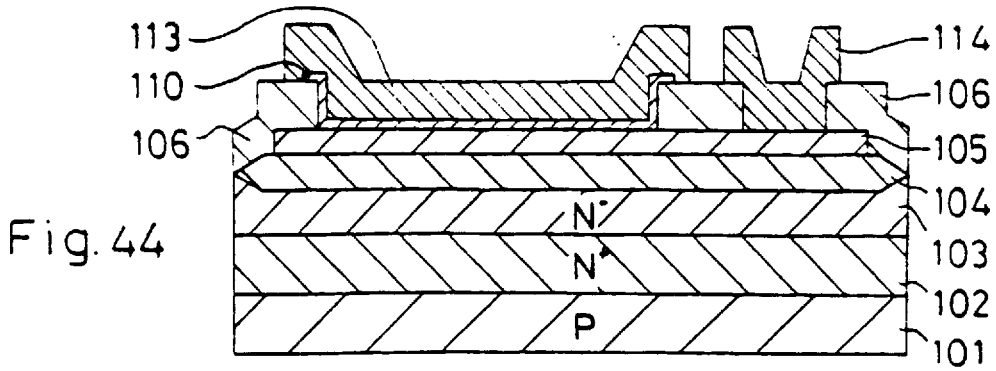
FIG. 44 is a cross section showing the individual steps of the method of manufacturing a semiconductor apparatus according to a seventh embodiment of the present invention.

Below, a method of manufacturing a semiconductor apparatus according to a seventh embodiment of the present invention will be described with reference to FIG. 44.

Since the individual steps of the sixth embodiment, which have been described with reference to FIGS. 43A to 43C, are also applicable to the seventh embodiment, the description of common steps will be omitted here.

As shown in FIG. 43C, the sixth embodiment performed the anisotropic dry etching with respect to the silicon nitride film 110 using the second resist pattern 111 as a mask. Instead, the seventh embodiment performs isotropic dry etching with respect to the silicon nitride film 110 using the second resist pattern 111 as a mask, thereby removing the silicon nitride film 110 except for the portion underlying the second resist pattern 111. Hence, it becomes possible to form the contact hole 112 for the lower capacitor electrode which has no side walls composed of the silicon nitride film 110, as shown in FIG. 44.

Next, the upper capacitor electrode 113 and lower capacitor electrode 114 are formed by the normal wiring process using aluminium, thereby completing the capacitor. Alternatively, the bipolar transistor can be formed in the conventional manner, simultaneously with the formation of the capacitor.

As described above, the seventh embodiment is characterized in that the capacitor insulating film formation region 108 and the contact region 109 for the lower capacitor electrode are simultaneously formed by the etching operation using the first resist pattern 107 and that the silicon nitride film 110 is removed by the etching operation using the second resist pattern 111, except for the portion corresponding to the upper capacitor electrode 113.

Thus, in the process of forming the capacitor, the seventh embodiment requires only two steps of forming resist patterns (using photomasks CW and C2), whereas the conventional manufacturing method has required three steps of forming resist patterns (using photomasks C1, C2, and CW) between the formation of the N⁺-type polysilicon film 105 serving as the lower capacitor electrode and the formation of the contact region 109 for the lower capacitor electrode. Consequently, compared to the prior art, the number of steps required for manufacturing a semiconductor apparatus can be reduced and manufacturing cost can also be reduced.

Moreover, since the silicon nitride film 110 remains only on the upper capacitor electrode 113, the overhang or vertical projection of the silicon nitride film 110 is not generated in the contact region 109 for the lower capacitor electrode due to the wet etching performed with respect to the $SiO_2$ film prior to the deposition of aluminium, so that the breakage of aluminium wires never occurs in the seventh embodiment.

(Eighth Embodiment)

Below, a method of manufacturing a semiconductor apparatus according to an eighth embodiment of the present invention will be described with reference to FIGS. 45A to 45E.

Figure 45A:
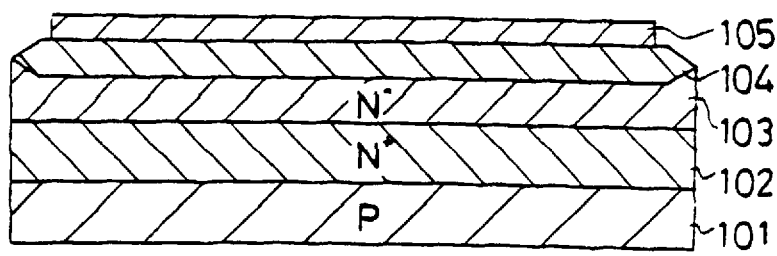
FIGS. 45A to 45E are cross sections illustrating the individual steps of the method of manufacturing a semiconductor apparatus according to an eighth embodiment of the present invention.

As shown in FIG. 45A, arsenic is introduced into the P-type semiconductor substrate 101 having a resistivity of, e.g., 10 to 20 Ω.cm by ion implantation under the conditions of 60 keV, $1\times10^{15}/cm^2$. Then, a heat treatment is performed at a temperature of 900° C. for about 30 minutes, thereby forming an N⁺-type buried layer 102 and an N⁻-type epitaxial layer 103 having a resistivity of about 1 Ω.cm and a thickness of about 2.5 μm. Thereafter, a selective oxidation process is performed by using, e.g., a silicon nitride film (not shown), thereby forming a thermal oxide film 104 having a thickness of 600 nm. After that, a CVD-polysilicon film is deposited to a thickness of 400 nm on the thermal oxide film 104, so that the CVD-polysilicon film is patterned. Subsequently, arsenic is introduced into the CVD-polysilicon film by ion implantation under the conditions of 40 keV, $8\times10^{15}/cm^2$, followed by a heat treatment at 900° C. for about 30 minutes, thereby forming the N⁺-type polysilicon film 105 serving as the lower electrode region of the capacitor.

Figure 45B:
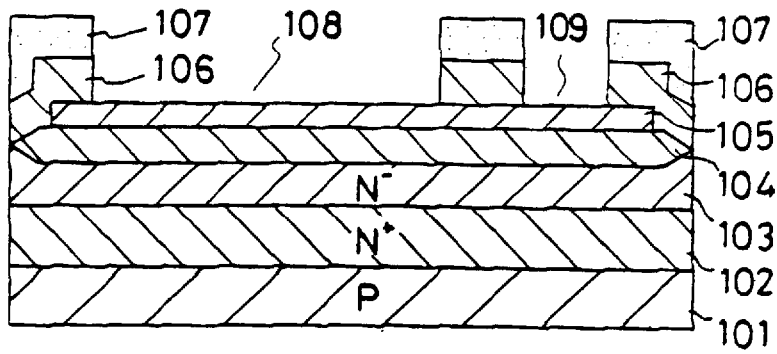

Next, as shown in FIG. 45B, a CVD-$SiO_2$ film 106 is deposited to a thickness of 500 nm on the N⁺-type polysilicon film 105, and then a first resist pattern 107 (photomask CW) is formed on the CVD-$SiO_2$ film 106. Subsequently, the CVD-$SiO_2$ film 106 is subjected to anisotropic dry etching using the first resist pattern 107, thereby selectively removing the CVD-$SiO_2$ 106, so as to form the capacitor insulating film formation region 108 as a first opening and the contact region 109 for the lower capacitor electrode as a second opening.

Figure 45C:
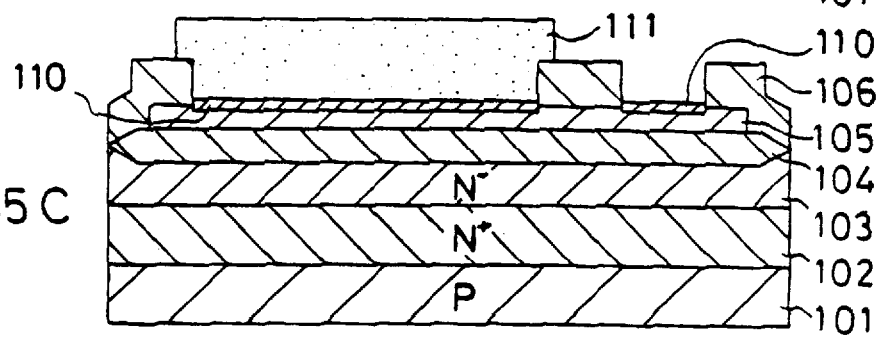

Next, as shown in FIG. 45C, a silicon nitride film 110 is formed by silicon nitridation to a thickness of 50 nm on the bottom of the capacitor insulating film formation region 108 serving as the first opening and on the bottom of the contact region 109 for the lower capacitor electrode serving as a second opening. After that, the second resist pattern 111 (photomask C2) is formed only in the region in which the silicon nitride film 110 is left, i.e., the capacitor insulating film formation region 108.

Figure 45D:
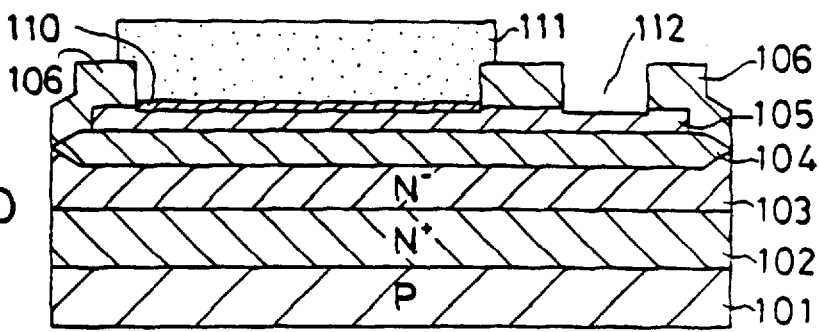

Next, as shown in FIG. 45D, the silicon nitride film 110 is subjected to dry etching using the second resist pattern 111 as a mask, so as to remove the silicon nitride film 110 on the bottom of the contact region 109 for lower capacitance electrode serving as the second opening, thereby forming the contact hole 112 for the lower capacitor electrode.

Figure 45E:
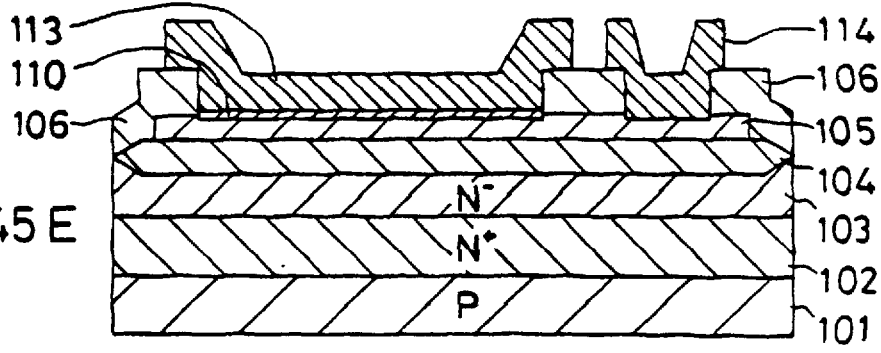

Next, as shown in FIG. 45E, the upper capacitor electrode 113 and lower capacitor electrode 114 are formed by the normal wiring process using aluminium, thus completing the capacitor. Alternatively, the bipolar transistor can be formed in the conventional manner, simultaneously with the formation of the capacitor.

As described above, the eighth embodiment is characterized in that the capacitor insulating film formation region 108 and contact region 109 for the lower capacitor electrode are simultaneously formed by the etching operation using the first resist pattern 107 and that the silicon nitride film 110 is removed in the contact region 109 for the lower capacitor electrode by the etching operation using the second resist pattern 111.

Thus, in the process of forming the capacitor, the eighth embodiment requires only two steps of forming resist patterns (using photomasks CW and C2), whereas the conventional manufacturing method has required three steps of forming resist patterns (using photomasks C1, C2, and CW) between the formation of the N⁺-type polysilicon film 105 serving as the lower capacitor electrode and the formation of the contact region 109 for the lower capacitor electrode. Consequently, compared to the prior art, the number of steps required for manufacturing a semiconductor apparatus can be reduced and manufacturing cost can also be reduced.

Moreover, since the silicon nitride film 110 remains only on the upper capacitor electrode 113, the overhang or vertical projection of the silicon nitride film 110 is not generated in the contact region 109 for the lower capacitor electrode due to the wet etching performed with respect to the SiO₂ film prior to the deposition of aluminium, so that the breakage of aluminium wires never occurs in the eighth embodiment.

(Ninth Embodiment)

Below, a method of manufacturing a semiconductor apparatus according to a ninth embodiment of the present invention will be described with reference to FIGS. 46A to 46C.

Similarly to the eighth embodiment, the CVD-SiO₂ film 106 is deposited to a thickness of 500 nm on the N⁺-type polysilicon film 105. Then, as shown in FIG. 46A, the first resist pattern 107 is formed on the CVD-Si₂ film 106. Subsequently, the CVD-SiO₂ film 106 is subjected to anisotropic dry etching using the first resist pattern as a mask 107 so as to selectively remove the CVD-SiO₂ film 106, thereby solely forming the capacitor insulating film formation region 108 serving as the first opening.

Figure 46:
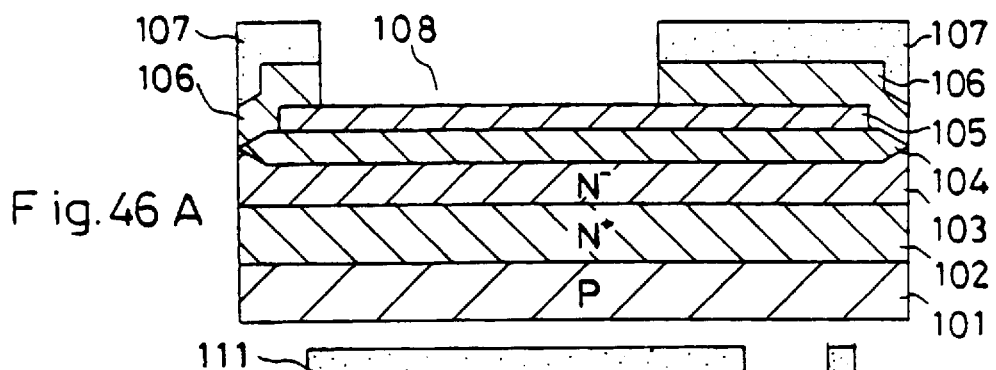
FIGS. 46A to 46C are cross sections illustrating the individual steps of the method of manufacturing a semiconductor apparatus according to a ninth embodiment of the present invention.
Figure 46:
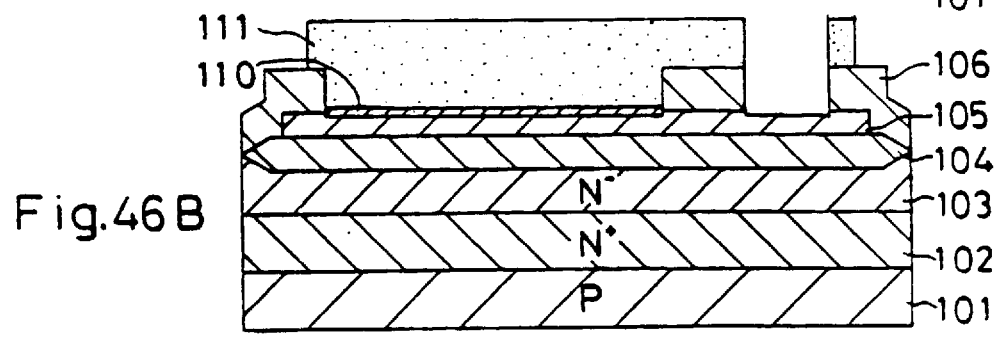
Figure 46:
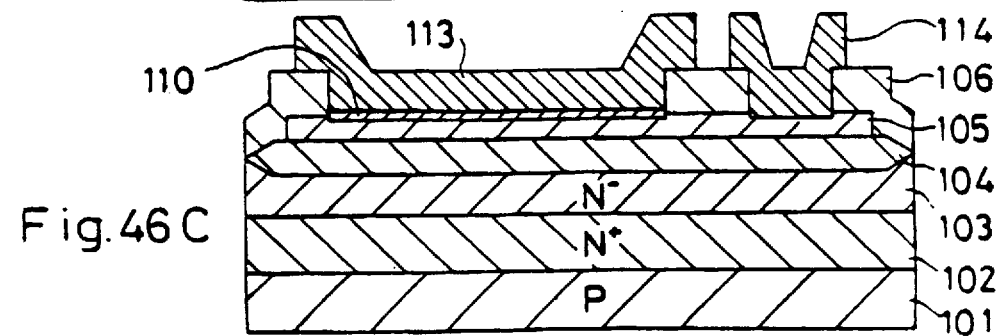

Next, as shown in FIG. 46B, the silicon nitride film 110 is formed by thermal nitridation to a thickness of 50 nm on the bottom of the capacitor insulating film formation region 108 serving as the first opening. On the CVD-SiO₂ film 106 and silicon nitride film 110 is then formed the second resist pattern 11 of which only the portion corresponding to the contract region 109 for the lower capacitor electrode is opened. Subsequently, the CVD-SiO₂ film 106 is subjected to dry etching using the second resist pattern 111 as a mask, thereby forming the contact hole 112 for the lower capacitor electrode.

Next, as shown in FIG. 46C, the upper capacitor electrode 113 and lower capacitor electrode 114 are formed by the normal wiring process using aluminium, thus completing the capacitor.

(Tenth Embodiment)

Below, a method of manufacturing a semiconductor apparatus according to a tenth embodiment of the present invention will be described with reference to FIGS. 47A to 47E.

Figure 47:
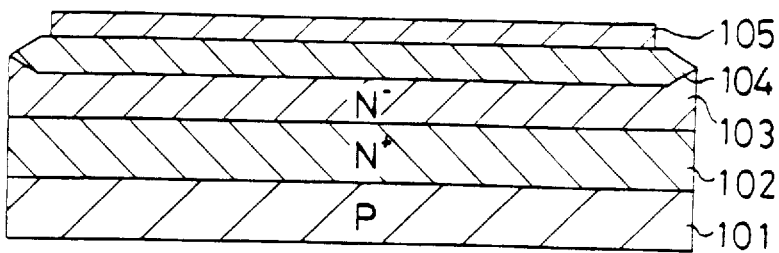
FIGS. 47A to 47E are cross sections illustrating the individual steps of the method of manufacturing a semiconductor apparatus according to a tenth embodiment of the present invention.
Figure 47:
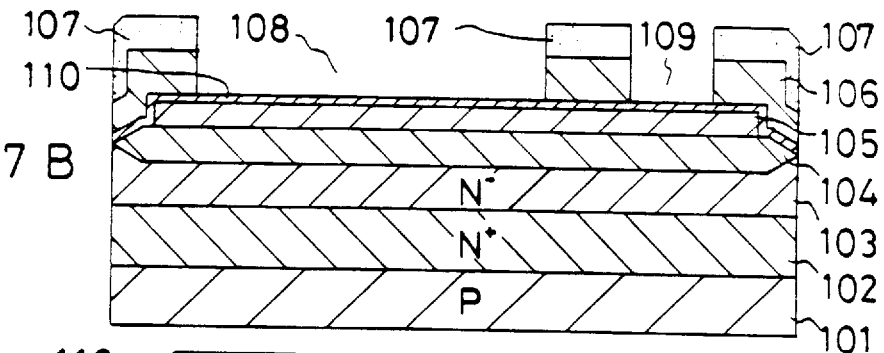
Figure 47:
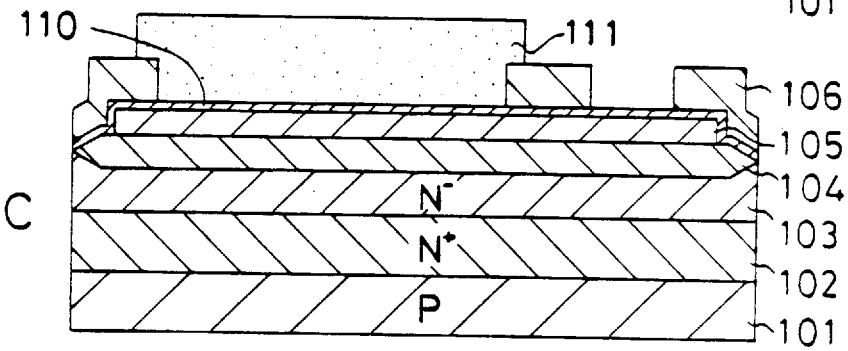
Figure 47:
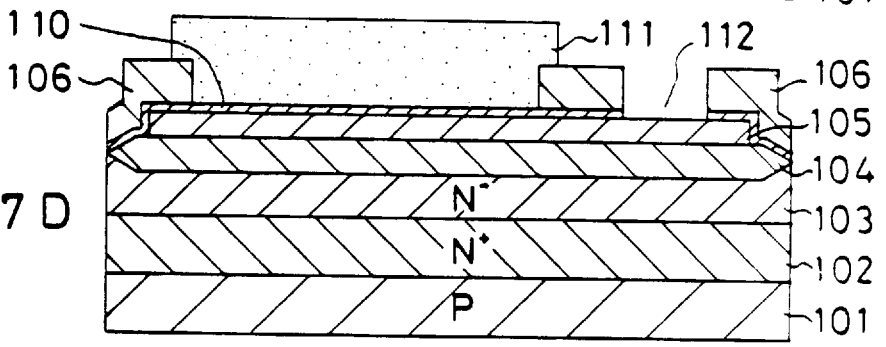
Figure 47:
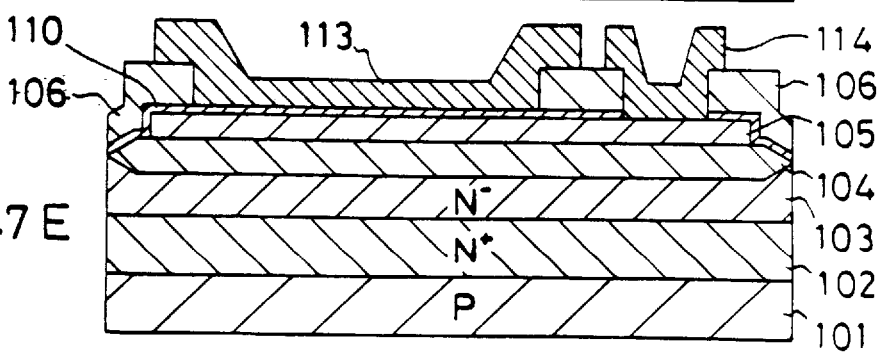

As shown in FIG. 47A, arsenic is introduced into the P-type semiconductor substrate 101 having a resistivity of, e.g., 10 to 20 Ω.cm by ion implantation under the conditions of 60 keV, 1×10¹⁵/cm². The semiconductor substrate 101 is then subjected to a heat treatment at a temperature of 900° C. for about 30 minutes, thereby forming an N⁺-type buried layer 102 and the N⁻-type epitaxial layer 103 having a resistivity of about 1 Ω.cm and a thickness of about 2.5 μm. Thereafter, a selective oxidation process is performed by using, e.g., a silicon nitride film (not shown), thereby forming a thermal oxide film 104 having a thickness of 600 nm. After that, a CVD-polysilicon film is deposited to a thickness of 400 nm on the thermal oxide film 104, so that the CVD-polysilicon film is patterned. Subsequently, arsenic is introduced into the CVD-polysilicon film by ion implantation under the conditions of 40 keV, 8×10¹⁵/cm², followed by a heat treatment at 900° C. for about 30 minutes, thereby forming the N⁺-type polysilicon film 105 serving as the lower electrode region of the capacitor.

Next, as shown in FIG. 47B, the silicon nitride film 110 serving as the first insulating film, i.e., the capacitor insulating film, is deposited to a thickness of 50 nm, and the CVD-SiO₂ film 106 serving as the second insulating film is deposited to a thickness of 500 nm on the silicon nitride film 110. Thereafter, the first resist pattern 107 (photomask CW) is formed on the CVD-SiO₂ film 106. Subsequently, the CVD-SiO₂ 106 is subjected to anisotropic dry etching using the first resist pattern 107 as a mask so as to selectively remove the CVD-SiO₂ film 106, thereby exposing the silicon nitride film 110 in the capacitor insulating film formation region 108 serving as the first opening and in the contact region 109 for the lower capacitor electrode serving as the second opening.

Next, as shown in FIG. 47C, the second resist pattern 111 (photomask C2) is formed in the region in which the silicon nitride film 110 is left.

Next, as shown in FIG. 47D, the silicon nitride film 110 is subjected to dry etching using the second resist pattern 111 as a mask so as to remove that portion of the silicon nitride film 110 which corresponds to the bottom of the contact region 109 for the lower capacitor electrode, thereby forming the contact hole 112 for the lower capacitor electrode.

Next, as shown in FIG. 47D, the upper capacitor electrode 113 and lower capacitor electrode 114 are formed by the normal wiring process using aluminium, thus completing the capacitor. Alternatively, the bipolar transistor can be formed in the conventional manner, simultaneously with the formation of the capacitor.

As described above, the tenth embodiment is characterized in that the capacitor insulating film formation region 108 and the contact region 109 for the lower capacitor electrode are subjected to the etching operation using the first resist pattern 107 so as to expose the silicon nitride film 110 and that the contact hole 112 for the lower capacitor electrode is opened by removing the silicon nitride film 110 corresponding to the bottom of the contact region 109 for the lower capacitor electrode through the etching operation using the second resist pattern 111.

Thus, in the process of forming the capacitor, the tenth embodiment requires only two steps of forming resist patterns (using photomasks CW and C2), whereas the conventional manufacturing method has required three steps of forming resist patterns (using photomasks C1, C2, and CW) between the formation of the N⁺-type polysilicon film 105 serving as the lower capacitor electrode and the formation of the contact region 109 for the lower capacitor electrode. Consequently, compared to the prior art, the number of steps required for manufacturing a semiconductor apparatus can be reduced and manufacturing cost can also be reduced.

Moreover, since the silicon nitride film 110 is not left in the region of the lower capacitor electrode 114, the overhang or vertical projection of the silicon nitride film 110 is not generated in the contact region 109 for the lower capacitor electrode in the wet-etching operation performed with respect to the SiO₂ film prior to the deposition of aluminium, so that the breakage of aluminium wires never occurs in the tenth embodiment.

(Eleventh Embodiment)

Figure 48A:
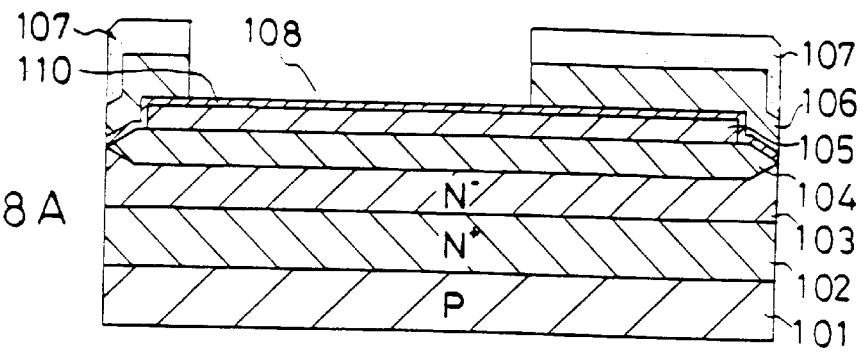
FIGS. 48A to 48C are cross sections illustrating the individual steps of the method of manufacturing a semiconductor apparatus according to an eleventh embodiment of the present invention.

Below, a method of manufacturing a semiconductor apparatus according to an eleventh embodiment of the present invention will be described with reference to FIGS. 48A to 48C.

Similarly to the tenth embodiment, the N⁺-type polysilicon film 105 is formed on the thermal oxide film 104. Then, as shown in FIG. 48A, the silicon nitride film 110 is deposited to a thickness of 50 nm over the entire surface of the N$^+$-type polysilicon film 105, so as to serve as the first insulating film, i.e., the capacitor insulating film. Thereafter, the CVD-SiO$_2$ film 106 is deposited to a thickness of 500 nm on the silicon nitride film 110, so as to serve as the second insulating film. On the CVD-SiO$_2$ film 106 is then formed the first resist pattern 107 of which only the portion corresponding to the capacitor insulating film formation region 108 is opened. Subsequently, the CVD-SiO$_2$ film 106 is subjected to etching using the first resist pattern 107 as a mask, thereby forming the capacitor insulating film formation region 108 as the first opening.

Figure 48B:
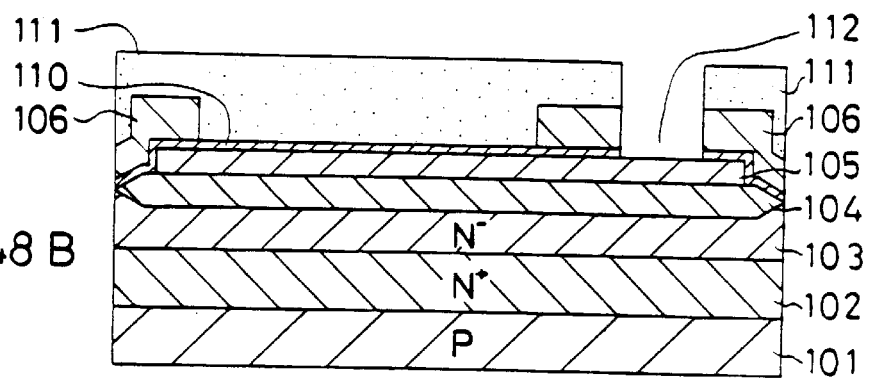

Next, as shown in FIG. 48B, the CVD-SiO$_2$ film 106 is subjected to etching using the second resist pattern 111 of which only the portion corresponding to the contact region 109 for the lower capacitance electrode is opened, thereby forming the contact hole 112 for the lower capacitor electrode as the second opening.

Figure 48C:
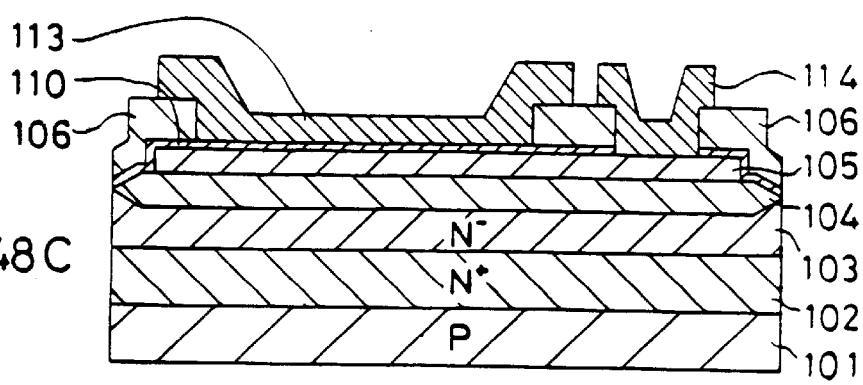
Figure 51A:
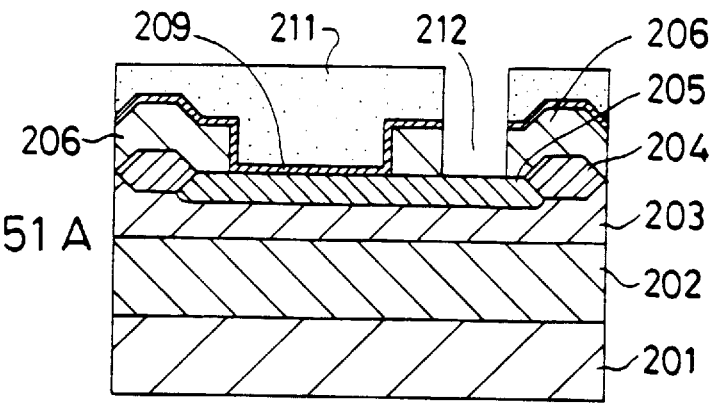
FIGS. 51A to 51C are cross sections illustrating the individual steps of the conventional method of manufacturing a semiconductor apparatus.
Figure 51B:
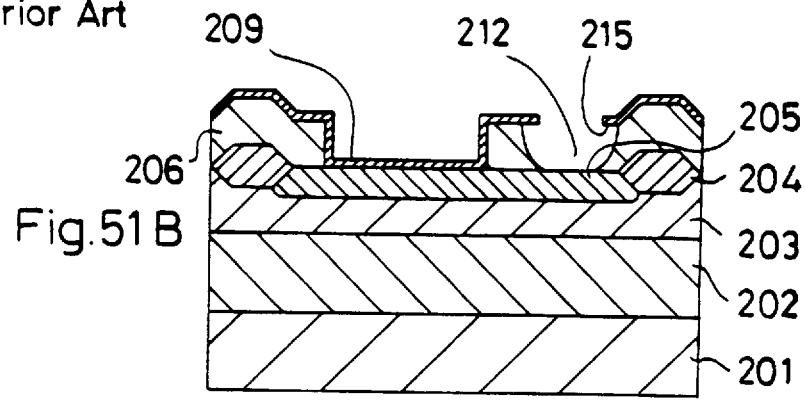
Figure 51C:
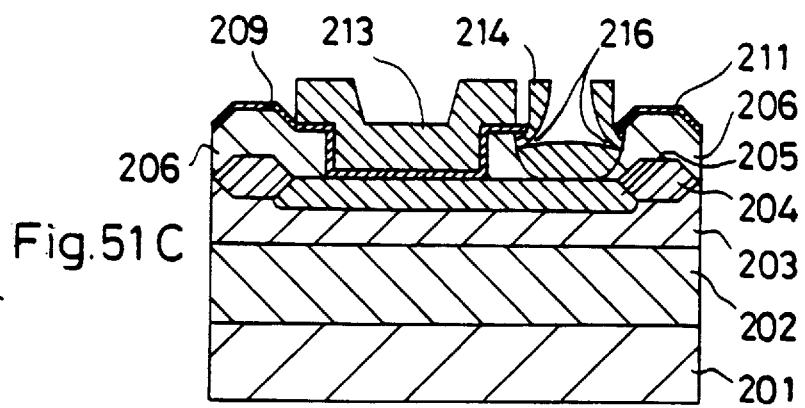

Next, as shown in FIG. 48C, the upper capacitor electrode 113 and lower capacitor electrode 114 are formed by the normal wiring process using aluminium, thus completing the capacitor. Alternatively, the bipolar transistor can be formed in the conventional manner, simultaneously with the formation of the capacitor.

(Twelfth Embodiment)

Below, a method of manufacturing a semiconductor apparatus according to a twelfth embodiment of the present invention will be described with reference to FIGS. 49A to 49E.

As shown in FIG. 49A, arsenic is introduced into the P-type semiconductor substrate 101 having a resistivity of, e.g., 10 to 20 Ω.cm by ion implantation under the conditions of 60 keV, 1×10$^{15}$/cm$^2$. The semiconductor substrate 101 is then subjected to a heat treatment at a temperature of 900° C. for about 30 minutes, thereby forming the N$^+$-type buried layer 102 and the N$^-$-type epitaxial layer 103 having a resistivity of about 1 Ω.cm and a thickness of about 2.5 μm. Thereafter, a selective oxidation process is performed by using, e.g., a silicon nitride film (not shown), thereby forming an thermal oxide film 104 having a thickness of 600 nm. After that, a CVD-polysilicon film is deposited to a thickness of 400 nm on the thermal oxide film 104, so that the CVD-polysilicon film is patterned. Subsequently, arsenic is introduced into the CVD-polysilicon film by ion implantation under the conditions of 40 keV, 8×10$^{15}$/cm$^2$, followed by a heat treatment at 900° C. for about 30 minutes, thereby forming an N$^+$-type polysilicon film 105 serving as the lower electrode region of the capacitor.

Next, as shown in FIG. 49B, the CVD-SiO$_2$ film 106 serving as the first insulating film is deposited to a thickness of 500 nm on the N$^+$-type polysilicon film 105, and then the first silicon nitride film 120 serving as the second insulating film is deposited to a thickness of 50 nm on the CVD-SiO$_2$ film 106. Subsequently, anisotropic dry etching is performed using the first resist pattern 107 (photomask CW) as a mask so as to remove the first silicon nitride film 120 and CVD-SiO$_2$ film 106, thereby forming the capacitor insulating film formation region 108 as the first opening and the contact region 109 for the lower capacitor electrode as the second opening.

Next, as shown in FIG. 49C, the second silicon nitride film 110 is deposited to a thickness of 50 nm, so as to serve as a third insulating film, i.e., the capacitor insulating film. Thereafter, the second resist pattern 111 (photomask C2) is formed in the region in which the second silicon nitride film 110 is left, i.e., the capacitor insulating film formation region 108.

Next, as shown in FIG. 49D, the second silicon nitride film 110 is subjected to anisotropic dry etching using the second resist pattern 111 as a mask, thereby forming the contact hole 112 for the lower capacitor electrode as the second opening. In this case, since the first silicon nitride film 120 and second silicon nitride film 110 are deposited on the CVD-SiO$_2$ film 106, the total thickness of the silicon nitride films deposited thereon amounts to 100 nm. Consequently, even when the contact hole 112 is formed by anisotropic etching, the first silicon nitride film 120 still remains on the CVD-SiO$_2$ film 106. On the other hand, the first silicon nitride film 120 also remains beneath the second resist pattern 111 and on the side walls of the contact region 109 for the lower capacitor electrode.

Next, as shown in FIG. 49E, the upper capacitor electrode 113 and lower capacitor electrode 114 are formed by the normal wiring process using aluminium, thus completing the capacitor. Alternatively, the bipolar transistor can be formed in the conventional manner, simultaneously with the formation of the capacitor.

As described above, the twelfth embodiment is characterized in that, after the second silicon nitride film 110, serving as the capacitor insulating film, is deposited on the CVD-SiO$_2$ 106, the capacitor insulating film formation region 108 and the contact region 109 for the lower capacitor electrode are simultaneously formed by the etching operation using the first resist pattern 107 and that the second silicon nitride film 110 is left on the side walls of the contact region for the lower capacitor electrode and on the CVD-SiO$_2$ film 106 by the etching operation using the second resist pattern 111.

Thus, in the process of forming the capacitor, the twelfth embodiment requires only two steps of forming resist patterns (using photomasks CW and C2), whereas the conventional manufacturing method has required three steps of forming resist patterns (using photomasks C1, C2, and CW) between the formation of the N$^+$-type polysilicon film 105 serving as the lower capacitor electrode and the formation of the contact region 109 for the lower capacitor electrode. Consequently, compared to the prior art, the number of steps required for manufacturing a semiconductor apparatus can be reduced and manufacturing cost can also be reduced.

Moreover, in the twelfth embodiment, the first and second silicon nitride films 120 and 110 are left in the region other than the contact region 109 for the lower capacitor electrode, so that a difference in level due to the overhang of the silicon nitride film or like phenomenon is never generated between the CVD-SiO$_2$ film 106 and the second silicon nitride film 110 remaining on the side walls of the contact region 109 for the lower capacitor electrode. Therefore, aluminium wiring free from breakage or short circuit can be formed.

We claim:

1. A method of manufacturing a semiconductor apparatus, comprising:

a first step of forming a lower capacitor electrode on a semiconductor substrate;

a second step of forming, on said lower capacitor electrode, a first insulating film serving as a capacitor insulating film;

a third step of forming a second insulating film on said first insulating film;

a fourth step of forming, in the region in which the capacitor insulating film is to be formed, a first opening in which said second insulating film is removed and said first insulating film is left, while forming, in the region in which a contact for the lower capacitor electrode is to be formed, a second opening in which said first and second insulating films are removed; and a fifth step of forming an upper capacitor electrode in said first opening, while forming a contact electrode for said lower capacitor electrode in said second opening.

2. A method of manufacturing a semiconductor apparatus according to claim 1, wherein said fourth step includes the steps of:

forming the first opening by selectively etching said second insulating film so as to remove that region of said second insulating film in which the capacitor insulating film is to be formed, while forming the second opening by removing that region of said second insulating film in which said contact for the lower capacitor electrode is to be formed; and selectively etching said first insulating film so as to remove that portion of said first insulating film which corresponds to the bottom of said second opening.

3. A method of manufacturing a semiconductor apparatus according to claim 1, wherein said fourth step includes the steps of:

selectively etching said second insulating film so as to form, in the region in which the capacitor insulating film is to be formed, the first opening in which said second insulating film is removed and said first insulating film is left; and selectively etching said first and second insulating films so as to form, in the region in which the contact for the lower capacitor electrode is to be formed, the second opening in which said first and second insulating films are removed.

4. A method of manufacturing a semiconductor apparatus, comprising:

a first step of forming a lower capacitor electrode on a semiconductor substrate;

a second step of forming first and second insulating films on said lower capacitor, said first and second insulating films being composed of different materials;

a third step of forming a first opening by selectively etching said first and second insulating films by a one-time process so as to remove those regions of said first and second insulating films in which a capacitor insulating film is to be formed, while forming a second opening by removing those regions of said first and second insulating films in which a contact for said lower capacitor electrode is to be formed;

a fourth step of forming, on said first and second openings and on said second insulating film, a third insulating film serving as the capacitor insulating film, said third insulating film being composed of the same material as said second insulating film;

a fifth step of selectively etching said third insulating film so as to remove at least that portion of said third insulating film which is formed on the bottom of said second opening, whereby other portions of said third insulating film which are formed on said first opening and on the side faces of said second opening are left unetched, and said second insulating film formed on said first insulating film is left unetched; and a sixth step of forming an upper electrode in said first opening, while forming a contact electrode for said lower capacitor electrode in said second opening.

5. A method of manufacturing a semiconductor apparatus, comprising:

a first step of forming a lower capacitor electrode on a semiconductor substrate;

a second step of forming a first insulating film on said lower capacitor electrode;

a third step of forming first and second openings by selectively etching said first insulating film so as to remove those two regions of said first insulating film in which a capacitor insulating film is to be formed and in which a contact for said lower capacitor electrode is to be formed;

a fourth step of forming a second insulating film, serving as a capacitor insulating film, exclusively on the bottoms of said first and second openings and then removing that region of said second insulating film which is formed on the bottom of said second opening; and a fifth step of forming an upper capacitor electrode in said first opening, while forming a contact electrode for said lower capacitor electrode in said second opening.

6. A method of manufacturing a semiconductor apparatus according to claim 5, wherein said fourth step of forming a second insulating film includes a step of selectively forming a silicon nitride film by thermal nitriding.

7. A method of manufacturing a semiconductor apparatus, comprising:

a first step of forming a lower capacitor electrode on a semiconductor substrate;

a second step of forming a first insulating film on said lower capacitor electrode;

a third step of forming a first opening by selectively etching said first insulating film so as to remove that region of said first insulating film in which a capacitor insulating film is to be formed and then forming a second insulating film, serving as a capacitor insulating film, exclusively on said first opening, while forming a second opening by selectively etching said first insulating film so as to remove that region of said first insulating film which a contact for said lower capacitor electrode is to be formed; and a fourth step of forming an upper capacitor electrode in said first opening, while forming a contact electrode for said lower capacitor electrode in said second opening.

8. A method of manufacturing a semiconductor apparatus according to claim 7, wherein, in said third step, said process of forming a second insulating film in said first opening includes a step of selectively forming a silicon nitride film by thermal nitriding.

* * * * *